US012772451B2

(12) United States Patent
Hosoda et al.

(10) Patent No.: US 12,772,451 B2
(45) Date of Patent: Oct. 20, 2026

(54) STAIRLESS THREE-DIMENSIONAL MEMORY DEVICE AND METHOD OF MAKING THEREOF BY FORMING REPLACEMENT WORD LINES THROUGH MEMORY OPENINGS

(71) Applicant: SANDISK TECHNOLOGIES LLC, Addison, TX (US)

(72) Inventors: Naohiro Hosoda, Yokkaichi (JP); Kazuki Isozumi, Yokkaichi (JP); Takayuki Maekura, Yokkaichi (JP); Hiroyuki Ogawa, Nagoya (JP); Koichi Matsuno, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 458 days.

(21) Appl. No.: 18/352,752

(22) Filed: Jul. 14, 2023

(65) Prior Publication Data

US 2024/0179906 A1 May 30, 2024

Related U.S. Application Data

(60) Provisional application No. 63/385,338, filed on Nov. 29, 2022.

(51) Int. Cl.
*H10B 43/27* (2023.01)

(52) U.S. Cl.
CPC .................................... *H10B 43/27* (2023.02)

(58) Field of Classification Search
CPC ........ H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44;
(Continued)

(56) References Cited

U.S. PATENT DOCUMENTS 8,786,007 B2 7/2014 Chae et al.
9,601,502 B2 3/2017 Sano et al.
(Continued)

OTHER PUBLICATIONS

IPRP-WO—Notification Concerning Transmittal of International Preliminary Report On Patentability and Written Opinion of the International Searching Authority for International Patent Application No. PCT/US2023/035979, Mailed Jun. 12, 2025, 7 pages.
(Continued)

*Primary Examiner* — William B Partridge
*Assistant Examiner* — Gustavo G Ramallo
(74) *Attorney, Agent, or Firm* — THE MARBURY LAW GROUP PLLC

(57) ABSTRACT

A semiconductor structure includes an alternating stack of insulating layers and electrically conductive layers, memory openings vertically extending through the alternating stack, and memory opening fill structures located in the memory openings and including a respective vertical semiconductor channel and a respective vertical stack of memory cells. An integrated line-and-via structure is provided, which is a unitary structure including a metallic plate portion that is a portion of or laterally contacts an electrically conductive layer, and a metallic via portion that vertically extends through dielectric material plates that overlie the metallic plate portion.

5 Claims, 40 Drawing Sheets

(58) Field of Classification Search
CPC ...... H10B 41/465; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | | |
|---|---|---|---|---|
| 9,721,663 | B1 | 8/2017 | Ogawa et al. | |
| 9,806,093 | B2 | 10/2017 | Toyama et al. | |
| 9,818,693 | B2 | 11/2017 | Toyama et al. | |
| 9,818,759 | B2 | 11/2017 | Kai et al. | |
| 9,960,181 | B1 | 5/2018 | Cui et al. | |
| 9,985,046 | B2 | 5/2018 | Lu et al. | |
| 10,038,006 | B2 | 7/2018 | Furihata et al. | |
| 10,381,371 | B2 | 8/2019 | Ogawa et al. | |
| 10,840,260 | B2 | 11/2020 | Kai et al. | |
| 10,872,857 | B1 | 12/2020 | Otsu et al. | |
| 10,879,264 | B1 | 12/2020 | Otsu et al. | |
| 10,903,237 | B1 | 1/2021 | Hosoda et al. | |
| 11,282,783 | B2 | 3/2022 | Otsu et al. | |
| 11,322,440 | B2 | 5/2022 | Kubo | |
| 11,342,245 | B2 | 5/2022 | Cui et al. | |
| 11,355,506 | B2 | 6/2022 | Tokita et al. | |
| 11,450,679 | B2 | 9/2022 | Tanaka et al. | |
| 11,488,975 | B2 | 11/2022 | Totoki et al. | |
| 11,495,612 | B2 | 11/2022 | Tanaka et al. | |
| 2016/0322374 | A1 | 11/2016 | Sano et al. | |
| 2017/0179026 | A1 | 6/2017 | Toyama et al. | |
| 2017/0179151 | A1 | 6/2017 | Kai et al. | |
| 2017/0179152 | A1 | 6/2017 | Toyama et al. | |
| 2017/0179153 | A1 | 6/2017 | Ogawa et al. | |
| 2017/0179154 | A1* | 6/2017 | Furihata | H10B 43/27 |
| 2017/0358593 | A1 | 12/2017 | Yu et al. | |
| 2017/0358594 | A1 | 12/2017 | Lu et al. | |
| 2018/0097009 | A1* | 4/2018 | Zhang | H10B 43/50 |
| 2019/0096841 | A1 | 3/2019 | Liu et al. | |
| 2020/0235120 | A1* | 7/2020 | Kai | H10B 43/27 |
| 2020/0357814 | A1 | 11/2020 | Kim et al. | |
| 2020/0395407 | A1 | 12/2020 | Takahashi et al. | |
| 2020/0402992 | A1 | 12/2020 | Otsu et al. | |
| 2021/0210424 | A1 | 7/2021 | Otsu et al. | |
| 2021/0210428 | A1 | 7/2021 | Ohsawa et al. | |
| 2021/0210503 | A1 | 7/2021 | Matsuno et al. | |
| 2021/0210504 | A1 | 7/2021 | Otsu et al. | |
| 2021/0265389 | A1 | 8/2021 | Kim et al. | |
| 2021/0366808 | A1 | 11/2021 | Cui et al. | |
| 2021/0366920 | A1 | 11/2021 | Tokita et al. | |
| 2021/0366924 | A1 | 11/2021 | Tokita et al. | |
| 2021/0375938 | A1 | 12/2021 | Lin et al. | |
| 2021/0384124 | A1* | 12/2021 | Wang | H10P 50/283 |
| 2021/0384206 | A1 | 12/2021 | Iwai et al. | |
| 2021/0384207 | A1 | 12/2021 | Iwai et al. | |
| 2021/0391345 | A1 | 12/2021 | Otsu et al. | |
| 2021/0408035 | A1 | 12/2021 | Sato et al. | |
| 2022/0005830 | A1 | 1/2022 | Wu et al. | |
| 2022/0059462 | A1 | 2/2022 | Said et al. | |
| 2022/0102375 | A1 | 3/2022 | Kubo | |
| 2022/0157724 | A1 | 5/2022 | Takii et al. | |
| 2022/0254733 | A1 | 8/2022 | Mizuno et al. | |
| 2022/0262805 | A1 | 8/2022 | Tomita et al. | |
| 2022/0406379 | A1 | 12/2022 | Takeguchi et al. | |
| 2022/0406720 | A1 | 12/2022 | Hinoue et al. | |
| 2022/0406793 | A1 | 12/2022 | Takeguchi et al. | |
| 2023/0038557 | A1 | 2/2023 | Ogawa et al. | |
| 2023/0041950 | A1 | 2/2023 | Chibvongodze et al. | |
| 2023/0045001 | A1 | 2/2023 | Ogawa et al. | |
| 2023/0128326 | A1 | 4/2023 | Amano et al. | |
| 2023/0129594 | A1 | 4/2023 | Sharangpani et al. | |
| 2023/0225122 | A1 | 7/2023 | Komiya | |
| 2023/0363162 | A1 | 11/2023 | Rabkin et al. | |
| 2023/0363165 | A1 | 11/2023 | Iwai et al. | |
| 2024/0107760 | A1 | 3/2024 | Wang et al. | |
| 2024/0107761 | A1 | 3/2024 | Wang et al. | |
| 2024/0128764 | A1 | 4/2024 | Mitsugi | |
| 2024/0179904 | A1 | 5/2024 | Kubo et al. | |
| 2024/0179905 | A1* | 5/2024 | Maekura | H10B 41/35 |
| 2024/0179906 | A1 | 5/2024 | Hosoda et al. | |
| 2024/0179916 | A1 | 5/2024 | Matsuno et al. | |
| 2024/0215243 | A1 | 6/2024 | Tsutsumi | |

OTHER PUBLICATIONS

USPTO Office Communication, Non-Final Office Action for U.S. Appl. No. 18/354,246, mailed Oct. 27, 2025, 30 pages.
Endoh et al., "Novel Ultra High-Density Memory with a Stacked-Surrounding Gate Transistor (S-SGT) Structured Cell," IEDM Proc (2001) 33-36.
U.S. Appl. No. 17/355,883, filed Jun. 23, 2021, SanDisk Technologies LLC.
U.S. Appl. No. 17/376,490, filed Jul. 15, 2021, SanDisk Technologies LLC.
U.S. Appl. No. 17/516,588, filed Nov. 1, 2021, SanDisk Technologies LLC.
U.S. Appl. No. 17/556,298, filed Dec. 20, 2021, SanDisk Technologies LLC.
U.S. Appl. No. 17/663,951, filed May 18, 2022, SanDisk Technologies LLC.
U.S. Appl. No. 17/684,922, filed Mar. 2, 2022, SanDisk Technologies LLC.
U.S. Appl. No. 17/804,184, filed May 26, 2022, SanDisk Technologies LLC.
U.S. Appl. No. 17/806,390, filed Jun. 10, 2022, SanDisk Technologies LLC.
U.S. Appl. No. 17/806,579, filed Jun. 13, 2022, SanDisk Technologies LLC.
U.S. Appl. No. 17/807,266, filed Jun. 16, 2022, SanDisk Technologies LLC.
U.S. Appl. No. 17/807,804, filed Jun. 20, 2022, SanDisk Technologies LLC.
U.S. Appl. No. 63/386,815, filed Dec. 9, 2022, SanDisk Technologies LLC.
U.S. Appl. No. 63/386,824, filed Dec. 9, 2022, SanDisk Technologies LLC.
U.S. Appl. No. 63/480,640, filed Jan. 19, 2023, SanDisk Technologies LLC.
U.S. Appl. No. 63/482,105, filed Jan. 30, 2023, SanDisk Technologies LLC.
U.S. Appl. No. 63/484,619, filed Feb. 13, 2023, SanDisk Technologies LLC.
U.S. Appl. No. 63/487,084, filed Feb. 27, 2023, SanDisk Technologies LLC.
U.S. Appl. No. 63/501,182, filed May 10, 2023, Western Digital Technologies, Inc.
Kubo, T. et al., "Stairless Three-Dimensional Memory Device Containing Meandering Dielectric Isolation Structure and Methods Of Forming The Same," U.S. Appl. No. 18/240,560, filed Aug. 31, 2023.
Kubo, T. et al., "Stairless Three-Dimensional Memory Device and Method Of Making Thereof by Forming Replacement Word Lines Through Memory Openings," U.S. Appl. No. 18/349,578, filed Jul. 10, 2023.
Maekura, T. et al., "Stairless Three-Dimensional Memory Device and Method Of Making Thereof by Forming Replacement word Lines Through Memory Openings," U.S. Appl. No. 18/352,726, filed Jul. 14, 2023.
Tobioka, A. et al., "Stairless Three-Dimensional Memory Device and Method Of Forming The Same by Forming Replacement Word Lines," U.S. Appl. No. 18/354,246, filed Jul. 18, 2023.
Tobioka, A. et al., "Stairless Three-Dimensional Memory Device and Method Of Forming The Same by Forming Replacement Word Lines," U.S. Appl. No. 18/354,269, filed Jul. 18, 2023.
ISR—Notification of Transmittal of The International Search Report and Written Opinion of the International Searching Authority for International Patent Application No. PCT/US2023/035979, mailed Jan. 30, 2024, 11 pages.

(56) References Cited

OTHER PUBLICATIONS

USPTO Office Communication, Notice of Allowance and Fee(s) Due for U.S. Appl. No. 18/349,578, mailed Mar. 13, 2026, 32 pages.
USPTO Office Communication, Non-Final Office Action for U.S. Appl. No. 18/349,578, mailed Jun. 17, 2026, 21 pages.
USPTO Office Communication, Non-Final Office Action for U.S. Appl. No. 18/352,726, mailed Apr. 23, 2026, 48 pages.

* cited by examiner

STAIRLESS THREE-DIMENSIONAL MEMORY DEVICE AND METHOD OF MAKING THEREOF BY FORMING REPLACEMENT WORD LINES THROUGH MEMORY OPENINGS

FIELD

The present disclosure relates generally to the field of semiconductor devices, and particularly to stairless three-dimensional memory devices and methods for forming the same.

BACKGROUND

A three-dimensional memory device including a three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36. Support circuitry for performing write, read, and erase operations of the memory cells in the vertical NAND strings typically are provided by complementary metal oxide semiconductor (CMOS) devices formed on a same substrate as the three-dimensional memory device.

SUMMARY

According to an aspect of the present disclosure, a semiconductor structure is provided, which comprises: an alternating stack of insulating layers and composite layers, wherein each of the composite layers comprise a respective set of electrically conductive layers that are laterally spaced apart by a respective set of dielectric material portions; memory openings vertically extending through portions of the alternating stack and laterally spaced from each of the dielectric material portions; memory opening fill structures located in the memory openings, wherein vertically-extending interfaces between the electrically conductive layers and the dielectric material portions are laterally offset from a sidewall of a most proximal one of the memory opening fill structures, and wherein each of the memory opening fill structures comprises a respective vertical semiconductor channel and a respective vertical stack of memory cells; and an integrated line-and-via structure comprising a metallic plate portion that laterally contacts a first electrically conductive layer of the electrically conductive layers and further comprising a metallic via portion that vertically extends through a subset of the dielectric material portions that overlies the metallic plate portion.

According to another aspect of the present disclosure, a semiconductor structure is provided, which comprises: an alternating stack of insulating layers and electrically conductive layers; memory openings vertically extending through the alternating stack; memory opening fill structures located in the memory openings and comprising a respective vertical semiconductor channel and a respective vertical stack of memory cells; a pair of backside trench fill structures laterally contacting the alternating stack and laterally spaced apart from each other by the alternating stack; a pair of dielectric barrier structures vertically extending through the alternating stack; a vertical stack of dielectric material plates located at levels of a subset of the electrically conductive layers and contacting each of the pair of dielectric barrier structures; and an integrated line-and-via structure that is a unitary structure comprising a first electrically conductive layer of the electrically conductive layers and further comprising a metallic via portion that vertically extends through each of the dielectric material plates that overlie the first electrically conductive layer.

According to yet another aspect of the present disclosure, a method of forming a semiconductor structure is provided, which comprises: forming an alternating stack of insulating layers and sacrificial material layers comprising a dielectric material; forming memory openings through the alternating stack; replacing proximal portions of the sacrificial material layers around each of the memory openings with electrically conductive layers, wherein each of the electrically conductive layers comprises a respective set of electrically conductive material portions and contacts a remaining portion of a respective sacrificial material layer that constitutes a dielectric material portion; forming a via opening vertically extending through a subset of the dielectric material portions; forming a laterally-extending cavity underneath the via opening such that a sidewall of a first electrically conductive layer of the electrically conductive layers is physically exposed; and forming an integrated line-and-via structure in a continuous volume including the laterally-extending cavity and a volume within the via opening, wherein the integrated line-and-via structure comprises a metallic plate portion that laterally contacts the first electrically conductive layer and further comprising a metallic via portion that is formed in the via opening.

According to another aspect of the present disclosure, a method of forming a semiconductor structure is provided, which comprises: forming an alternating stack of insulating layers and sacrificial material layers comprising a dielectric material; forming memory opening fill structures through the alternating stack; forming a via opening through an upper portion of the alternating stack; forming a laterally-extending cavity underneath the via opening by isotropically recessing a first sacrificial material layer of the sacrificial material layers; forming backside trenches through the alternating stack prior to or after formation of the laterally-extending cavity; isotropically recessing the sacrificial material layers from around the backside trenches, to form backside recesses in volumes from which portions of the sacrificial material layers are removed, wherein one of the backside recesses is connected to the laterally-extending cavity to form a continuous void; and depositing an electrically conductive material in the backside recesses and the via opening, wherein portions of the electrically conductive material deposited in the backside recesses and the laterally-extending cavity constitute electrically conductive layers, and a portion of the electrically conductive material filling the via opening constitutes a metallic via portion.

According to still another aspect of the present disclosure, a semiconductor structure is provided, which comprises: an alternating stack of insulating layers and electrically conductive layers; memory openings vertically extending through the alternating stack; memory opening fill structures located in the memory openings and comprising a respective vertical semiconductor channel and a respective vertical stack of memory cells; a vertical stack of dielectric material plates located at levels of a subset of the electrically conductive layers; and an integrated line-and-via structure that is a unitary structure comprising a first electrically conductive layer and a second electrically conductive layer of the electrically conductive layers, a metallic plate portion vertically connecting the first electrically conductive layer and the second electrically conductive layer, and a metallic via portion that vertically extends through each of the dielectric material plates that overlie the first electrically conductive layer.

According to even another aspect of the present disclosure, a method of forming a semiconductor structure is provided, which comprises: forming an alternating stack of insulating layers and sacrificial material layers comprising a dielectric material; forming memory stack structures through the alternating stack; forming a via opening through an upper portion of the alternating stack such that a top surface of a first sacrificial material layer of the sacrificial material layers is physically exposed; vertically extending the via opening through the first sacrificial material layer such that a top surface of a first insulating layer of the insulating layers is physically exposed; forming an insulating-layer-level laterally-extending cavity by isotropically recessing the first insulating layer, to expose top surface of a second sacrificial material layer of the sacrificial material layers; forming a multi-level laterally-extending cavity by isotropically etching the first sacrificial material layer and the second sacrificial material layer; forming backside trenches through the alternating stack prior to or after formation of the multi-level laterally-extending cavity; isotropically recessing the sacrificial material layers from around the backside trenches to form backside recesses in volumes from which portions of the sacrificial material layers are removed, wherein two of the backside recesses are connected to the multi-level laterally-extending cavity to form a continuous void; and depositing an electrically conductive material in the backside recesses, the multi-level laterally-extending cavity, and the via opening, wherein portions of the electrically conductive material deposited in the backside recesses and the laterally-extending cavity constitute electrically conductive layers, and a portion of the electrically conductive material filling the via opening constitutes a metallic via portion.

DETAILED DESCRIPTION

Figure 1:
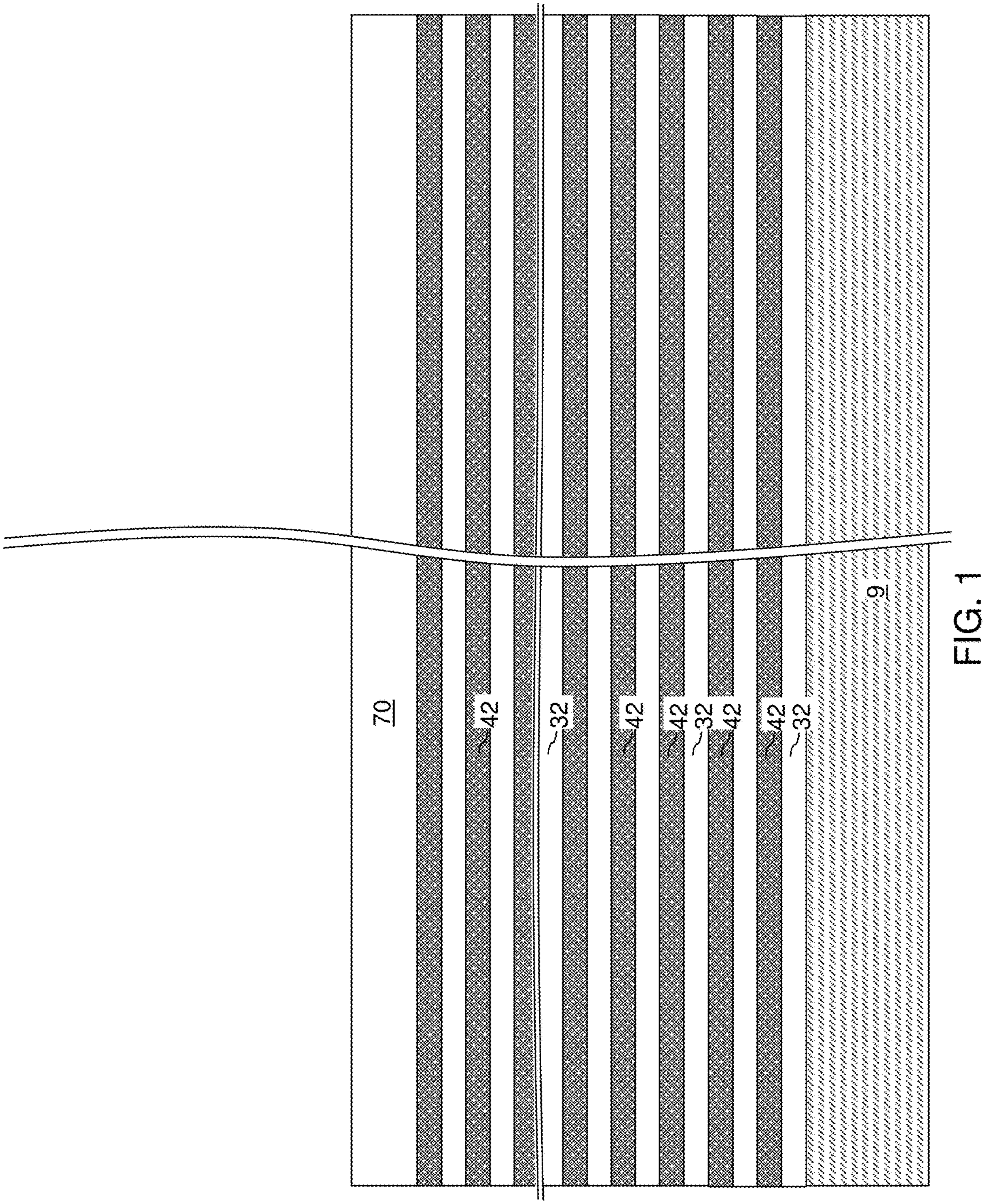
FIG. 1 is a schematic vertical cross-sectional view of a first exemplary structure after formation of an alternating stack of insulating layers and sacrificial material layers over a substrate according to a first embodiment of the present disclosure.

As discussed above, the embodiments of the present disclosure are directed to stairless three-dimensional memory devices and methods for forming the same by forming replacement word lines through memory openings, the various aspects of which are described below. The embodiments of the present disclosure can be used to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein. As used herein, a first electrical component is electrically connected to a second electrical component if there exists an electrically conductive path between the first electrical component and the second electrical component.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. In case a die is a memory die, i.e., a die including memory cells, concurrent read operations, concurrent write operations, or concurrent erase operations can be performed in each plane within a same memory die. Each plane contains a number of memory blocks (or "blocks"), which are the smallest unit that can be erased by in a single erase operation. Each memory block contains a number of pages, which are the smallest units that can be selected for programming.

Referring to FIG. 1, a first exemplary structure according to the first embodiment of the present disclosure is illustrated, which can be used, for example, to fabricate a device structure containing vertical NAND memory devices. The first exemplary structure includes a substrate including a semiconductor material layer at least at an upper portion thereof. The semiconductor material layer 9 includes at least one elemental semiconductor material (e.g., a doped well in a single crystal silicon wafer or a deposited silicon layer), at least one III-V compound semiconductor material, at least one II-VI compound semiconductor material, at least one organic semiconductor material, or other semiconductor materials known in the art. In one embodiment, the semiconductor material layer may comprise a semiconductor material having a doping of a first conductivity type.

A stack of an alternating plurality of insulating layers 32 and sacrificial material layers 42 can be formed over the semiconductor material layer 9. The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise a dielectric material. In one embodiment, the sacrificial material layers 42 may comprise, and/or may consist essentially of, silicon nitride. The insulating layers 32 can be deposited, for example, by chemical vapor deposition (CVD). For example, if silicon oxide is used for the insulating layers 32, tetraethyl orthosilicate (TEOS) can be used as the precursor material for the CVD process. The sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 2B:
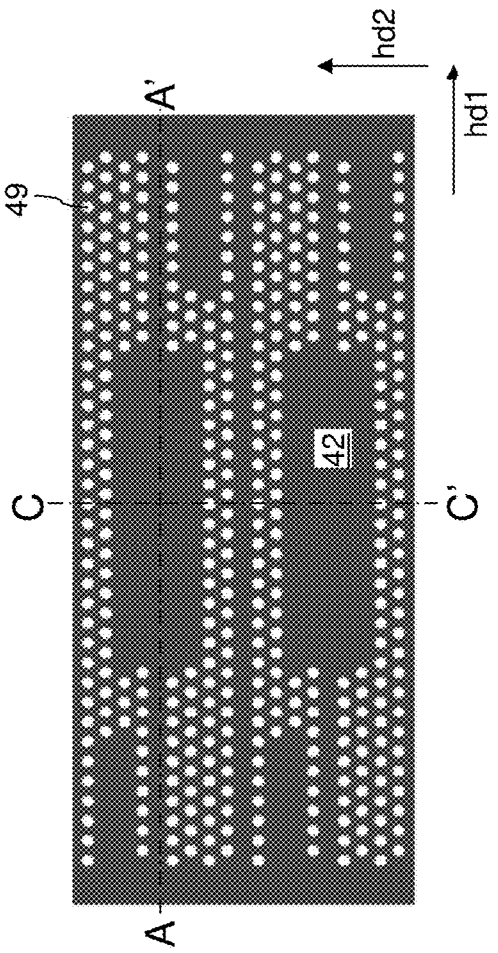
FIG. 2B is a horizontal cross-sectional view of the first exemplary structure along the vertical plane B-B' of FIG. 2A. The vertical plane A-A' is the plane of the vertical cross-section of FIG. 2A.
Figure 2A:
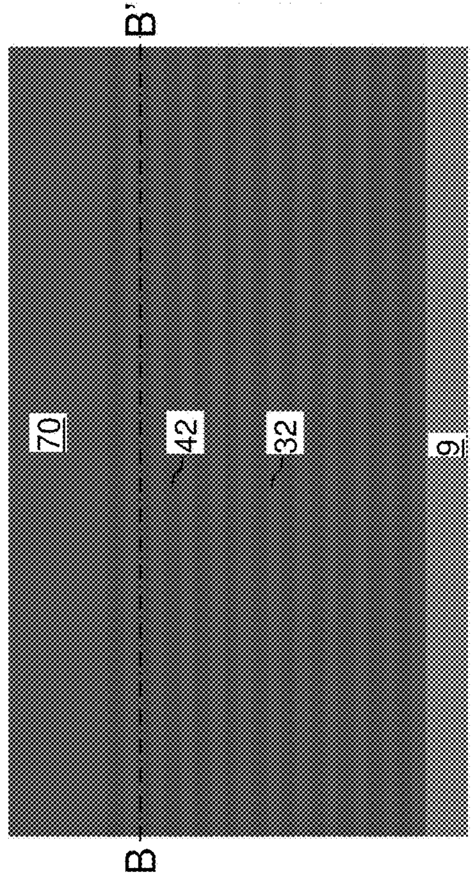
FIG. 2A is a vertical cross-sectional view of the first exemplary structure after formation of memory openings according to the first embodiment of the present disclosure.
Figure 2C:
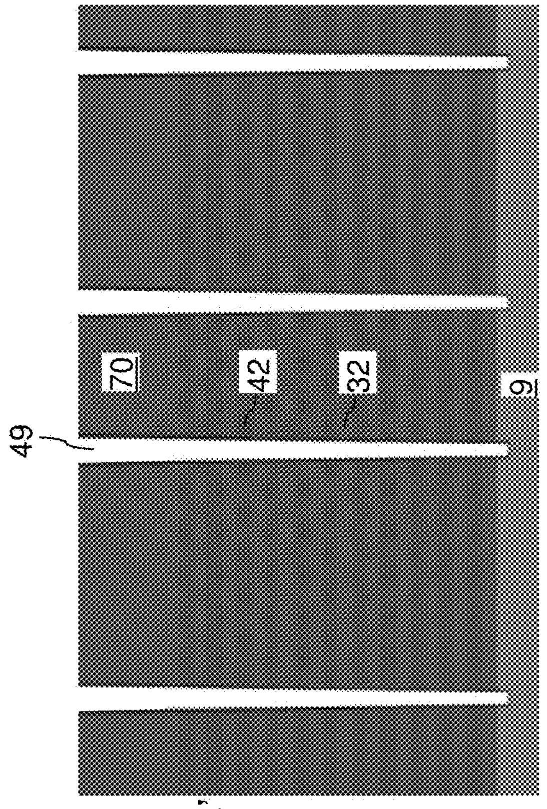
FIG. 2C is a vertical cross-sectional view of the first exemplary structure along the vertical plane C-C' of FIG. 2B.

Referring to FIGS. 2A-2C, a lithographic material stack (not shown) including at least a photoresist layer can be formed over the insulating cap layer 70, and can be lithographically patterned to form openings therein. The pattern in the lithographic material stack can be transferred through the insulating cap layer 70 and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49. As used herein, a "memory opening" refers to a structure in which memory cells, such as a memory stack structure, is subsequently formed. In one embodiment, the memory openings 49 may have a horizontal cross-sectional shape of a circle. The diameter of the circle may be greater than the thickness of the sacrificial material layers 42.

The memory openings 49 extend through the entirety of the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing.

The memory openings 49 can extend from the top surface of the alternating stack (32, 42) to at least the horizontal plane including the topmost surface of the semiconductor material layer 9. In one embodiment, an overetch into the semiconductor material layer 9 may be optionally performed after the top surface of the semiconductor material layer 9 is physically exposed at a bottom of each memory opening 49. The overetch may be performed prior to, or after, removal of the lithographic material stack. In other words, the recessed surfaces of the semiconductor material layer 9 may be vertically offset from the un-recessed top surfaces of the semiconductor material layer 9 by a recess depth. The recess depth can be, for example, in a range from 1 nm to 50 nm, although lesser and greater recess depths can also be used. The overetch is optional, and may be omitted.

Generally, the memory openings 49 can be arranged in a pattern that provides strip-shaped areas that are free of the memory openings 49 and laterally extending along a first horizontal direction (e.g., word line direction) hd1. Further, the pattern of the memory openings 49 may comprise a plurality of discrete areas that are free of the memory openings 49 located between neighboring pairs of strip-shaped areas. In one embodiment, the memory openings 49 may be arranged in a pattern that includes a plurality of rows of memory openings 49 that are arranged along the first horizontal direction hd1.

Figures 3A, 3B, 3C:
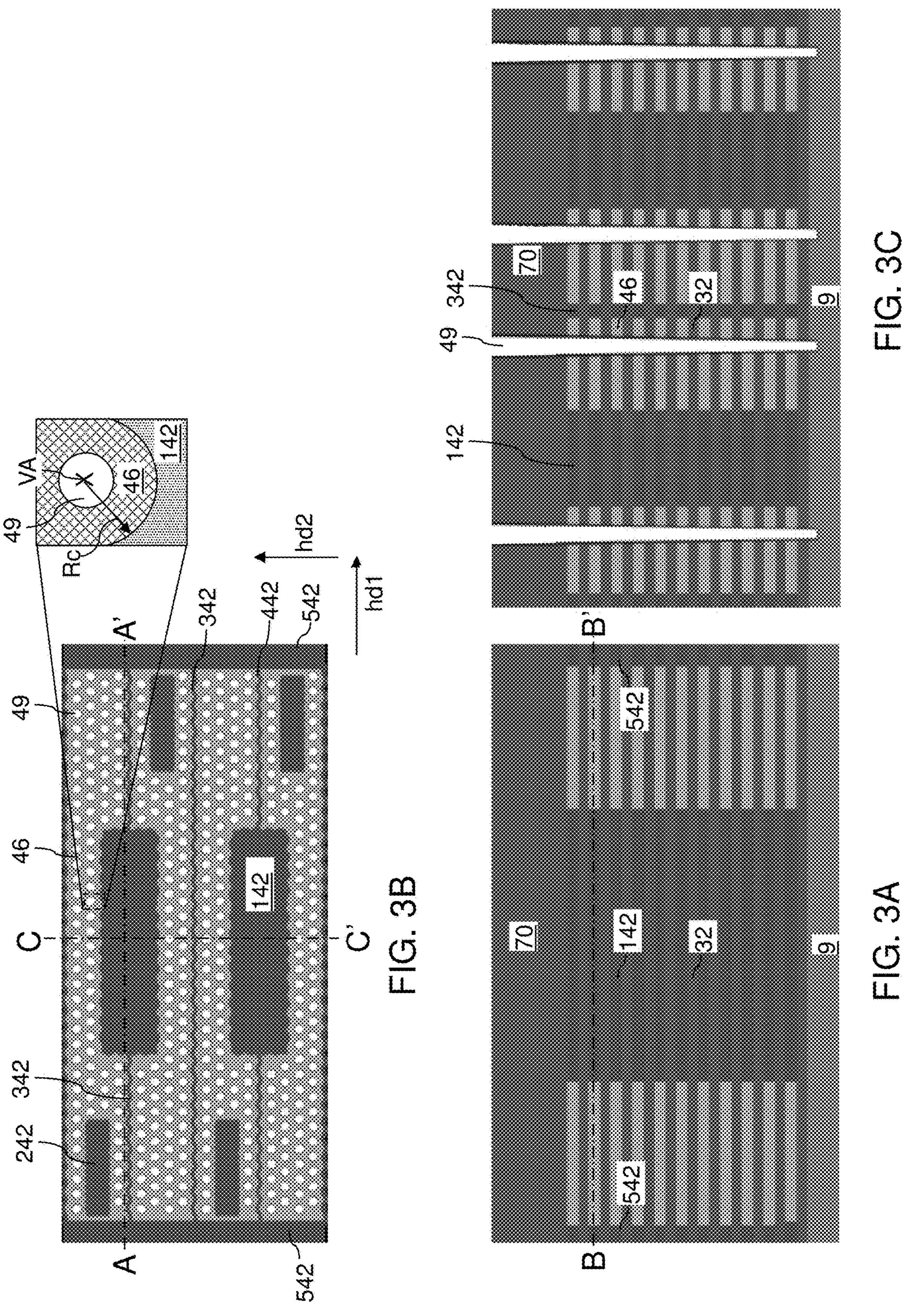
FIG. 3A is a vertical cross-sectional view of the first exemplary structure after replacement portions of the sacrificial material layers that are proximal to the memory openings with electrically conductive layers according to the first embodiment of the present disclosure.
FIG. 3B is a horizontal cross-sectional view of the first exemplary structure along the vertical plane B-B' of FIG. 3A. The vertical plane A-A' is the plane of the vertical cross-section of FIG. 3A.
FIG. 3C is a vertical cross-sectional view of the first exemplary structure along the vertical plane C-C' of FIG. 3B.

Referring to FIGS. 3A-3C, an isotropic etch process can be performed to laterally recess physically exposed sidewalls of the sacrificial material layers 42 selective to the material of the insulating layers 32 around each memory opening 49. For example, if the insulating layers 42 comprise silicon oxide and if the sacrificial material layers 42 comprise silicon nitride, a wet etch process employing hot phosphoric acid may be performed to isotropically recess the sidewalls of the sacrificial material layers 42 selective to the insulating layers 32. The lateral recesses are formed around each memory opening 49 at each level of the sacrificial material layers 42. The lateral recesses are herein referred to as memory-opening-side recesses or front lateral openings. The duration of the isotropic etch process can be selected such that discrete lateral recesses merge with each other to form multiple interconnected lateral recesses. Each of the interconnected lateral recesses may be laterally spaced apart by remaining portions of the sacrificial material layers 42. Each interconnected lateral recess laterally surrounds a respective plurality of memory openings 49 as formed at the processing steps described with reference to FIGS. 2A-2C.

The remaining portions of the sacrificial material layers 42 comprise various dielectric material portions (142, 242, 342, 442, 542), which provide lateral separation between neighboring pairs of interconnected lateral recesses. For example, the various dielectric material portions (142, 242, 342, 442, 542) may comprise dielectric material plates 142 having a respective first lateral extent along the first horizontal direction hd1 that is greater than the center-to-center spacing between neighboring pairs of memory openings 49, and having a respective second lateral extent along the second horizontal direction (e.g., bit line direction) hd2 that is greater than the center-to-center spacing between neighboring pairs of memory openings 49. In one embodiment, each dielectric material plate 142 may have a respective first lateral extent along the first horizontal direction hd1 that is greater than twice the center-to-center spacing between neighboring pairs of memory openings 49, and may have a respective second lateral extent along the second horizontal direction hd2 that is greater than twice the center-to-center spacing between neighboring pairs of memory openings 49. In one embodiment, the dielectric material plates 142 may have a generally rectangular horizontal cross-sectional area with sides having a respective lateral undulation in a plan view, as shown in FIG. 3B. The area of the dielectric material plates 142 will be used in subsequent steps to form word line contact via structures.

Further, the various dielectric material portions (142, 242, 342, 442, 542) may comprise discrete dielectric material plates 242 that are laterally enclosed by a respective interconnected lateral recess. The area of the discrete dielectric material plates 142 will be used in subsequent steps to form drain side select gate electrode contact via structures.

The various dielectric material portions (142, 242, 342, 442, 542) may comprise first dielectric material strips 342 laterally extending generally along the first horizontal direction hd1 and laterally separating a neighboring pair of interconnected lateral recesses. The first dielectric material strips 342 are not adjoined to dielectric material plates 142. The various dielectric material portions (142, 242, 342, 442, 542) may also comprise second dielectric material strips 442 laterally extending generally along the first horizontal direction hd2 and laterally separating a neighboring pair of interconnected lateral recesses. The second dielectric material strips 442 are adjoined to a respective dielectric material plate 142. Specifically, the second dielectric material strips 442 are adjoined to sides of the respective dielectric material plate 142 that extend along the second horizontal direction hd2. The dielectric material strips (342, 442) may have a respective pair of laterally-undulating lengthwise sidewalls that laterally extend along the first horizontal direction hd1 and having a lateral undulation along the second horizontal direction hd2. The first and second dielectric material strips (332, 442) will be used in subsequent steps to separate adjacent memory blocks along the word line direction (i.e., the first horizontal direction) hd1.

The various dielectric material portions (142, 242, 342, 442, 542) may also comprise dielectric isolation rails 542 laterally extending generally along the second horizontal direction (e.g., bit line direction) hd2. The dielectric material rails 542 will be used in subsequent steps to separate adjacent memory blocks along the bit line direction (i.e., the second horizontal direction) hd2.

The isotropic etch process laterally recesses the material of the sacrificial material layers 42 isotropically. Thus, each interface between an interconnected lateral recess and a dielectric material portion (142, 242, 342, 442, 542) is equidistant from a most proximal vertically-extending plane that contains sidewalls of the insulating layers 32 around a respective memory opening 49. In other words, vertical planes (such as cylindrical planes) may be defined such that the vertical planes contain sidewalls of the insulating layers 32 around a respective memory opening 49. Each interface between an interconnected lateral recess and a dielectric material portion (142, 242, 342, 442, 542) is equidistant from a most proximal one of the vertical planes. The lateral separation distance between each interface and the most proximal one of the vertical plane is the same as the lateral etch distance of the isotropic etch process.

In one embodiment, each of the memory openings 49 may have a respective circular horizontal cross-sectional shape. In this case, each interface between an interconnected lateral recess and a dielectric material portion (142, 242, 342, 442, 542) may be laterally offset from the vertical axis VA passing through the geometrical center of the volume of the most proximal memory opening 49 by a lateral distance that is the same as the sum of the radius of the memory opening 49 and the lateral etch distance of the isotropic etch process. Each interface between an interconnected lateral recess and a dielectric material portion (142, 242, 342, 442, 542) may be vertical in a vertical cross-sectional view, and may have a radius of curvature Rc in a horizontal cross-sectional view. The radius of curvature Rc can be the same as the sum of the radius of the memory opening 49 and the lateral etch distance of the isotropic etch process. Each interface between an interconnected lateral recess and a dielectric material portion (142, 242, 342, 442, 542) may comprise a respective set of multiple vertically-straight and horizontally concave surface segments of the dielectric material portion (142, 242, 342, 442, 542).

At least one conductive material, such as a combination of a metallic barrier liner material and a metallic fill material, may be conformally deposited in the continuous lateral recesses, in peripheral portions of the memory openings 49, and over the alternating stack (32, 42). The metallic barrier liner material may comprise a conductive metallic compound material such as TiN, TaN, WN, MON, TiC, TaC, WC, alloys thereof, or a combination thereof. The metallic fill material may comprise W. Ti. Ta, Mo, Co, Ru, Cu, alloys thereof, or combinations thereof. The total thickness of the at least one conductive material is greater than one half of the thickness of the dielectric material portions (142, 242, 342, 442, 542), and is less than the diameter (or a minor axis) of a memory opening 49. Thus, a continuously vertically-extending cavity may be present within each memory opening 49 after deposition of the at least one conductive material.

A recess etch process can be performed to remove portions of the at least one conductive material that are present within the volumes of the memory openings 49, and to remove a horizontally-extending portion of the at least one conductive material from above the insulating cap layer 70. The recess etch process may comprise an anisotropic etch process. Each remaining portion of the at least one conductive material located within a respective one of the continuous lateral recesses constitutes an electrically conductive layer 46. In one embodiment, sidewalls of the electrically conductive layers 46 around a memory opening 49 may be vertically coincident with (i.e., located within a same cylindrical vertical plane as) sidewalls of the insulating layers 32 located around the memory opening 49.

The set of all material portions between each vertically-neighboring pair of insulating layers 32 or between a topmost insulating layer 32 and an insulating cap layer 70 constitutes a composite layer (142, 242, 342, 442, 542, 46). In one embodiment, each of the composite layers (142, 242, 342, 442, 542, 46) comprise a respective set of electrically conductive layers 46 that are laterally spaced apart by a respective set of dielectric material portions (142, 242, 342, 442, 542). At least one topmost electrically conductive layer

46 comprises a drain side select gate electrode. At least one bottommost electrically conductive layer 46 comprises a source side select gate electrode. The remaining electrically conductive layers 46 located between the drain and source side select gate electrodes comprise word lines, which function as control gates for each vertical NAND string.

Generally, portions of the sacrificial material layers 42 that are proximal to the memory openings 49 are replaced with electrically conductive layers 46. In other words, proximal portions of the sacrificial material layers 42 around each of the memory openings 49 can be replaced with the electrically conductive layers 46. Each of the electrically conductive layers 46 comprises a respective set of electrically conductive material portions and contacts a remaining portion of a respective sacrificial material layer 42 that constitutes a dielectric material portion (142, 242, 342, 442, 542).

An alternating stack of insulating layers 32 and composite layers (142, 242, 342, 442, 542, 46) can be formed over a substrate. Each of the composite layers (142, 242, 342, 442, 542, 46) comprise a respective set of electrically conductive layers 46 that are laterally spaced apart by a respective set of dielectric material portions (142, 242, 342, 442, 542). In one embodiment, the memory openings 49 have a respective circular horizontal cross-sectional shape, and surface segments within the vertically-extending interfaces between the electrically conductive layers 46 and the dielectric material portions (142, 242, 342, 442, 542) have a respective radius of curvature Rc that is the same as a radial distance from a vertical axis VA passing through a geometrical center of a most proximal memory opening 49 among the memory openings 49 in a plan view.

FIGS. 4A-4F are sequential schematic vertical cross-sectional views of a memory opening 49 within the first exemplary structure during formation of a memory opening fill structure 58 therein according to the first embodiment of the present disclosure.

Figure 4B:
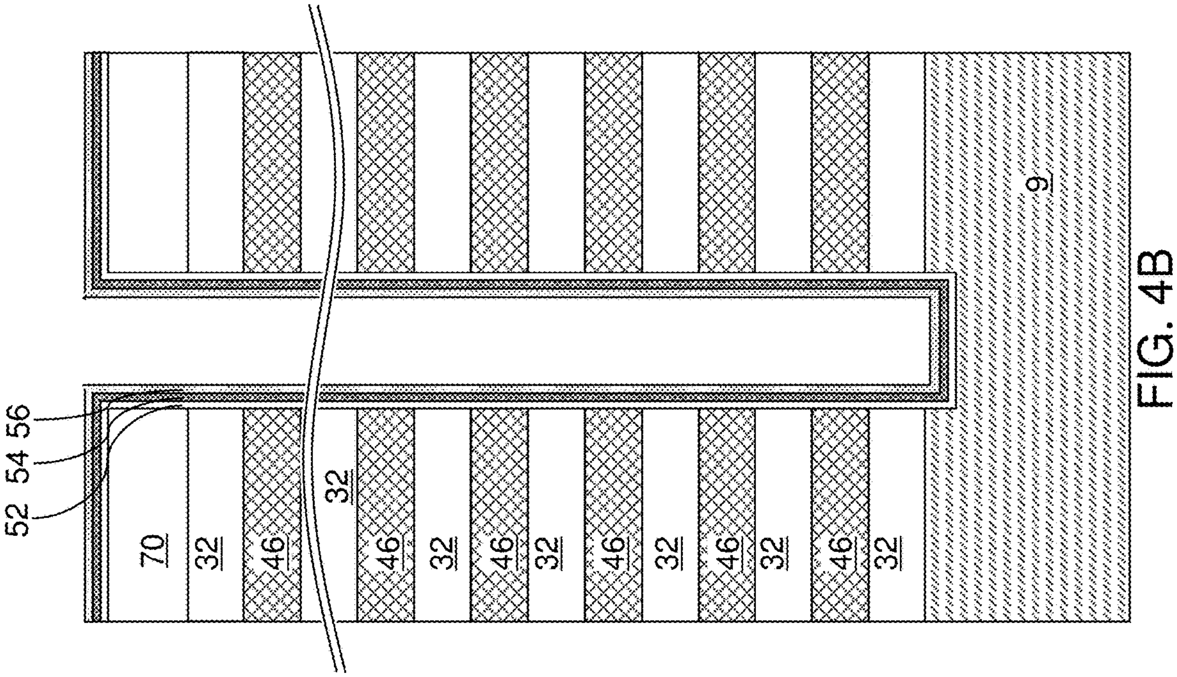
FIGS. 4A-4F are sequential schematic vertical cross-sectional views of a memory opening within the first exemplary structure during formation of a memory opening fill structure therein according to the first embodiment of the present disclosure.
Figure 4A:
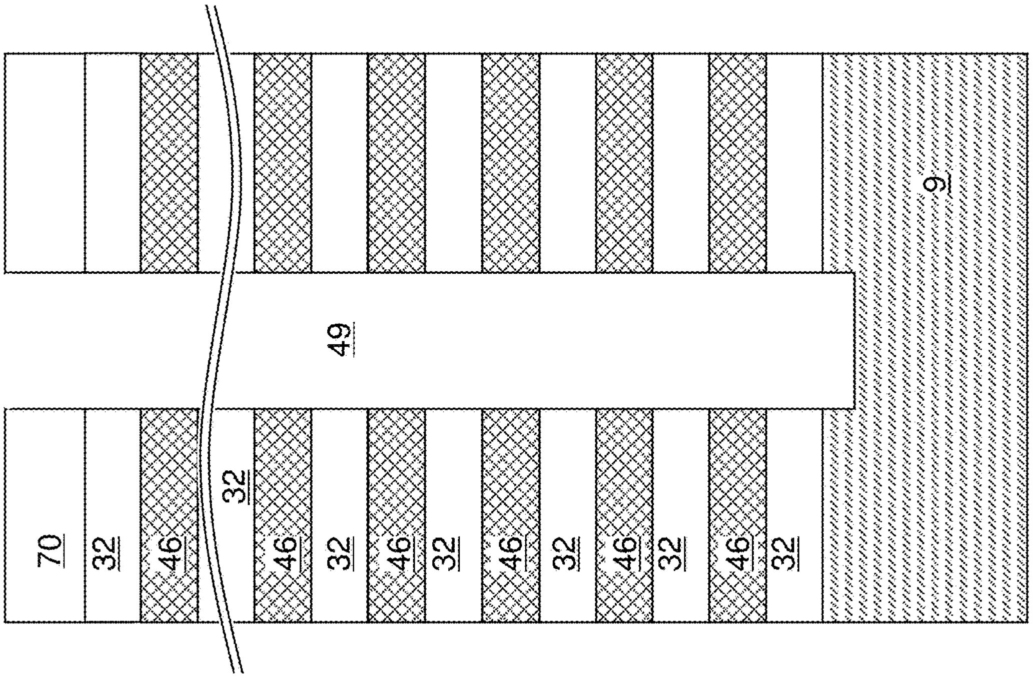

Referring to FIG. 4A, a memory opening 49 is illustrated after the processing steps described with reference to FIGS. 3A-3C.

Referring to FIG. 4B, a set of material layers can be conformally deposited, which may include an optional blocking dielectric layer 52, a memory material layer 54, and an optional dielectric liner 56. The blocking dielectric layer 52 may comprise at least one blocking dielectric material such as silicon oxide and/or a dielectric metal oxide. The memory material layer 54 may comprise any memory material that can store memory bits therein. For example, the memory material layer 54 may comprise a charge storage layer, such as a silicon nitride layer. Alternatively, the memory material layer 54 may comprise a ferroelectric memory material, a resistive memory material, a phase change memory material, or any other memory material known in the art. In some embodiments, the memory material layer 54 may comprise a vertical stack of discrete memory material portions that are formed at levels of the electrically conductive layers 46. Generally, the memory material layer 54 may comprise a vertical stack of memory cells that are formed at the levels of the electrically conductive layers 46. In one embodiment, the vertical stack of memory cells comprises portions of the memory material layer 54 located at the levels of the electrically conductive layers 46. The optional dielectric liner 56, if present, can provide electrical isolation between the memory material layer 54 and a semiconductor channel to be subsequently formed. In case the memory material layer 54 comprises a charge storage material, the optional dielectric liner 56 may comprise a tunneling dielectric layer.

Figure 4D:
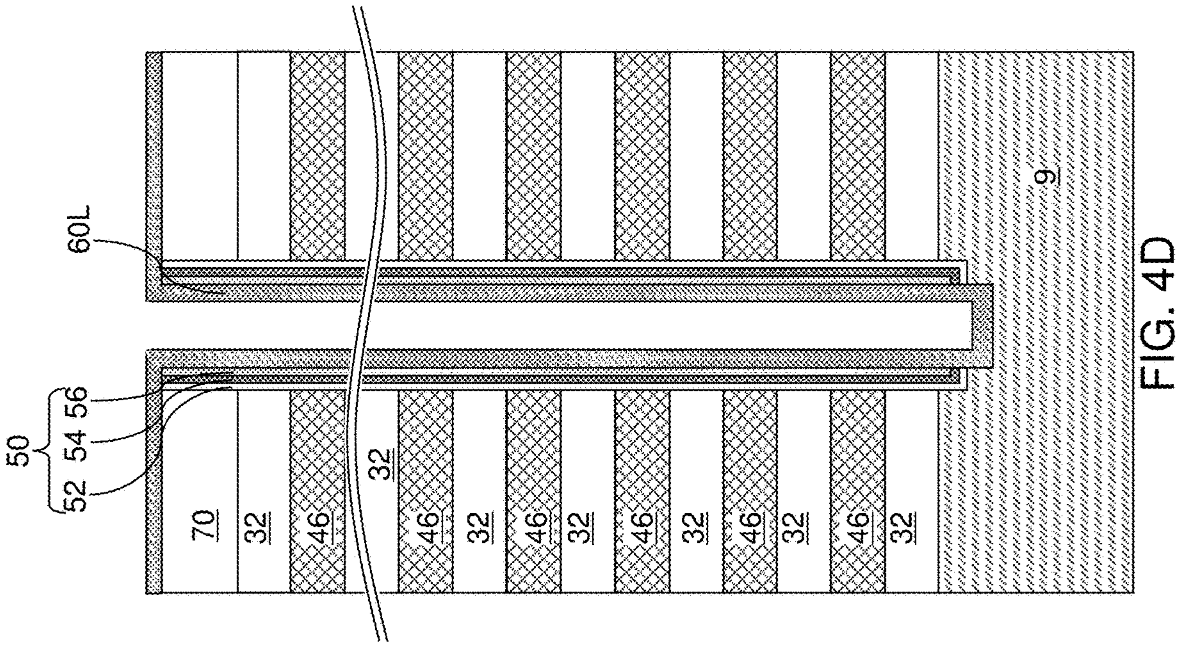
Figure 4C:
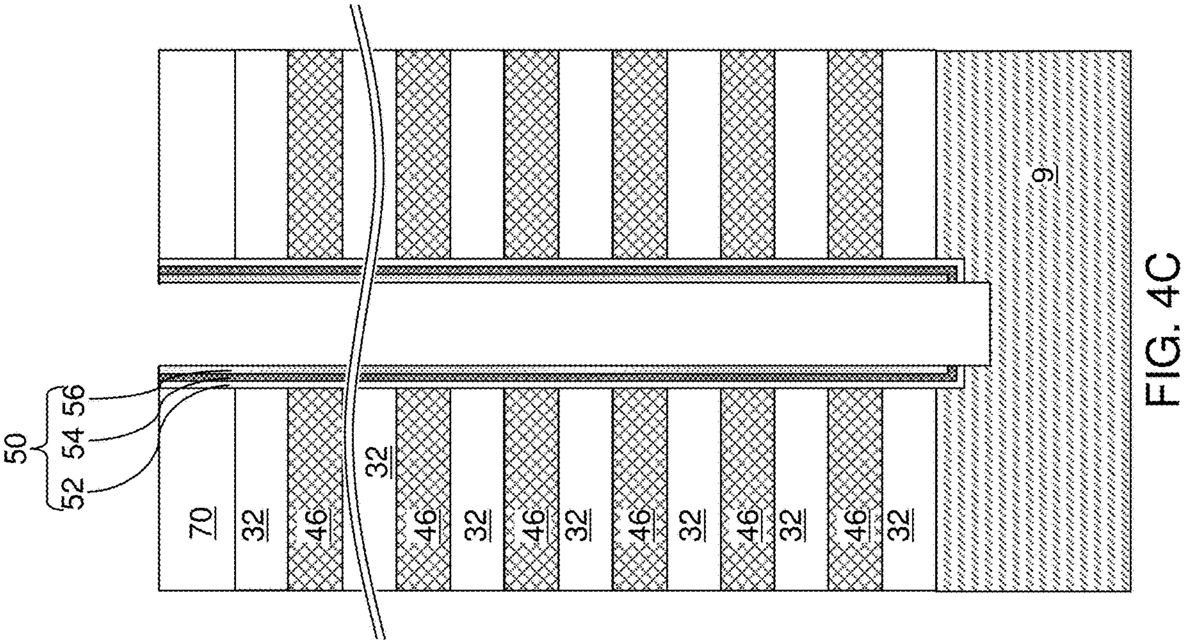

Referring to FIG. 4C, an anisotropic etch process may be performed to remove horizontally-extending portions of the optional blocking dielectric layer 52, the memory material layer 54, and the optional dielectric liner 56. The combination of vertically-extending portions of the optional blocking dielectric layer 52, the memory material layer 54, and the optional dielectric liner 56 that remain in a respective memory opening 49 constitutes a memory film 50.

Referring to FIG. 4D, a semiconductor channel layer 60L can be deposited over the memory films 50. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD). In one embodiment, the semiconductor channel layer 60L can be deposited as an amorphous semiconductor material. The thickness of the semiconductor channel layer 60L can be in a range from 2 nm to 10 nm, although lesser and greater thicknesses can also be used. A memory cavity is formed in the volume of each memory opening 49 that is not filled with the deposited material layers (52, 54, 56, 60L).

Figure 4F:
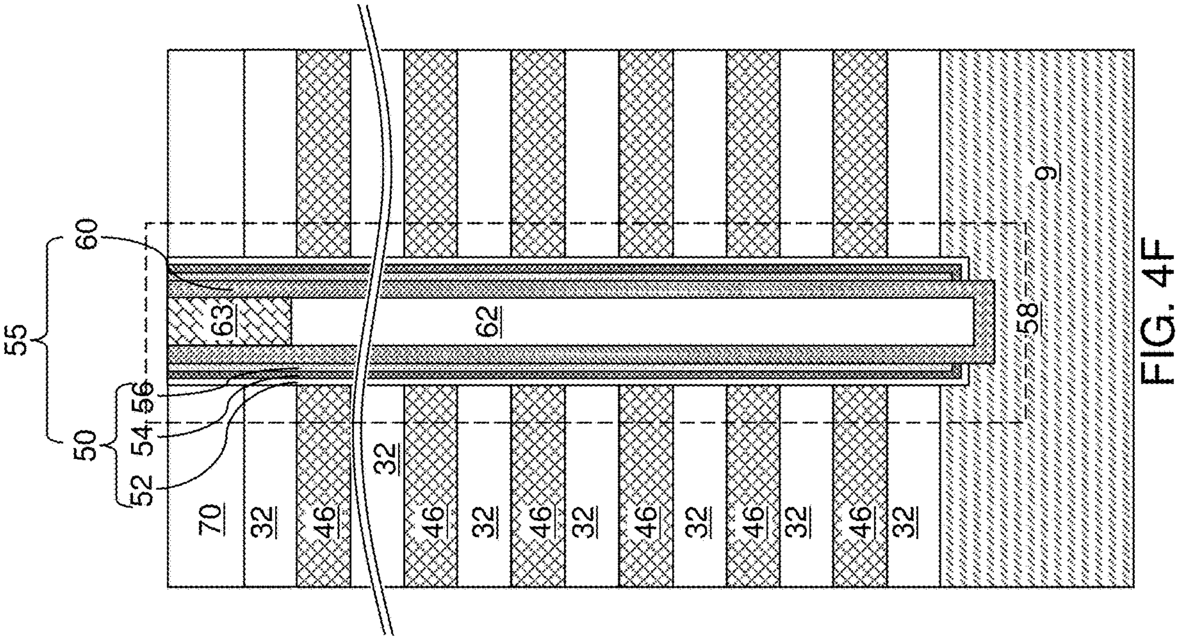
Figure 4E:
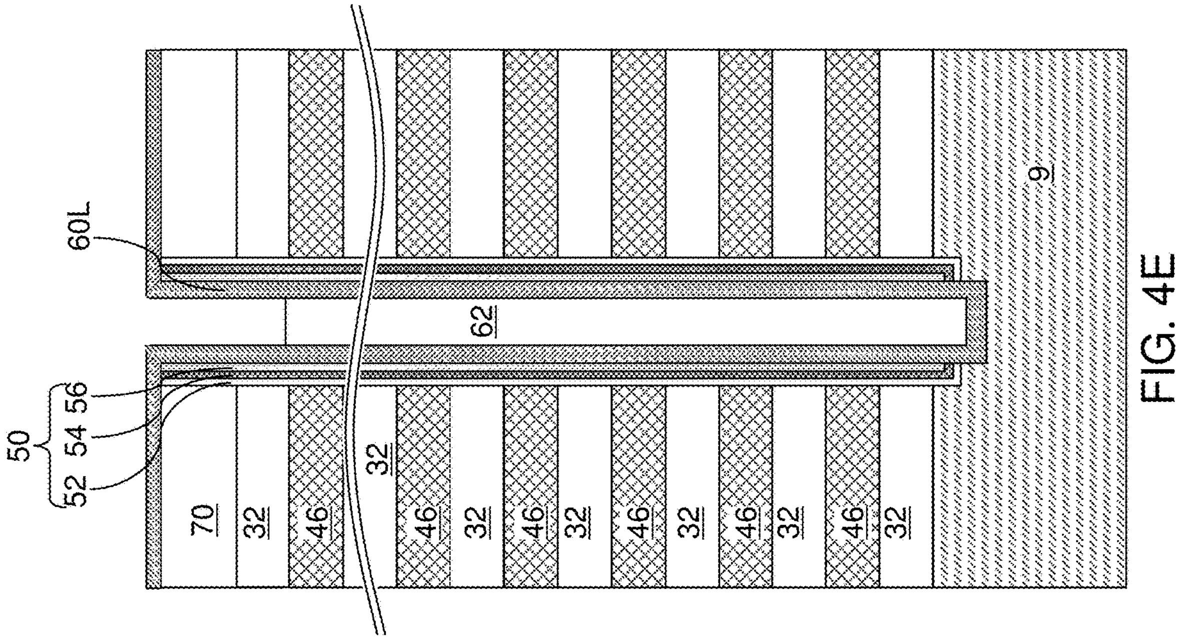

Referring to FIG. 4E, a dielectric core layer can be deposited to fill any remaining portion of the memory cavity within each memory opening. The dielectric core layer includes a dielectric material, such as silicon oxide or organosilicate glass. The dielectric core layer can be deposited by a conformal deposition method such as low pressure chemical vapor deposition (LPCVD), or by a self-planarizing deposition process such as spin coating. The dielectric core layer can be subsequently recessed selective to the material of the semiconductor channel layer 60L, for example, by a recess etch. The material of the dielectric core layer is vertically recessed below the horizontal plane including the top surface of the insulating cap layer 70. Each remaining portion of the dielectric core layer constitutes a dielectric core 62.

Referring to FIG. 4F, a doped semiconductor material having a doping of a second conductivity type can be deposited within each recess cavity located above the dielectric cores 62. The second conductivity type is the opposite of the first conductivity type. For example, if the first conductivity type is p-type, the second conductivity type is n-type, and vice versa. In one embodiment, the doped semiconductor material may be deposited as an amorphous semiconductor material. The dopant concentration in the doped semiconductor material having a doping of the second conductivity type can be in a range from $5.0\times10^{18}/cm^3$ to $2.0\times10^{21}/cm^3$, although lesser and greater dopant concentrations can also be used.

A planarization process can be performed to remove portions of the doped semiconductor material having a doping of the second conductivity type and the semiconductor channel layer 60L from above the top surface of the insulating cap layer 70, for example, by chemical mechanical planarization (CMP) or a recess etch to form drain regions 63. Each remaining portion of the semiconductor material having a doping of the second conductivity type constitutes a drain region 63. Each remaining portion of the semiconductor channel layer 60L constitutes a vertical semiconductor channel 60. Electrical current can flow through each vertical semiconductor channel 60 when a vertical NAND device including the vertical semiconductor channel 60 is turned on. Within each memory opening 49, a dielectric liner 56 is surrounded by a memory material layer 54, and laterally surrounds a vertical semiconductor channel 60. Each adjoining set of a blocking dielectric layer 52, a memory material layer 54, and a dielectric liner 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours. Each combination of a memory film 50 and a vertical semiconductor channel 60 constitutes a memory stack structure 55.

Each contiguous combination of a vertical semiconductor channel 60 and a memory film 50 constitutes a memory stack structure 55. Thus, each memory stack structure 55 can include a vertical semiconductor channel 60, a dielectric liner 56, a plurality of memory cells comprising portions of the memory material layer 54, and an optional blocking dielectric layer 52. Each combination of a memory stack structure 55, a dielectric core 62, and a drain region 63 within a memory opening 49 is herein referred to as a memory opening fill structure 58.

Figures 5A, 5B, 5C:
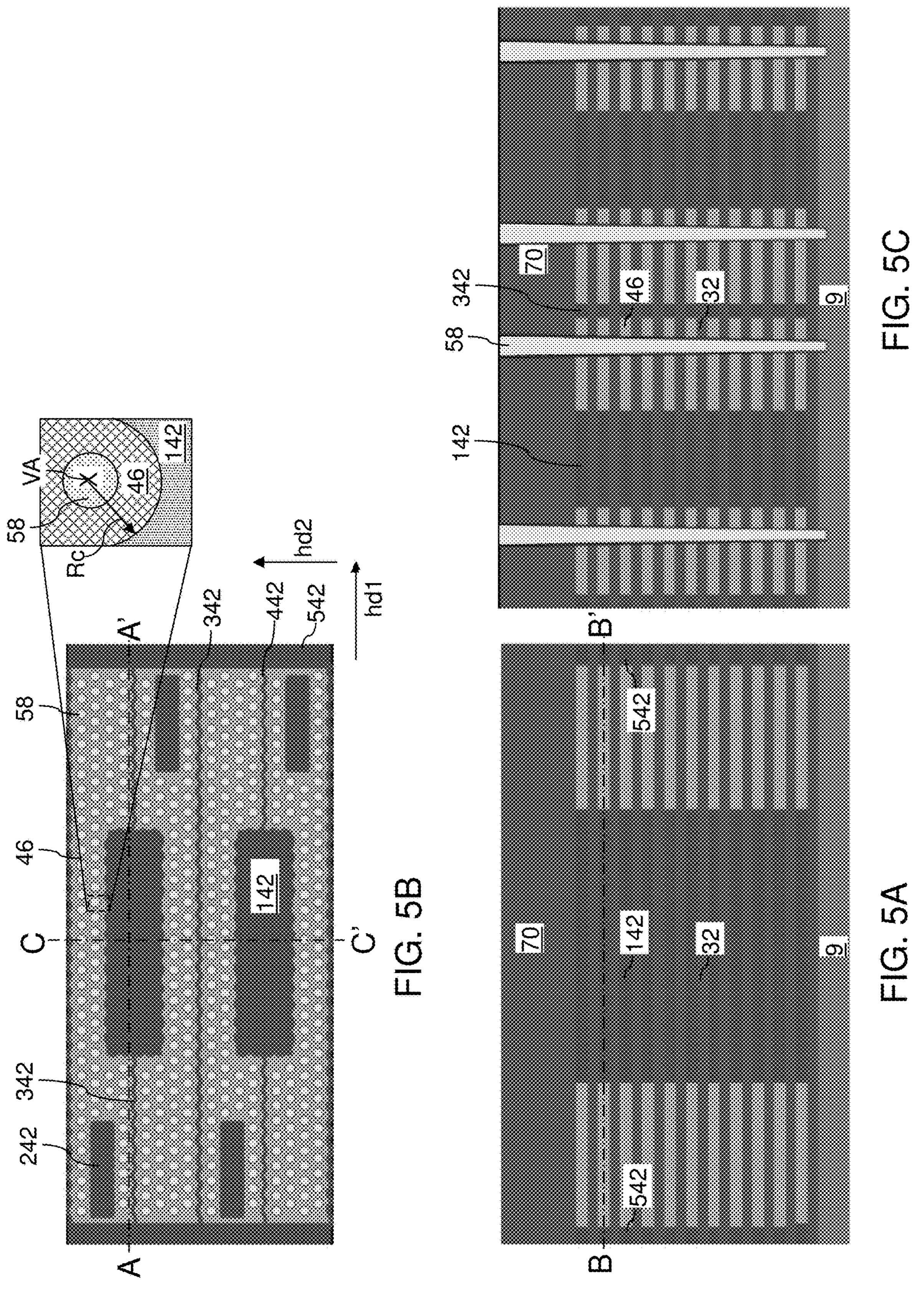
FIG. 5A is a vertical cross-sectional view of the first exemplary structure after formation of memory opening fill structures in the memory openings according to the first embodiment of the present disclosure.
FIG. 5B is a horizontal cross-sectional view of the first exemplary structure along the vertical plane B-B' of FIG. 5A. The vertical plane A-A' is the plane of the vertical cross-section of FIG. 5A.
FIG. 5C is a vertical cross-sectional view of the first exemplary structure along the vertical plane C-C' of FIG. 5B.

Referring to FIGS. 5A-5C, the first exemplary structure is illustrated after the processing steps described with reference to FIG. 4F. In one embodiment, the electrically conductive layers 46 laterally surround a respective plurality of memory opening fill structures 58 upon formation of the memory opening fill structures 58. The memory openings 49 vertically extend through portions of the alternating stack (32, 142, 242, 342, 442, 542, 46) of insulating layers 32 and composite layers (142, 242, 342, 442, 542, 46), and are laterally spaced from each of the dielectric material portions (142, 242, 342, 442, 542). In other words, the memory opening fill structures 58 are surrounded by the electrically conductive layers 46 and are offset from the dielectric material portions at the levels of the composite layers. Vertically-extending interfaces between the electrically conductive layers 46 and the dielectric material portions (142, 242, 342, 442, 542) are laterally offset from a sidewall of a most proximal one of the memory opening fill structures 58.

Figure 6B:
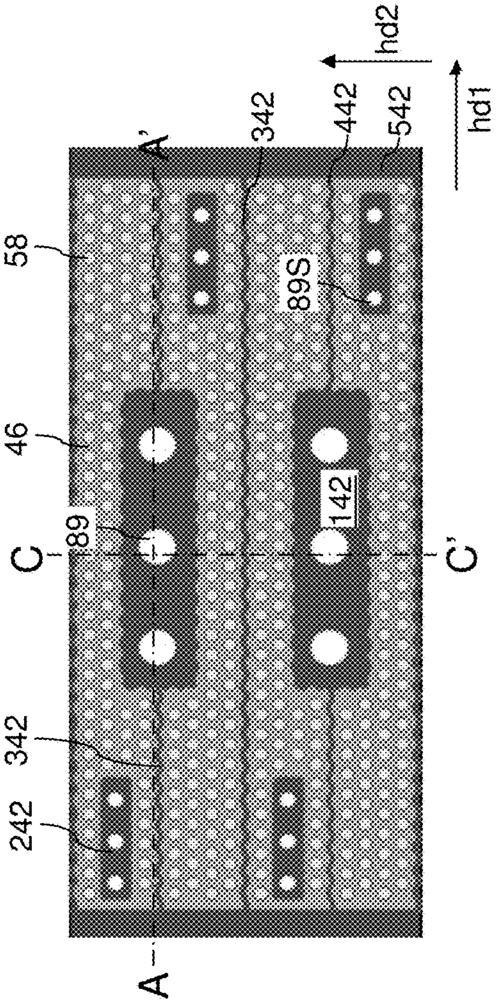
FIG. 6B is a horizontal cross-sectional view of the first exemplary structure along the vertical plane B-B' of FIG. 6A. The vertical plane A-A' is the plane of the vertical cross-section of FIG. 6A.
Figure 6A:
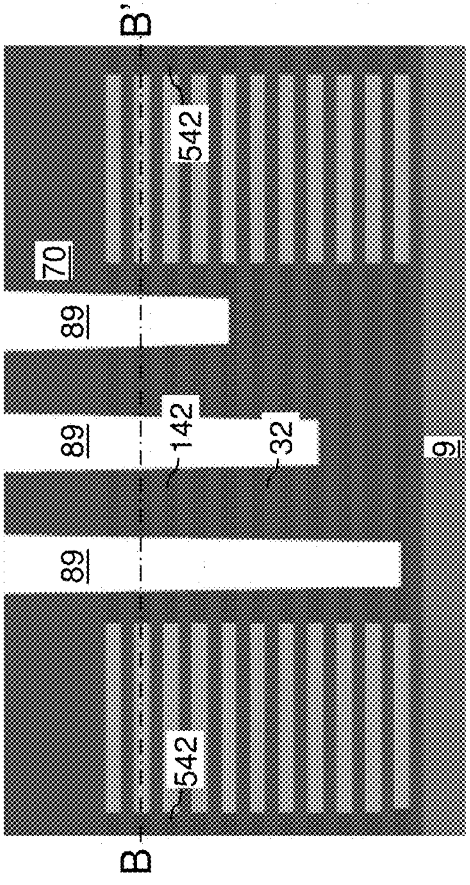
FIG. 6A is a vertical cross-sectional view of the first exemplary structure after formation of contact via openings according to the first embodiment of the present disclosure.
Figure 6C:
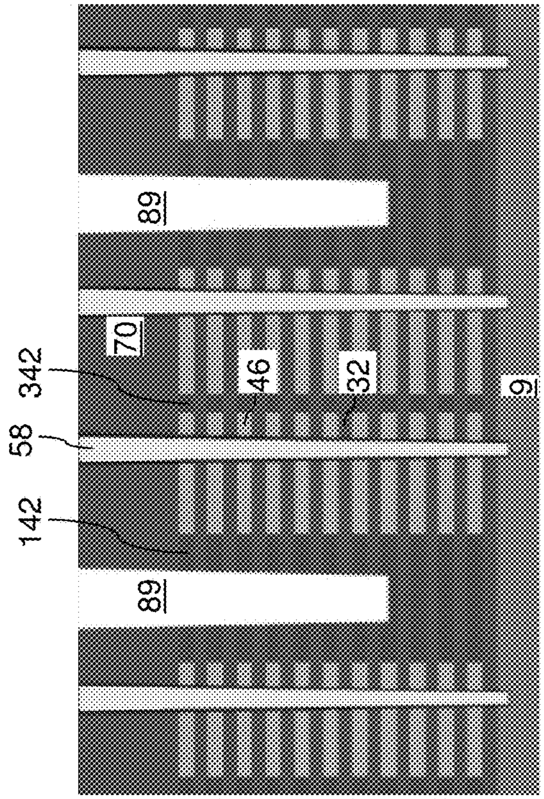
FIG. 6C is a vertical cross-sectional view of the first exemplary structure along the vertical plane C-C' of FIG. 6B.

Referring to FIGS. 6A-6C, contact via openings 89 are formed within the areas of the dielectric material plates 142. Each of the contact via openings 89 can vertically extend through the insulating cap layer 70 and optionally through a respective subset of the dielectric material plates 142 and optionally through a respective subset of the insulating layers 32 such that a top surface of a selected dielectric material plate 142 is physically exposed at the bottom of each contact via opening 89. In one embodiment, the contact via openings 89 may have different depths from each other, and a dielectric material plate 142 can be physically exposed to a respective overlying contact via opening 89 at each level of the electrically conductive layers 46. In other words, for each electrically conductive layer 46 overlying the semiconductor material layer 9, at least one dielectric material plate 142 located at the same level as the electrically conductive layer 46 can be physically exposed to a respective overlying contact via opening 49.

The contact via openings 89 having different depths may be formed employing a plurality of masked anisotropic etch processes. In an illustrative example, a patterned hard mask layer (not shown) including openings therethrough may be formed over the insulating cap layer 70. The patterned hard mask layer may comprise a dielectric material such as silicon nitride, and/or a metallic material such as TiN. The openings in the patterned hard mask layer may have the pattern of all of the contact via openings 89 to be subsequently formed. An anisotropic etch process may be performed to transfer the pattern of the openings in the patterned hard mask layer through the insulating cap layer 70.

Subsequently, multiple iterations of a combination of a respective masking process and a respective anisotropic etch process may be performed to etch through a respective subset of dielectric material plates 142 and a respective subset of the insulating layers 32. Each masking process forms a respective patterned photoresist layer that masks a respective subset of the openings in the patterned hard mask layer without masking a respective complementary subset of the openings. Each anisotropic etch process etches a respective number of dielectric material plates 142 and a respective number of insulating layers 32 underneath each opening in the pattered hard mask layer that is not masked by a respective patterned photoresist layer. In one embodiment, the number of etched dielectric material plates 142 and etched insulating layers 32 underneath unmasked openings in the patterned hard mask layer may be a non-negative integer power of 2, i.e., 1, 2, 4, 8, 16, 32, 64, etc. By employing a combination of various masking patterns for the patterned photoresist layers, the total depths of the contact via openings 89 can be varied to enable physical exposure of the top surfaces of dielectric material plates 142 at each level of the electrically conductive layers 46. The patterned hard mask layer can be subsequently removed. The lateral dimensions (such as diameters) of the contact via openings 89 may be in a range from 30 nm to 300 nm, although lesser and greater lateral dimensions may also be employed. Generally, a contact via opening 89 may vertically extend through an alternating stack of insulating layers 32 and dielectric material plates 142.

Select gate electrode contact via openings 89S are formed within the areas of the discrete dielectric material plates 242. A discrete dielectric material plate 142 can be physically exposed to a respective overlying select gate electrode contact via opening 89S at each level of one or more topmost electrically conductive layers 46 which functions as a drain side select gate electrode.

Figure 7B:
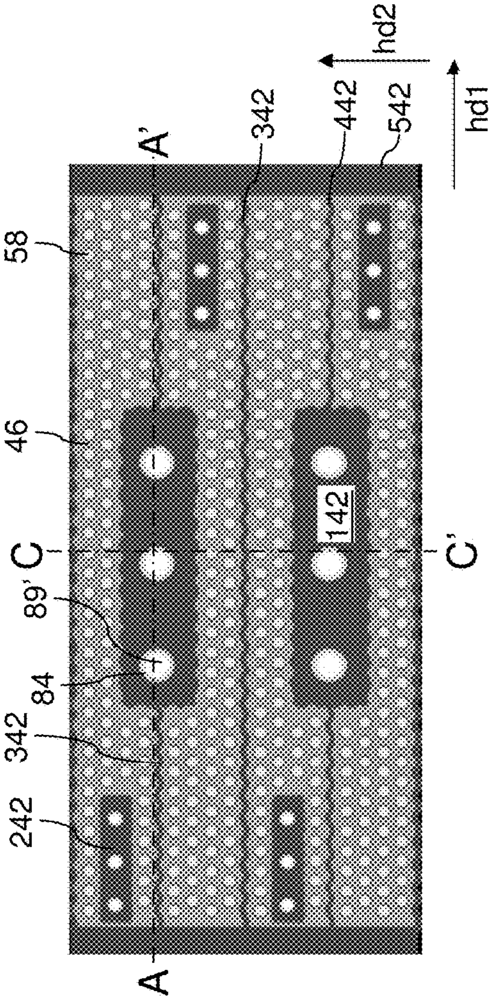
FIG. 7B is a horizontal cross-sectional view of the first exemplary structure along the vertical plane B-B' of FIG. 7A. The vertical plane A-A' is the plane of the vertical cross-section of FIG. 7A.
Figure 7A:
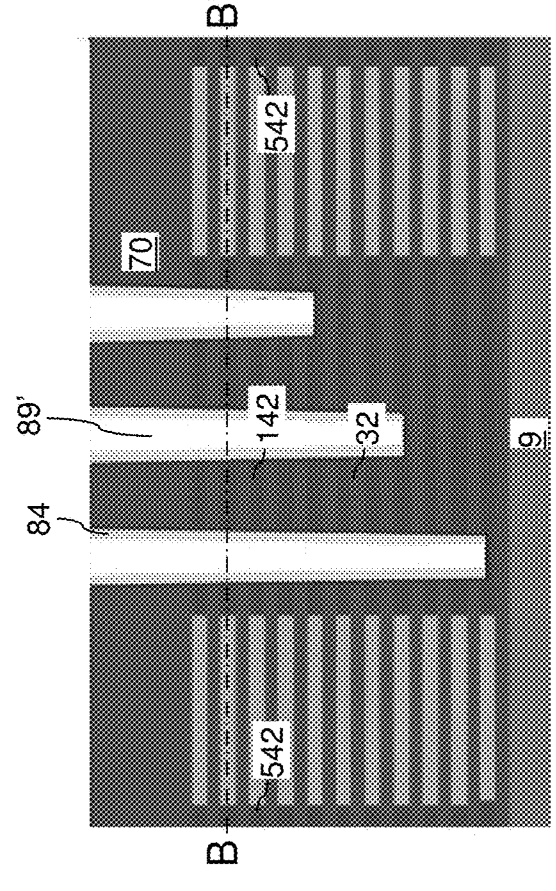
FIG. 7A is a vertical cross-sectional view of the first exemplary structure after formation of dielectric contact via liners according to the first embodiment of the present disclosure.
Figure 7C:
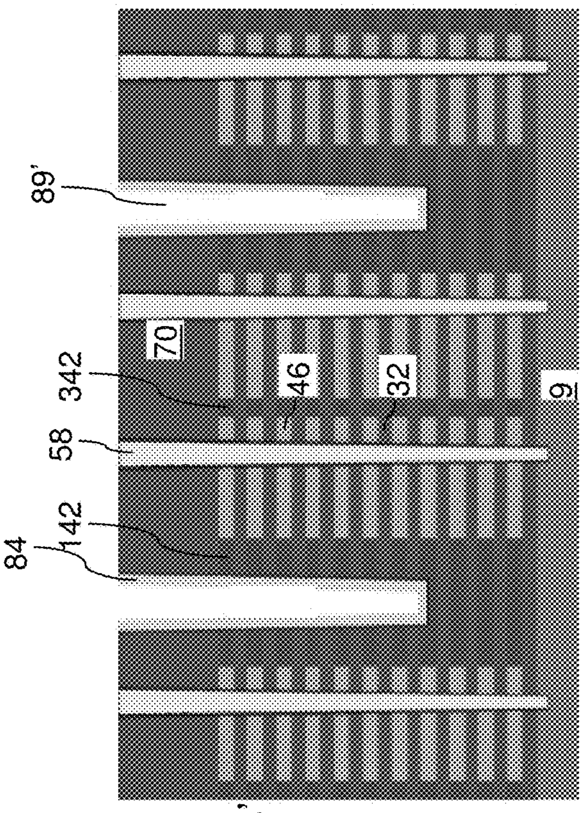
FIG. 7C is a vertical cross-sectional view of the first exemplary structure along the vertical plane C-C' of FIG. 7B.

Referring to FIGS. 7A-7C, a dielectric material such as silicon oxide can be conformally deposited in the contact via openings 89, in the select gate electrode contact via openings 89S and over the insulating cap layer 70 to form a conformal dielectric material layer. An anisotropic etch process can be performed to remove horizontally-extending portions of the conformal dielectric material layer. Each remaining tubular portion of the conformal dielectric material layer constitutes a tubular dielectric spacer 84. Each tubular dielectric spacer 84 is a dielectric contact via liner that contacts a sidewall of a respective one of the contact via openings 89 or select gate electrode contact via opening 89S. A tubular dielectric liner 84 can be formed at a peripheral portion of each contact via opening 89 or select gate electrode contact via opening 89S. A contact via cavity 89' can be present within each unfilled volume of the contact via openings 89.

Figure 8B:
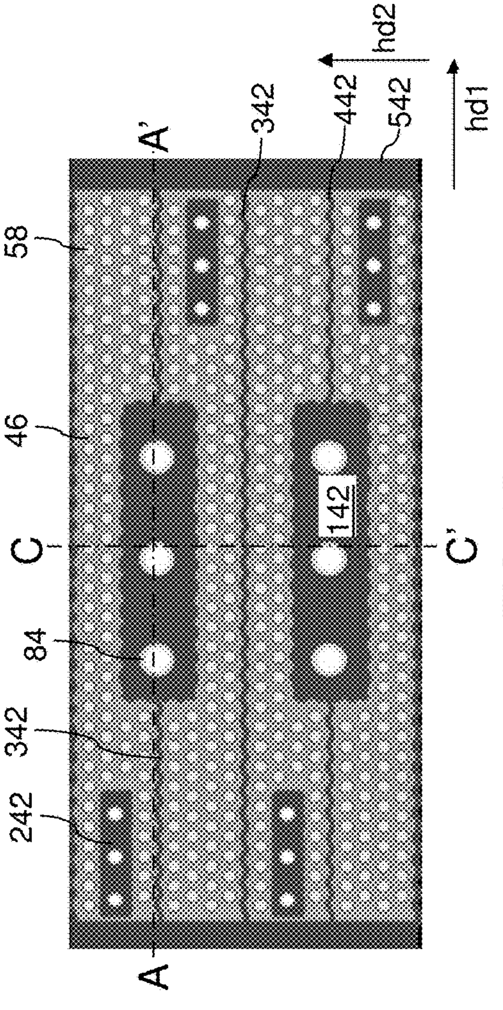
FIG. 8B is a horizontal cross-sectional view of the first exemplary structure along the vertical plane B-B' of FIG. 8A. The vertical plane A-A' is the plane of the vertical cross-section of FIG. 8A.
Figure 8C:
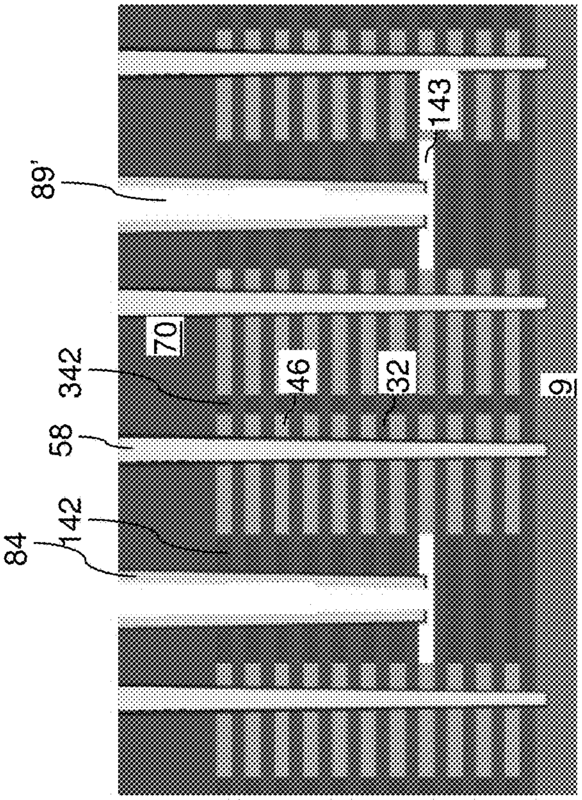
FIG. 8C is a vertical cross-sectional view of the first exemplary structure along the vertical plane C-C' of FIG. 8B.
Figure 8A:
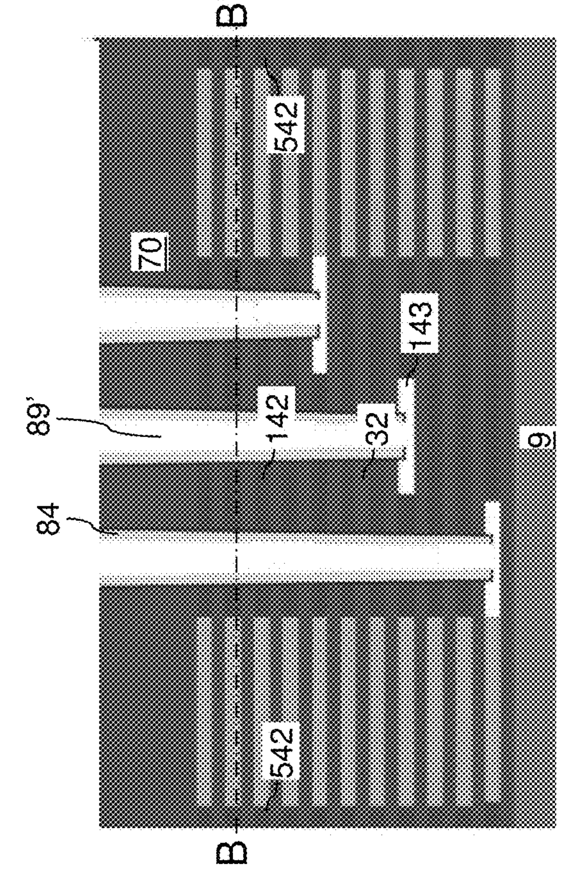
FIG. 8A is a vertical cross-sectional view of the first exemplary structure after formation of laterally-extending cavities according to the first embodiment of the present disclosure.

Referring to FIGS. 8A-8C, an isotropic etch process can be performed to etch the material of the dielectric material plates 142 and the discrete dielectric material plates 242 selective to materials of the insulating layers 32, the tubular dielectric liners 84, and the insulating cap layer 70. For example, if the dielectric material plates 142 comprise silicon nitride, a wet etch process employing hot phosphoric acid may be performed to remove each dielectric material plate 142 that is physically exposed to a cavity within a respective contact via opening 89. A laterally-extending cavity 143 can be formed within each void that is formed by removal of a dielectric material plate 142 or a discrete dielectric material plate 242. Generally, the isotropic etch process that etches the material of the dielectric material portions (142, 242, 342, 442, 542) selective to materials of the electrically conductive layers 46 and the tubular dielectric liner 84 can be performed after formation of the tubular dielectric liners 84. The laterally-extending cavities 143 can be formed underneath the contact via openings 89 and the select gate electrode contact via openings 89S such that a sidewall of a respective electrically conductive layer 46 is physically exposed around each laterally-extending cavity 143. In one embodiment, laterally-extending cavities 143 located at different levels may be formed within the area of a vertical stack of dielectric material plates 142.

Figure 9B:
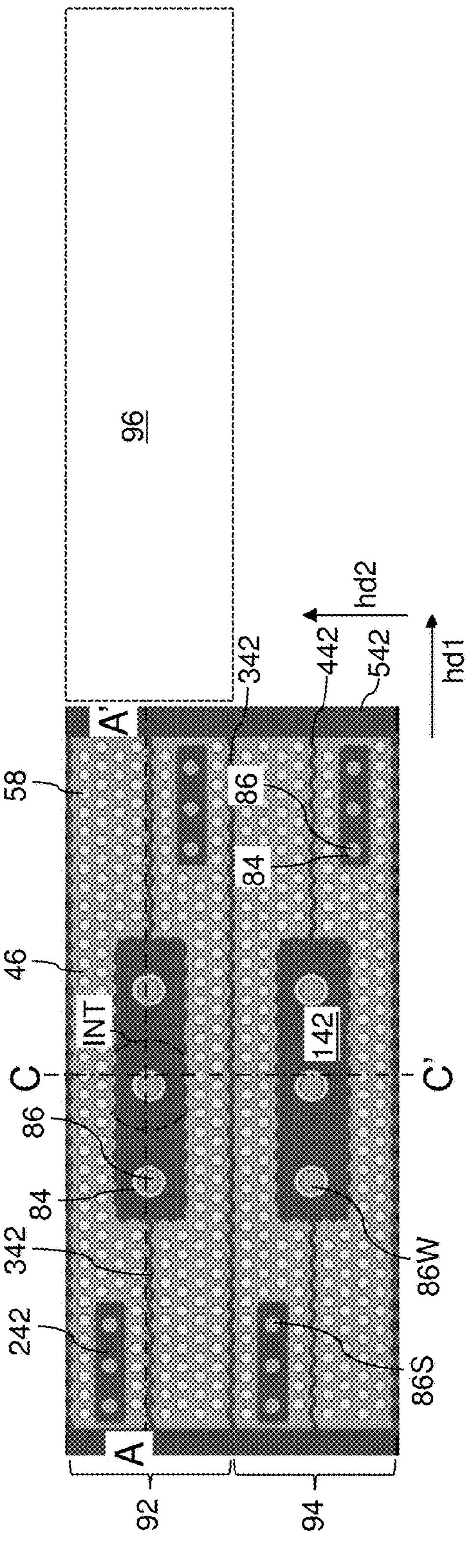
FIG. 9B is a horizontal cross-sectional view of the first exemplary structure along the vertical plane B-B' of FIG. 9A. The vertical plane A-A' is the plane of the vertical cross-section of FIG. 9A.
Figure 9C:
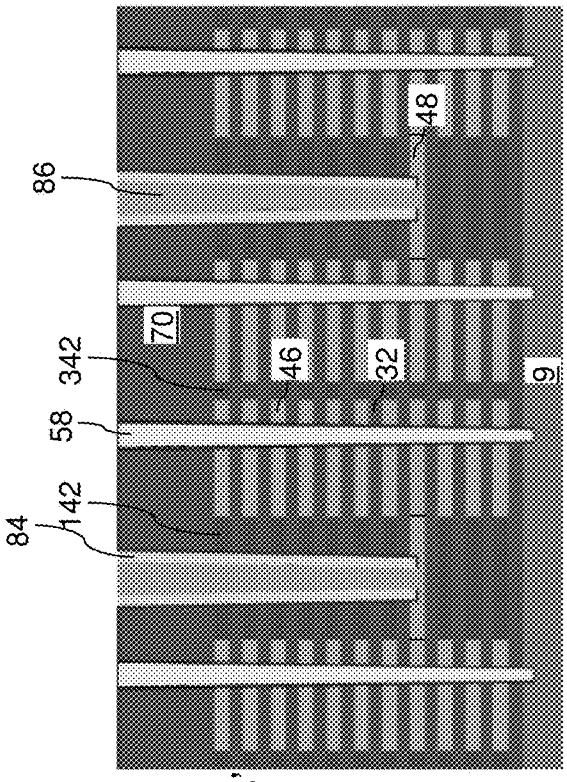
FIG. 9C is a vertical cross-sectional view of the first exemplary structure along the vertical plane C-C' of FIG. 9B.
Figure 9A:
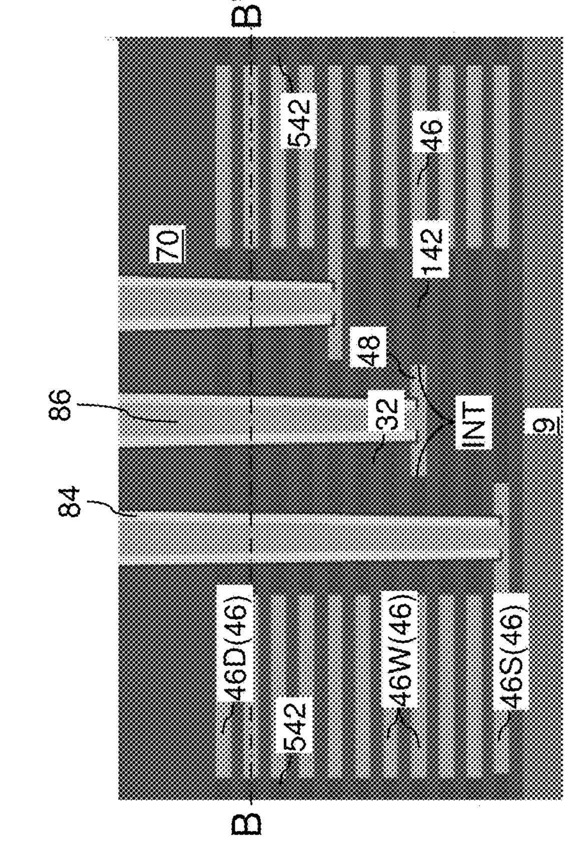
FIG. 9A is a vertical cross-sectional view of the first exemplary structure after formation of integrated connection-and-contact structures according to the first embodiment of the present disclosure.

Referring to FIGS. 9A-9C, at least one conductive material, such as a combination of a metallic barrier liner material and a metallic fill material, may be conformally deposited in the laterally-extending cavities 143 and in the via cavities (89', 89S) laterally surrounded by the tubular dielectric liners 84. The metallic barrier liner material may comprise a conductive metallic compound material such as TiN, TaN, WN, MON, TiC, TaC, WC, alloys thereof, or a combination thereof. The metallic fill material may comprise W, Ti, Ta, Mo, Co, Ru, Cu, alloys thereof, or combinations thereof. The total thickness of the at least one conductive material is greater than one half of the height of the laterally-extending cavities 143 and is greater than one half of the width of the via cavities (89' 89S). Excess portions of the at least one conductive material can be removed from above the horizontal plane including the top surface of the insulating cap layer 70 by performing a planarization process, which may comprise a recess etch process and/or a chemical mechanical polishing process.

Each remaining portion of the at least one conductive material that fills a respective combination of a laterally-extending cavity 143 and a via cavity (89', 89S) constitutes an integrated line-and-via structure (48, 84, 86). Each integrated line-and-via structure (48, 84, 86) can be formed in a continuous volume including the laterally-extending cavity 143 and a volume within a contact via opening 89 or a select gate electrode contact via opening 89S. Each integrated line-and-via structure (48, 84, 86) comprises a metallic plate portion 48 that laterally contacts a respective electrically conductive layer 46 and further comprising a metallic via portion 86 that is formed in a respective contact via opening 89 or select gate electrode contact via opening 89S.

Referring collectively to FIGS. 1-9C, a semiconductor structure is provided, which comprises: an alternating stack (32, 46) of insulating layers 32 and composite layers (142, 242, 342, 442, 542, 46), wherein each of the composite layers (142, 242, 342, 442, 542, 46) comprise a respective set of electrically conductive layers 46 that are laterally spaced apart by a respective set of dielectric material portions (142, 242, 342, 442, 542); memory openings 49 vertically extending through portions of the alternating stack (32, 46) and laterally spaced from each of the dielectric material portions (142, 242, 342, 442, 542); memory opening fill structures 58 located in the memory openings 49, wherein vertically-extending interfaces between the electrically conductive layers 46 and the dielectric material portions (142, 242, 342, 442, 542) are laterally offset from a sidewall of a most proximal one of the memory opening fill structures 58, and wherein each of the memory opening fill structures 58 comprises a respective vertical semiconductor channel 60 and a respective vertical stack of memory cells (such as portions of a memory material layer 54); and an integrated line-and-via structure (48, 84, 86) comprising a metallic plate portion 48 that laterally contacts a first electrically conductive layer 46 of the electrically conductive layers 46 and further comprising a metallic via portion 86 that vertically extends through a subset of the dielectric material portions (142, 242, 342, 442, 542) (such as dielectric material plates 142) that overlies the metallic plate portion 48.

In one embodiment, the metallic via portion 86 also vertically extends through a subset of the insulating layers 32 that overlies the metallic plate portion 48; the memory openings 49 have a respective circular horizontal cross-sectional shape; and surface segments within the vertically-extending interfaces between the electrically conductive layers 46 and the dielectric material portions (142, 242, 342, 442, 542) have a respective radius of curvature Rc that is the same as a radial distance from a vertical axis passing through a geometrical center of a most proximal memory opening 49 among the memory openings 49 in a plan view. In one embodiment, surface segments within a vertically-extending interface INT between the metallic plate portion 48 and the first electrically conductive layer 46 have a respective radius of curvature Rc that is the same as the radial distance in the plan view.

In one embodiment, the integrated line-and-via structure (48, 84, 86) comprises a homogeneous metallic material portion that extends continuously from a volume within the metallic plate portion 48 to a volume within the metallic via portion 86 without a material junction therein. As used herein, a material junction refers to any surface at which different materials contact each other, or at which a continuous microscopic interface extends over a macroscopic lateral dimension (such as greater than 1 mm).

The integrated line-and-via structure (48, 84, 86) can be a unitary structure. As used herein, a unitary structure refers to a structure in which any pair of two points within the structure can be connected by a continuous path that is contained within entirely within the structure.

In one embodiment, the metallic via portion 86 is laterally surrounded by a tubular dielectric liner 84; and the tubular dielectric liner 84 is laterally surrounded by each dielectric material portion within the subset of the dielectric material portions (142, 242, 342, 442, 542) (such as dielectric material plates 142) that overlies the metallic plate portion 48. In one embodiment, an annular bottom surface of the tubular dielectric liner 84 contacts an annular horizontal surface segment of the metallic plate portion 48.

In one embodiment, the metallic plate portion 48 comprises: a first horizontal surface that contacts a horizontal bottom surface of an overlying insulating layer 32 of the insulating layers 32; a second horizontal surface that contacts a horizontal top surface of an underlying insulating layer 32 of the insulating layers 32; a laterally-undulating vertical surface that contacts the first electrically conductive layer 46; and a pair of laterally-convex and vertically-straight surfaces that contact a respective dielectric material portion.

In one embodiment shown in FIG. 9A, at least one topmost electrically conductive layer 46D of the electrically conductive layers 46 comprises a drain side select gate electrode, at least one bottommost electrically conductive layer 46S of the electrically conductive layers comprises a source side select gate electrode, and the electrically conductive layers 46W located between the drain and source side select gate electrodes (46D, 46S) comprise word lines.

In one embodiment shown in FIG. 9B, the set of dielectric material portions comprises dielectric material plates 142, discrete dielectric material plates 242, first dielectric material strips 342 laterally extending generally along a word line direction hd1 and laterally separating a first laterally neighboring pair of the word lines 46W located in adjacent memory blocks (92, 94), second dielectric material strips 442 laterally extending generally along the word line direction hd1 and together with the dielectric material plates 142 laterally separating a second laterally neighboring pair of the word lines 46W in a same memory block 92, and dielectric isolation rails 542 laterally extending generally along a bit line direction hd2 and laterally separating adjacent memory (92, 96) blocks along the bit line direction hd2. A pair of the discrete dielectric material plates 242 located in the same memory block 92 is laterally separated along the bit line direction hd2 by a respective one of the second dielectric material strips 442.

In one embodiment shown in FIG. 9B, the metallic via portions 86 comprise word line contact via portions 86W which vertically extend through the subset of the dielectric material plates (e.g., one or more plates) 142 and contact a respective one of the word lines 46W, and select gate electrodes contact via portions 86S which vertically extend through the subset of the discrete dielectric material plates (e.g., one or more plates) 242 and contact a respective one of the drain side select gate electrodes 46D.

Figure 10B:
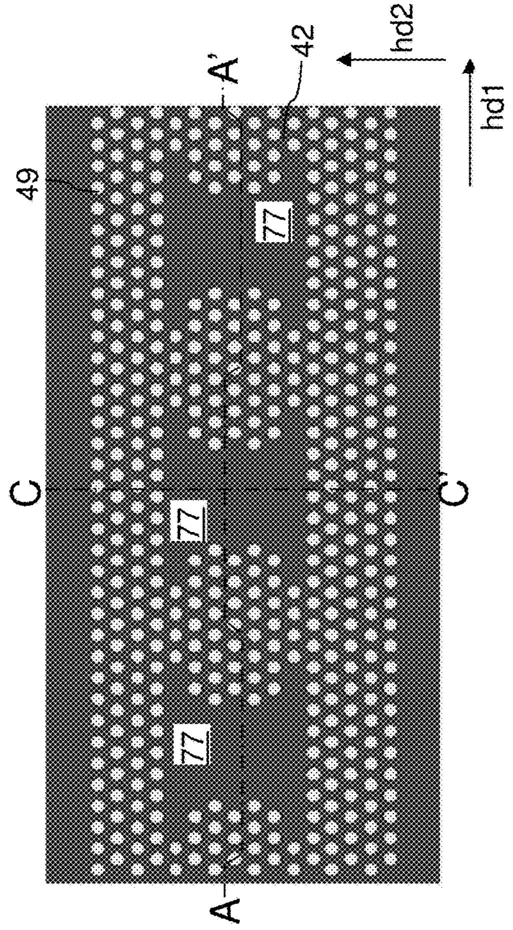
FIG. 10B is a horizontal cross-sectional view of the second exemplary structure along the vertical plane B-B' of FIG. 10A. The vertical plane A-A' is the plane of the vertical cross-section of FIG. 10A.
Figure 10A:
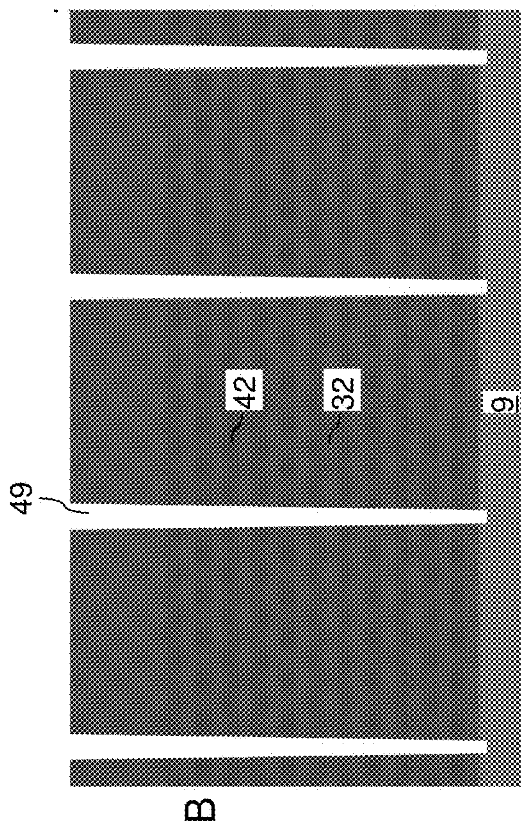
FIG. 10A is a vertical cross-sectional view of a second exemplary structure after formation of memory openings according to a second embodiment of the present disclosure.
Figure 10C:
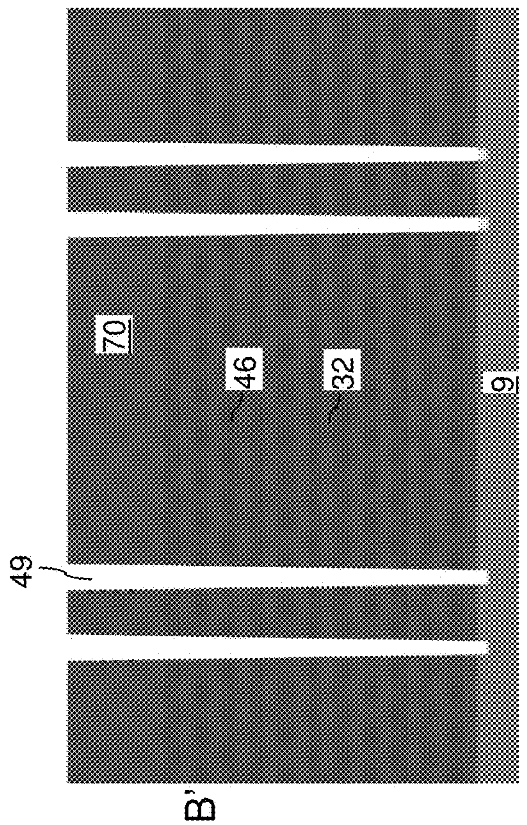
FIG. 10C is a vertical cross-sectional view of the second exemplary structure along the vertical plane C-C' of FIG. 10B.

Referring to FIGS. 10A-10C, a second exemplary structure according to a second embodiment of the present disclosure can be derived from the first exemplary structure illustrated in FIGS. 2A-2C by modifying the pattern of the memory openings 49. The pattern of the memory openings may comprise multiple rows of memory openings 49 that are arranged along a first horizontal direction hd1 and laterally spaced apart along a second horizontal direction hd2. In one embodiment, the memory openings 49 may be arranged to laterally surround a plurality of discrete regions 77 that are free of any memory opening 49. In one embodiment, each discrete region 77 may have an area having a lateral dimension that is in a range from 2-10 times the center-to-center distance between neighboring pairs of memory openings 49. In one embodiment, strip regions that are free of memory openings 49 and laterally extending along the first horizontal direction hd2 may be provided between neighboring clusters of memory openings 49 in adjacent memory blocks.

Figure 11B:
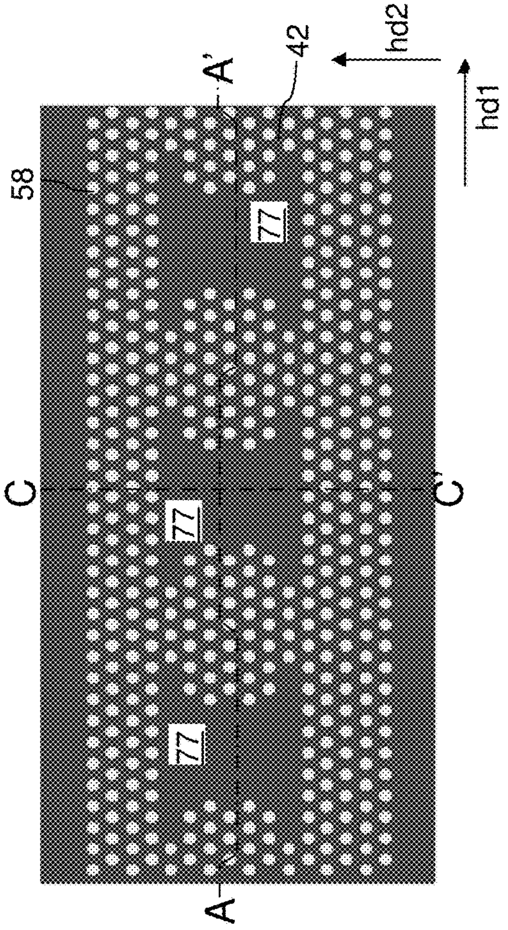
FIG. 11B is a horizontal cross-sectional view of the second exemplary structure along the vertical plane B-B' of FIG. 11A. The vertical plane A-A' is the plane of the vertical cross-section of FIG. 11A.
Figure 11C:
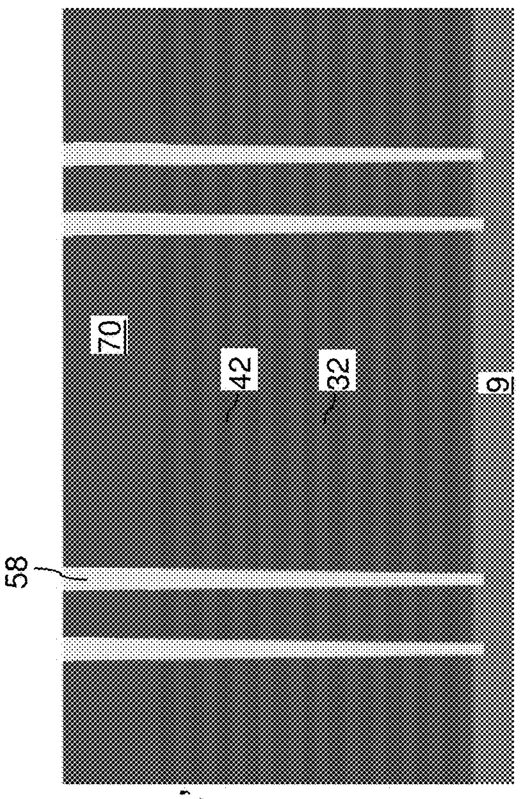
FIG. 11C is a vertical cross-sectional view of the second exemplary structure along the vertical plane C-C' of FIG. 11B.
Figure 11A:
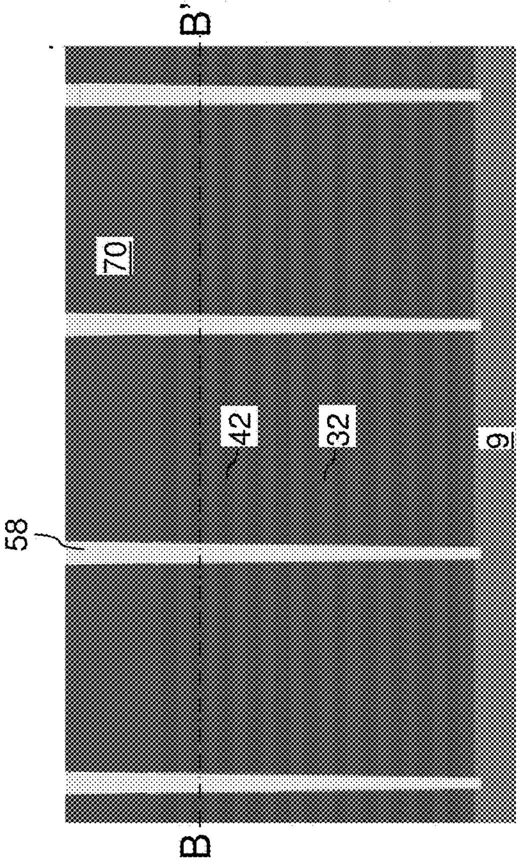
FIG. 11A is a vertical cross-sectional view of the second exemplary structure after formation of memory opening fill structures in the memory openings according to the second embodiment of the present disclosure.

Referring to FIGS. 11A-11C, the processing steps described with reference to FIGS. 4A-4F may be performed to form a memory opening fill structure 58 within each memory opening 49.

Figure 12B:
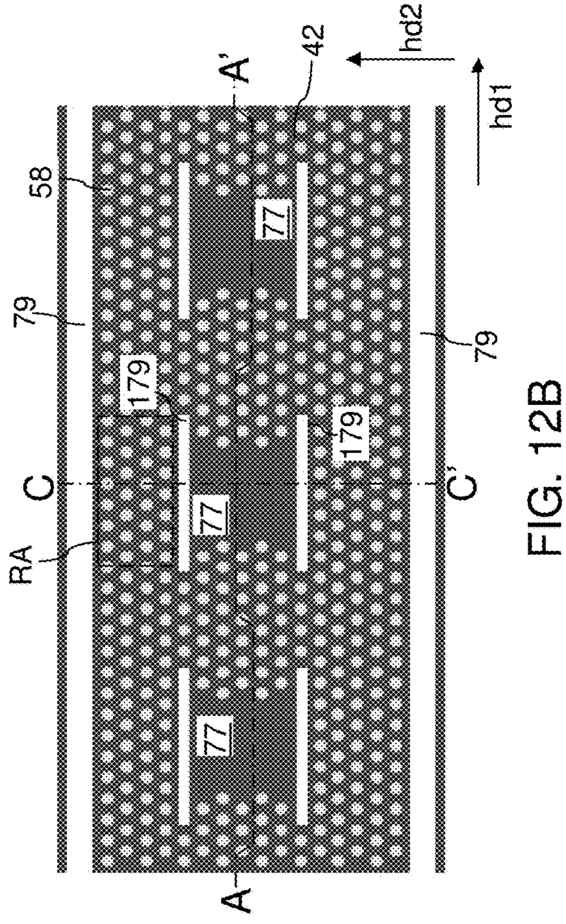
FIG. 12B is a horizontal cross-sectional view of the second exemplary structure along the vertical plane B-B' of FIG. 12A. The vertical plane A-A' is the plane of the vertical cross-section of FIG. 12A.
Figure 12A:
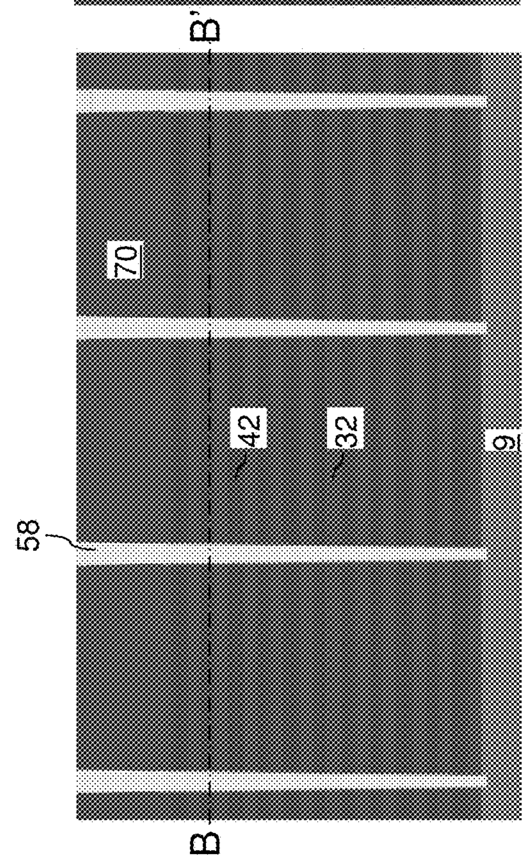
FIG. 12A is a vertical cross-sectional view of the second exemplary structure after formation of backside trenches and barrier trenches according to the second embodiment of the present disclosure.
Figure 12C:
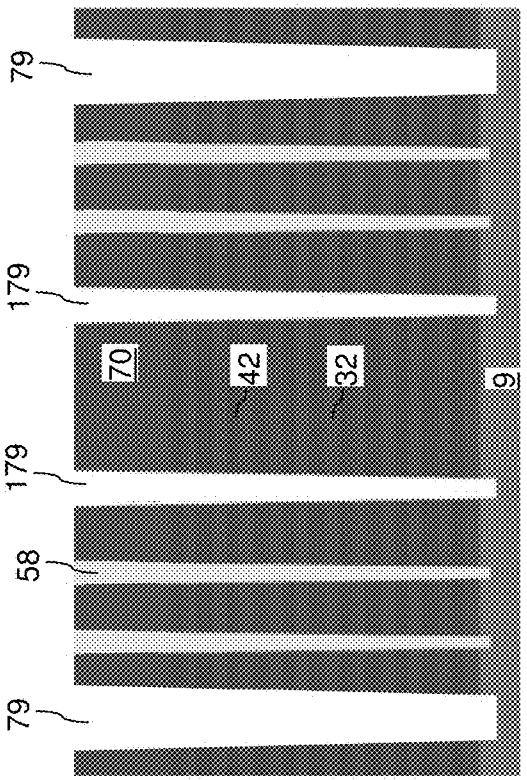
FIG. 12C is a vertical cross-sectional view of the second exemplary structure along the vertical plane C-C' of FIG. 12B.

Referring to FIGS. 12A-12C, a photoresist layer can be applied over the insulating cap layer 70, and can be lithographically patterned to form various openings therethrough. The openings in the photoresist layer comprise first slit-shaped openings that are formed in areas between neighboring clusters of memory openings 49 (e.g., between adjacent memory blocks) and laterally extending along the first horizontal direction hd1, and second slit-shaped openings located at peripheral portions of the discrete regions 77 (e.g., regions located in one of the memory blocks) and laterally extending along the first horizontal direction hd1. The openings in the photoresist layer do not have any areal overlap with the memory opening fill structures 58 in a plan view (such as a top-down view).

An anisotropic etch process can be performed to transfer the pattern of the openings in the photoresist layer through the alternating stack of insulating layers 32 and sacrificial material layers 42 and optionally into an upper portion of the semiconductor material layer 10. Backside trenches 79 are formed underneath the first slit-shaped openings in the photoresist layer, and barrier trenches 179 are formed underneath the second slit-shaped openings in the photoresist layer. The backside trenches 79 are formed between a respective cluster of memory openings 49 to separate laterally adjacent memory blocks, and laterally extends along the first horizontal direction hd1. The barrier trenches 179 are formed at peripheral areas of the discrete regions 77 in which the memory opening fill structures 58 are absent. The barrier trenches 179 may laterally extend along the first horizontal direction hd1. In one embodiment, a pair of barrier trenches 179 can be formed within one, a plurality and/or each of the discrete regions 77 that are free of memory opening fill structures 58. Each pair of barrier trenches 179 may be laterally spaced apart along the second horizontal direction hd2.

The barrier trenches 179 may have a first width along the second horizontal direction hd2, which may be in a range from 20 nm to 200 nm, although lesser and greater first widths may also be employed. The backside trenches 79 may have a second width along the second horizontal direction hd2, which may be in a range from 40 nm to 600 nm, although lesser and greater second widths may also be employed. In one embodiment, the second width may be greater than the first width, and may be in a range from twice the first width to 6 times the first width. The lateral extent of each barrier trench 179 along the first horizontal direction hd1 may be about the same as the lateral extent of a discrete region 77 that is free of memory opening fill structures 58. The lateral extent of each backside trench 79 along the first horizontal direction hd1 may be greater than the lateral extent of a discrete region 77 that is free of memory opening fill structures 58, and may be greater than the total lateral extent of a plurality of discrete regions 77 that are arranged along the first horizontal direction hd1.

In one embodiment, a subset of the memory opening fill structures 58 may be located within a rectangular area RA having a lateral extent along the first horizontal direction hd1 that is the same as the lateral extent of a pair of barrier trenches 179 along the first horizontal direction hd1, and having a lateral extent along the second horizontal direction hd2 that is the same as the lateral distance between a proximal one of the pair of barrier trenches 179 and a most proximal backside trench 79.

In an alternative embodiment, the backside trenches 79 may be formed at a subsequent processing step after formation of the laterally-extending cavity.

Figures 13A, 13B, 13C:
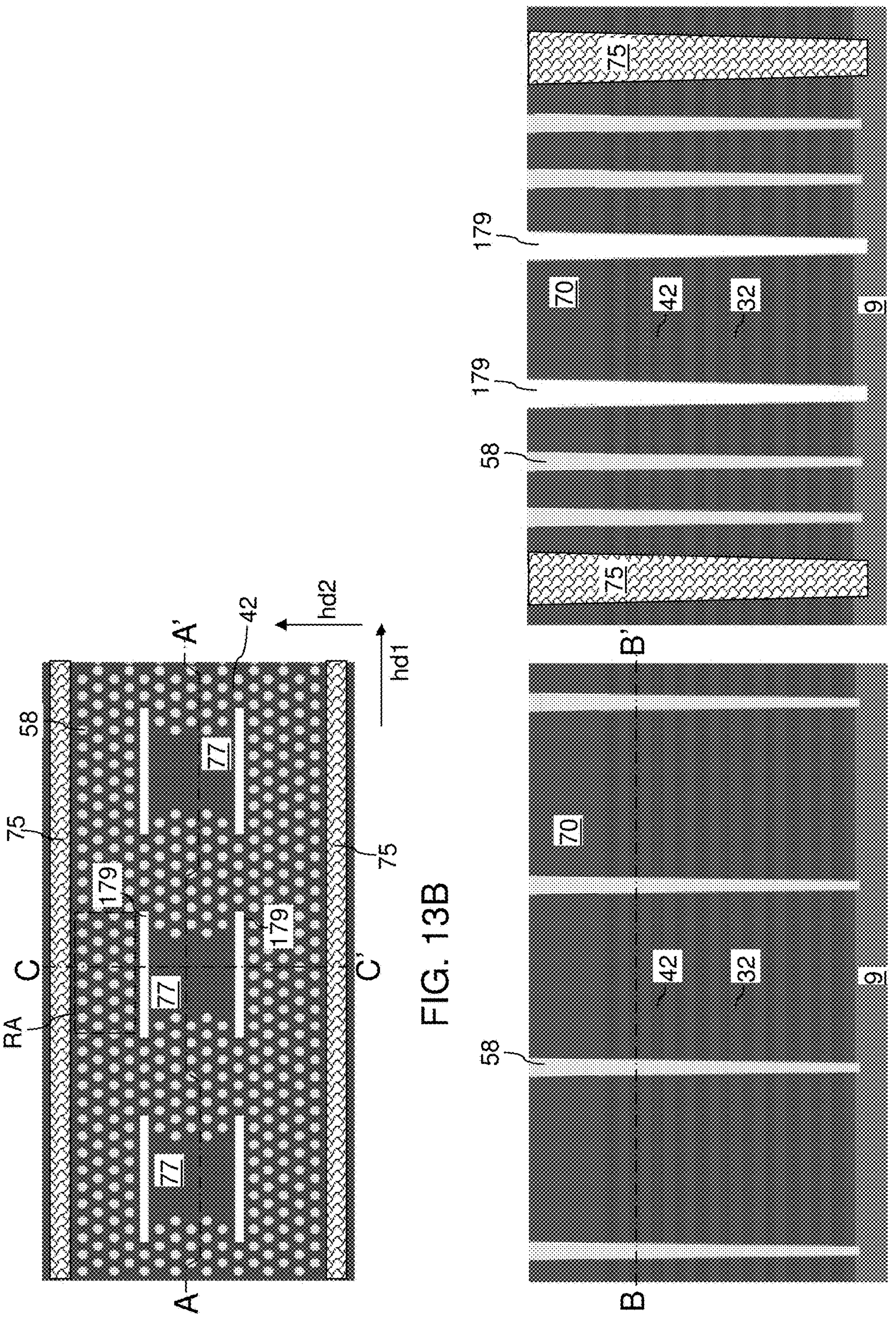
FIG. 13A is a vertical cross-sectional view of the second exemplary structure after formation of sacrificial backside trench fill structures according to the second embodiment of the present disclosure.
FIG. 13B is a horizontal cross-sectional view of the second exemplary structure along the vertical plane B-B' of FIG. 13A. The vertical plane A-A' is the plane of the vertical cross-section of FIG. 13A.
FIG. 13C is a vertical cross-sectional view of the second exemplary structure along the vertical plane C-C' of FIG. 13B.

Referring to FIGS. 13A-13C, a sacrificial trench fill material can be deposited in the backside trenches 79 and the barrier trenches 179. The sacrificial trench fill material may comprise a semiconductor material, such as amorphous silicon, polysilicon, or a silicon-germanium alloy, a carbon-based material, such as amorphous carbon or diamond-like carbon, an organosilicate glass, or a polymer material. In case the sacrificial trench fill material comprises a semiconductor material, a sacrificial dielectric liner (such as a silicon oxide liner, not illustrated) may be formed on the physically exposed surfaces of the semiconductor material layer at the bottom of each backside trench 79, for example, by performing an oxidation process. Excess portions of the sacrificial trench fill material can be removed from above the horizontal plane including the top surface of the insulating cap layer 70. Each remaining portion of the sacrificial trench fill material filling a respective backside trench 79 constitutes a sacrificial backside trench fill structure 75. Each remaining portion of the sacrificial trench fill material filling a respective barrier trench 179 constitutes a sacrificial barrier trench fill structure.

A photoresist layer (not shown) can be applied over the insulating cap layer 70, and can be lithographically patterned to form openings over each of the sacrificial barrier trench fill structures. A selective etch process that etches the material of the sacrificial barrier trench fill structures can be performed to remove the sacrificial barrier trench fill structures without removing the alternating stack of the insulating layers 32 and the sacrificial material layers 42, the insulating cap layer 70, or the semiconductor material layer 9. Voids are formed within the barrier trenches 179. The photoresist layer can be subsequently removed, for example, by ashing.

Figure 14B:
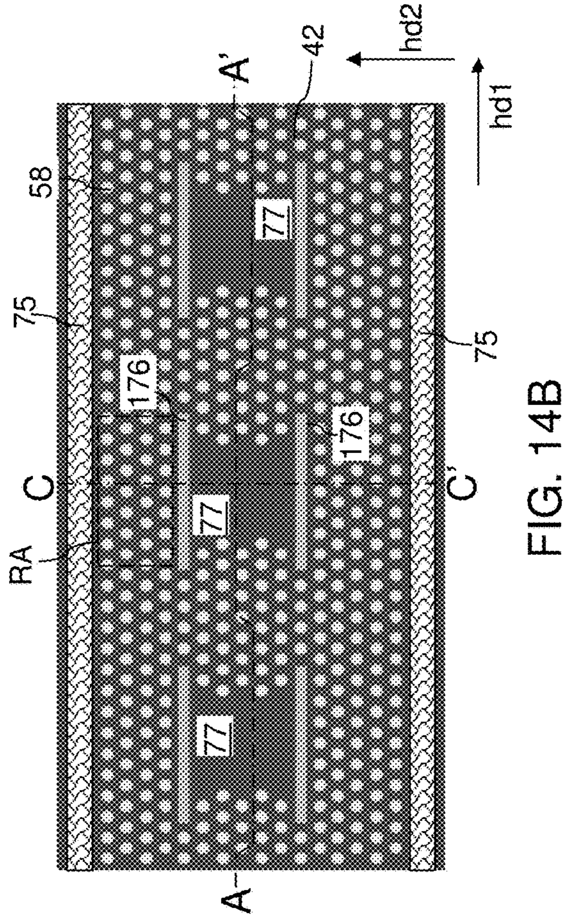
FIG. 14B is a horizontal cross-sectional view of the second exemplary structure along the vertical plane B-B' of FIG. 14A. The vertical plane A-A' is the plane of the vertical cross-section of FIG. 14A.
Figure 14A:
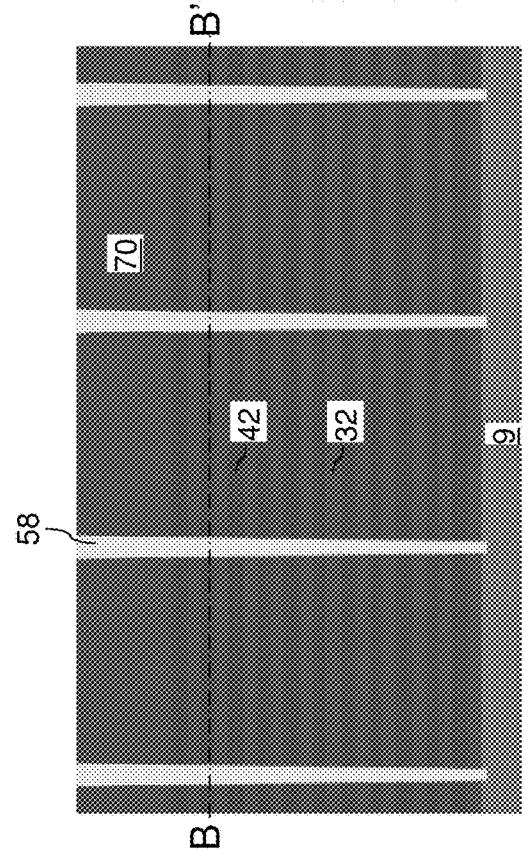
FIG. 14A is a vertical cross-sectional view of the second exemplary structure after formation of dielectric barrier structures according to the second embodiment of the present disclosure.
Figure 14C:
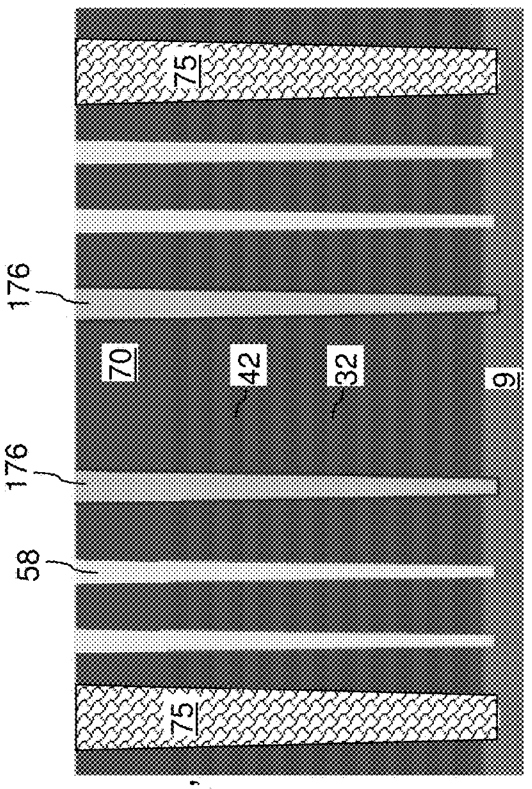
FIG. 14C is a vertical cross-sectional view of the second exemplary structure along the vertical plane C-C' of FIG. 14B.

Referring to FIGS. 14A-14C, a dielectric fill material that is different from the material of the sacrificial material layers 42 can be deposited in the barrier trenches 179 and over the insulating cap layer 70. The dielectric fill material may comprise a silicon oxide material (such as undoped silicate glass or a doped silicate glass) and/or a dielectric metal oxide material (such as aluminum oxide, hafnium oxide, tantalum oxide, etc.). Excess portions of the dielectric fill material overlying the horizontal plane including the top surface of the insulating cap layer 70 can be removed by a planarization process, which may employ a recess etch process and/or a chemical mechanical polishing process. Each remaining portion of the dielectric fill material filling a respective barrier trench 179 comprises a dielectric barrier structure 176. Each dielectric barrier structure 176 vertically extends from the top surface of the insulating cap layer 70 to the semiconductor material layer 9.

A pair of dielectric barrier structures 176 can be formed at peripheral portions of one, a plurality or each of the discrete regions 77 located between a respective neighboring pair of sacrificial backside trench fill structures 75 and free of memory opening fill structures 58. Each pair of dielectric barrier structures 176 can be formed through the alternating stack (32, 42). Each pair of dielectric barrier structures 176 can be laterally spaced from the pair of backside trench fill structures (74, 76), and can be in direct contact with each insulating layer 32 within the alternating stack (32, 42). In one embodiment, interfaces between the alternating stack (32, 42) and each pair of dielectric barrier structures 176 may laterally extend along the first horizontal direction hd1. In one embodiment, each pair of dielectric barrier structures 176 may laterally extend along the first horizontal direction hd1, and is laterally spaced from each other along a second horizontal direction hd2 that is perpendicular to the first horizontal direction hd1.

Figure 15B:
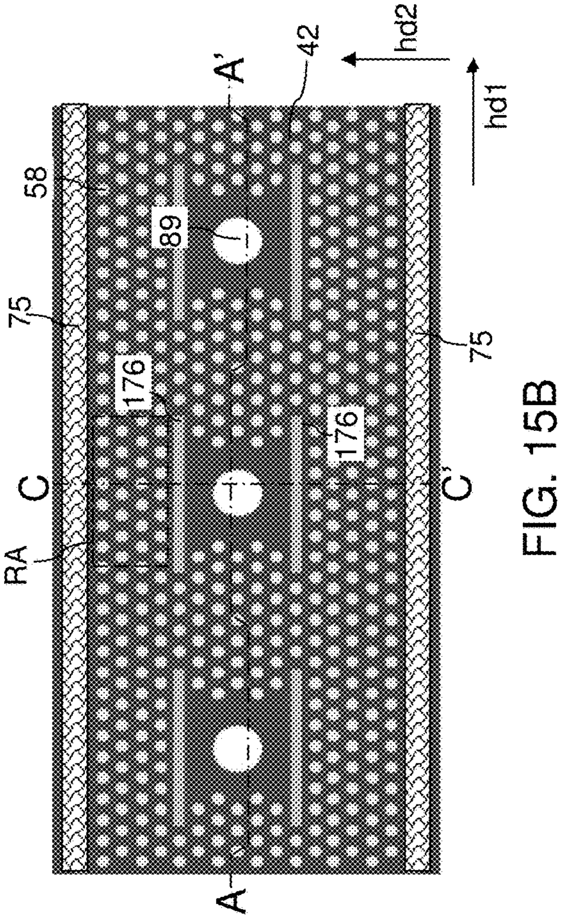
FIG. 15B is a horizontal cross-sectional view of the second exemplary structure along the vertical plane B-B' of FIG. 15A. The vertical plane A-A' is the plane of the vertical cross-section of FIG. 15A.
Figure 15A:
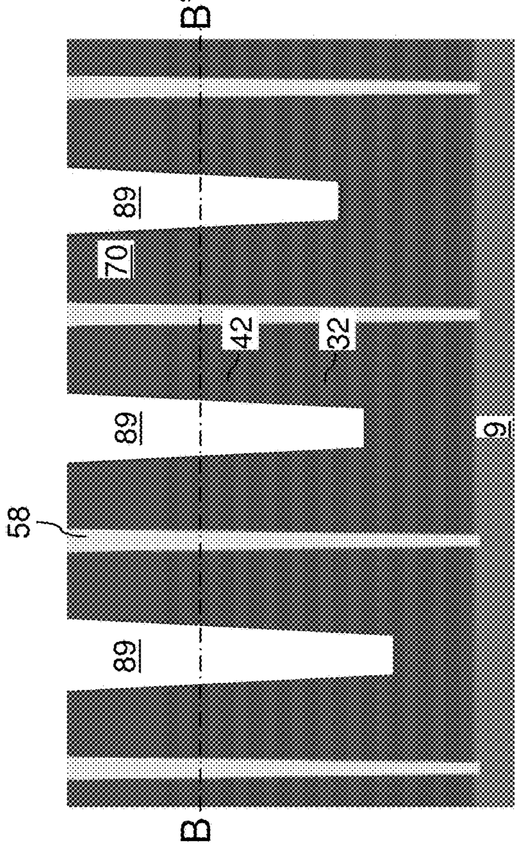
FIG. 15A is a vertical cross-sectional view of the second exemplary structure after formation of contact via openings according to the second embodiment of the present disclosure.
Figure 15C:
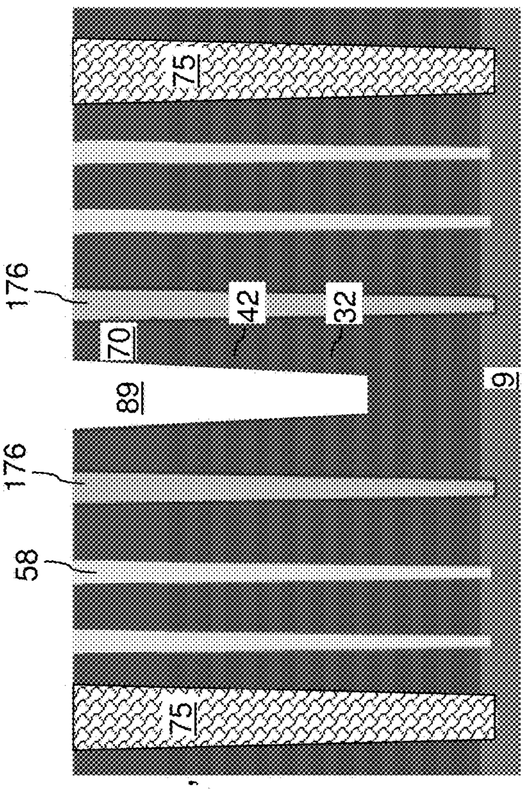
FIG. 15C is a vertical cross-sectional view of the second exemplary structure along the vertical plane C-C' of FIG. 15B.

Referring to FIGS. 15A-15C, contact via openings 89 can be formed within the discrete regions 77 that are free of memory opening fill structures between a respective pair of dielectric barrier structures 176. Each of the contact via openings 89 can vertically extend through the insulating cap layer 70 and optionally through a respective subset of the sacrificial material layers 42 and optionally through a respective subset of the insulating layers 32 such that a top surface of a selected sacrificial material layer 42 is physically exposed at the bottom of each contact via opening 89. In one embodiment, the contact via openings 89 may have different depths from each other, and each sacrificial material layer 42 can be physically exposed to a respective overlying contact via opening 49.

The contact via openings 89 having different depths may be formed employing a plurality of masked anisotropic etch processes, as described with respect to the first embodiment. Some contact via openings 89 may vertically extend through a respective subset of the sacrificial material layers 42. For each contact via opening 89, a most proximal pair of dielectric barrier structures 176 is more proximal to the contact via opening 89 than a most proximal pair of sacrificial backside trench fill structures 75 are to the contact via opening 89.

Figures 16A, 16B, 16C:
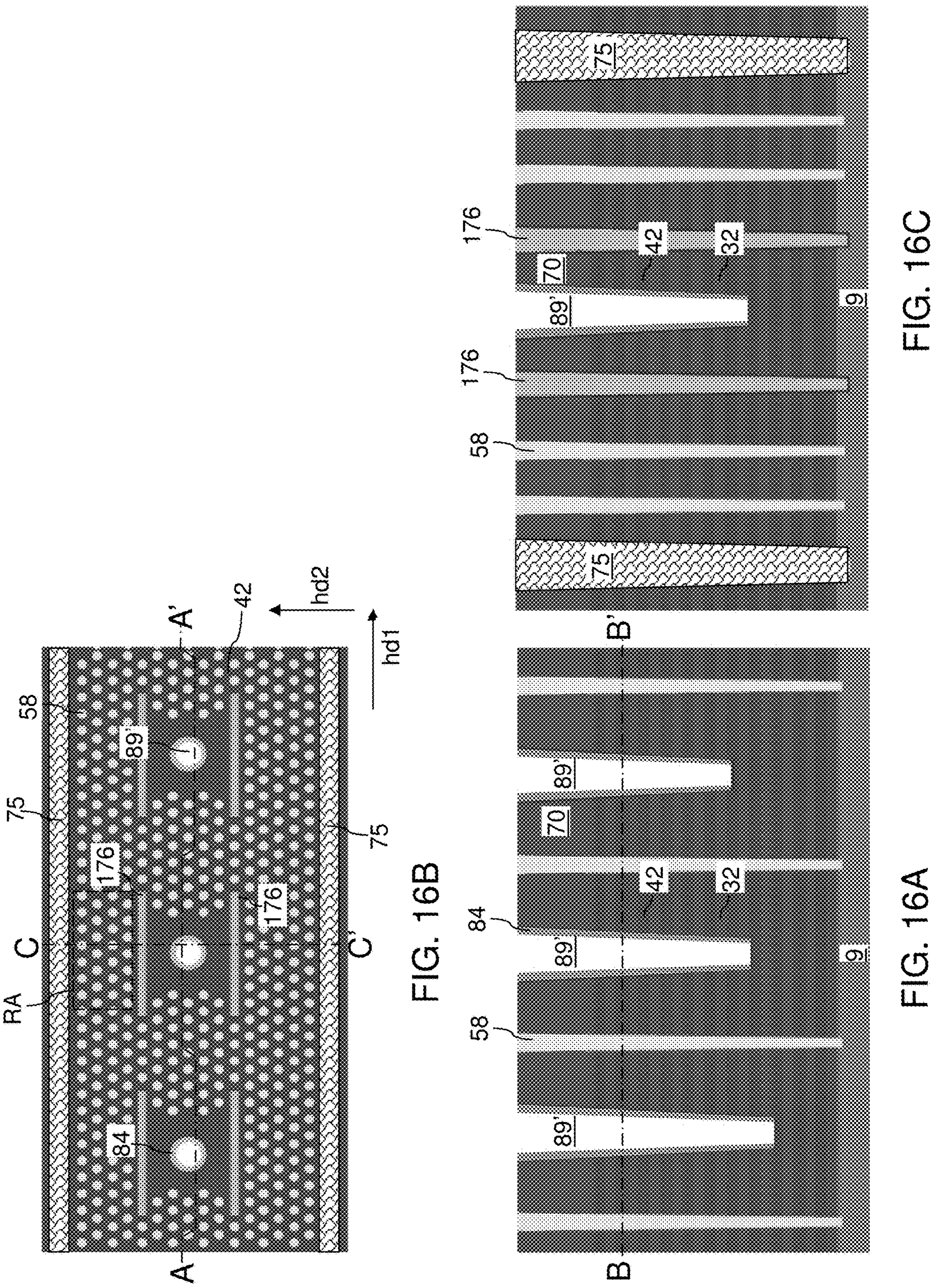
FIG. 16A is a vertical cross-sectional view of the second exemplary structure after formation of dielectric contact via liners according to the second embodiment of the present disclosure.
FIG. 16B is a horizontal cross-sectional view of the second exemplary structure along the vertical plane B-B' of FIG. 16A. The vertical plane A-A' is the plane of the vertical cross-section of FIG. 16A.
FIG. 16C is a vertical cross-sectional view of the second exemplary structure along the vertical plane C-C' of FIG. 16B.

Referring to FIGS. 16A-16C, a dielectric material, such as silicon oxide can be conformally deposited in the contact via openings 89 and over the insulating cap layer 70 to form a conformal dielectric material layer. An anisotropic etch process can be performed to remove horizontally-extending portions of the conformal dielectric material layer. Each remaining tubular portion of the conformal dielectric material layer constitutes a tubular dielectric spacer 84. Each tubular dielectric spacer 84 is a dielectric contact via liner that contacts a sidewall of a respective one of the contact via openings 89. A tubular dielectric liner 84 can be formed at a peripheral portion of each contact via opening 89. A contact via cavity 89' can be present within each unfilled volume of the contact via openings 89.

Figure 17B:
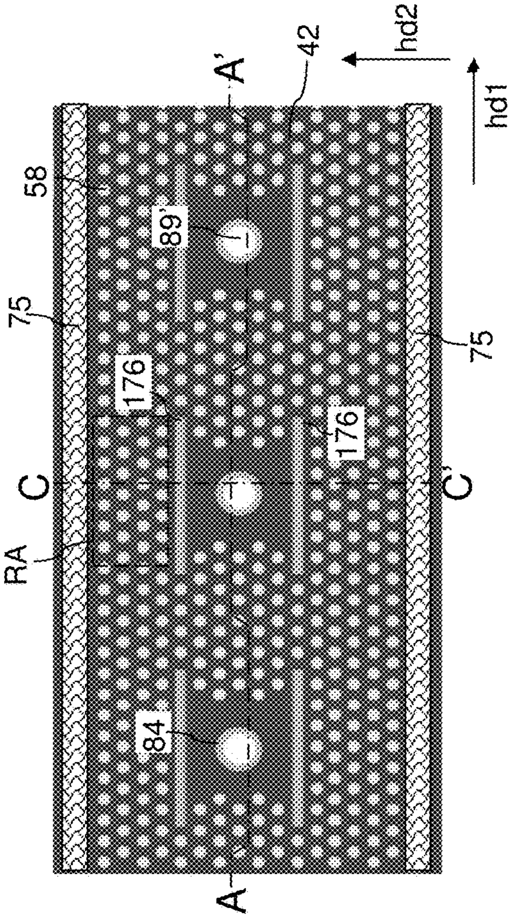
FIG. 17B is a horizontal cross-sectional view of the second exemplary structure along the vertical plane B-B' of FIG. 17A. The vertical plane A-A' is the plane of the vertical cross-section of FIG. 17A.
Figure 17A:
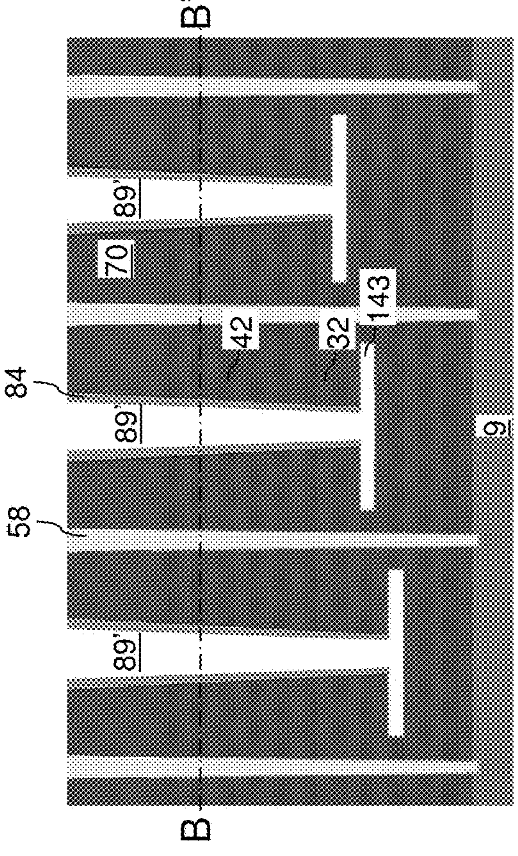
FIG. 17A is a vertical cross-sectional view of the second exemplary structure after formation of laterally-extending cavities according to the second embodiment of the present disclosure.
Figure 17C:
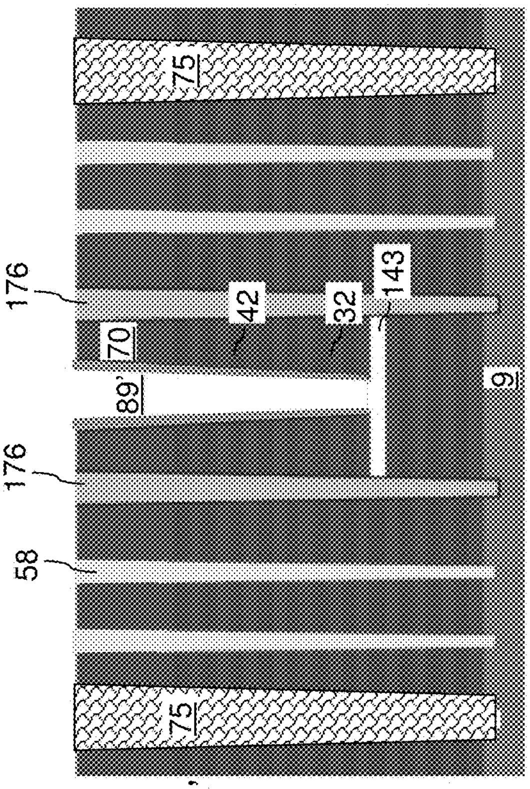
FIG. 17C is a vertical cross-sectional view of the second exemplary structure along the vertical plane C-C' of FIG. 17B.

Referring to FIGS. 17A-17C, an isotropic etch process can be performed to etch the material of the sacrificial material layers 42 selective to materials of the insulating layers 32, the dielectric barrier structures 176, the tubular dielectric liners 84, and the insulating cap layer 70. For example, if the sacrificial material layers 42 comprise silicon nitride, a wet etch process employing hot phosphoric acid may be performed to remove portions of the sacrificial material layers 42 that are proximal to the bottom surfaces of the contact via cavities 89'. A laterally-extending cavity 143 can be formed within each void that is formed by removal of a portion of a sacrificial material layer 42. Generally, the isotropic etch process that etches the material of the sacrificial material layers 42 selective to the materials of the dielectric barrier structures 176, the tubular dielectric liner 84, and the insulating cap layer 70 can be performed after formation of the tubular dielectric liners 84. The dielectric barrier structures 176 can be employed to limit the lateral extent of the laterally-extending cavities 143 along the second horizontal direction hd2. The laterally-extending cavities 143 can be formed underneath the contact via cavities 89' such that sidewalls of a respective pair of dielectric barrier structures 176 are physically exposed around each laterally-extending cavity 143. In one embodiment, at least one laterally-extending cavity 143 can be formed at each level of the sacrificial material layers 42.

Figure 18C:
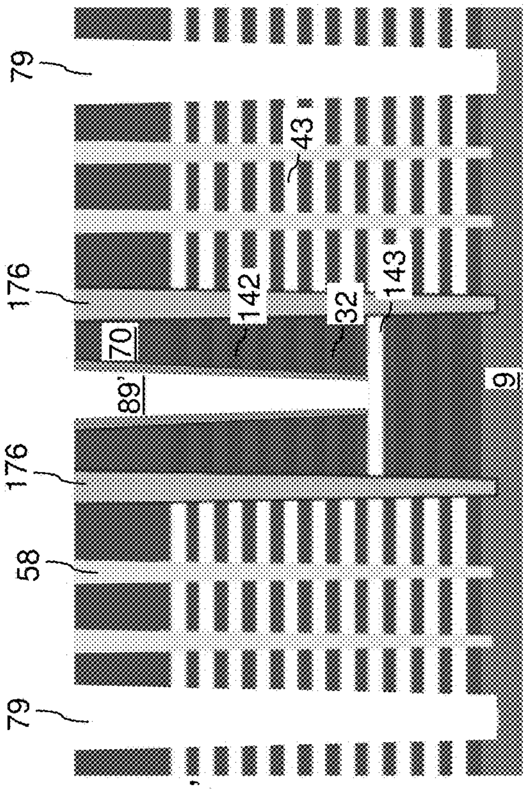
FIG. 18C is a vertical cross-sectional view of the second exemplary structure along the vertical plane C-C' of FIG. 18B.
Figure 18B:
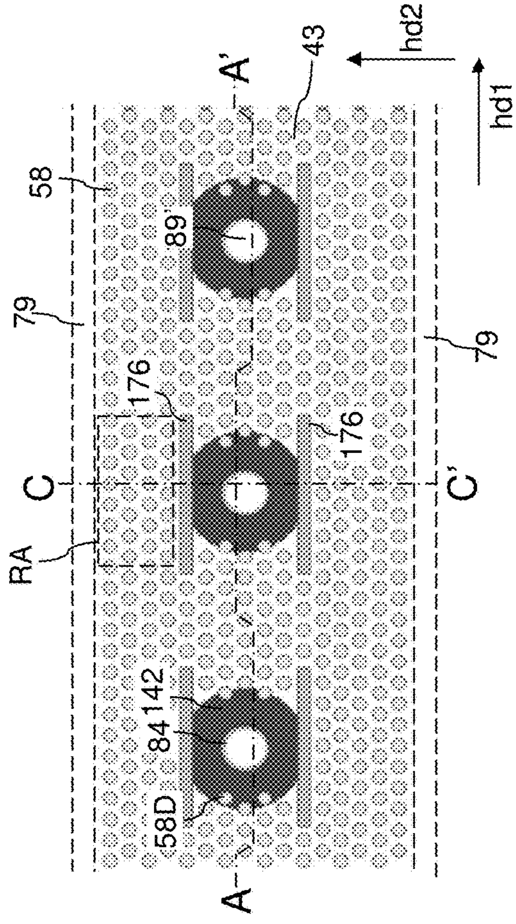
FIG. 18B is a horizontal cross-sectional view of the second exemplary structure along the vertical plane B-B' of FIG. 18A. The vertical plane A-A' is the plane of the vertical cross-section of FIG. 18A.
Figure 18A:
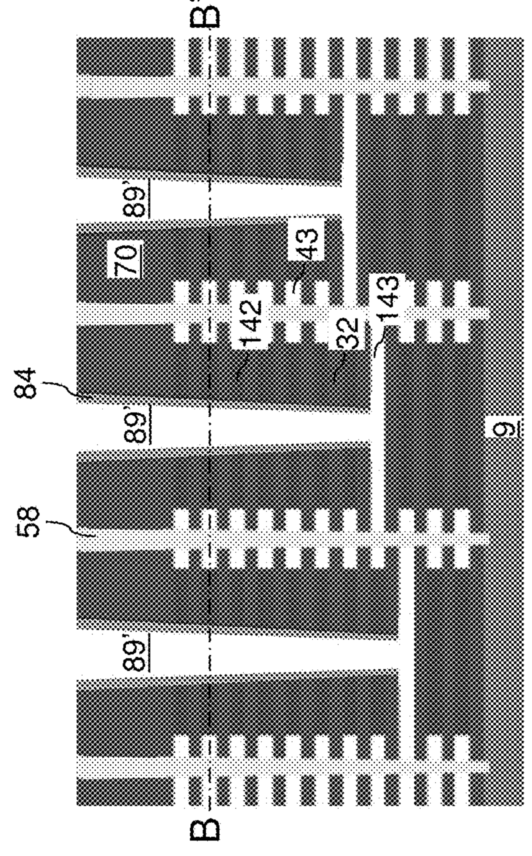
FIG. 18A is a vertical cross-sectional view of the second exemplary structure after removal of the sacrificial backside trench fill structures and formation of backside recesses according to the second embodiment of the present disclosure.

Referring to FIGS. 18A-18C, the sacrificial backside trench fill structures 75 can be removed from inside the backside trenches 79 selective to materials of the alternating stack (32, 42), the insulating cap layer 70, and the tubular dielectric liners 84. For example, if the sacrificial backside trench fill structures 75 comprise a silicon material, a wet etch process employing hot trimethyl-2 hydroxyethyl ammonium hydroxide ("hot TMY") or tetramethyl ammonium hydroxide (TMAH) can be employed to remove the silicon material of the sacrificial backside trench fill structures 75. In this case, sacrificial dielectric liners (not shown) may be employed as etch stop structures, and may be subsequently removed. Alternatively, the backside trenches 79 may be formed by photolithography and etching through the alternating stack (32, 42) at this step in the process rather than at the step shown in FIGS. 12A-12C.

Generally, the backside trenches 79 may be formed through the alternating stack (32, 42) prior to or after formation of the laterally-extending cavities 143. An isotropic etch process can be performed to isotropically recess the sacrificial material layers 42 from around the backside trenches 79. For example, an etchant that selectively etches the material of the sacrificial material layers 42 with respect to the materials of the insulating layers 32, the insulating cap layer 70, the tubular dielectric liners 84, the semiconductor material layer 9, and the material of the outermost layers of the memory films 50 can be introduced into the backside trenches 79, for example, during the isotropic etch process. Backside recesses 43 are formed in volumes from which the sacrificial material layers 42 are removed.

The isotropic etch process may comprise a wet etch process employing a wet etch solution, and/or may comprise a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The memory opening fill structures 58 provide structural support while the backside recesses 43 are present within volumes previously occupied by the sacrificial material layers 42.

The backside recesses 43 grow laterally from around the backside trenches 79 until the backside recesses 43 merge into continuous backside recesses 43 that continuously extend between neighboring pairs of backside trenches 79. Further, the laterally-extending cavities 143 laterally extend until each of the laterally-extending cavities 143 merge with a respective backside recess 43. According to an aspect of the present disclosure, the duration of the isotropic etch process can be selected such that unetched portions of the sacrificial material layers 42 remain between each neighboring pair of dielectric barrier structures 176. Generally, the backside recesses 43 are formed in volumes from which portions of the sacrificial material layers 42 are removed. Each laterally-extending cavity 143 can be connected to at least one backside recess 43 to form a continuous void.

Remaining portions of the sacrificial material layers 42 after formation of the backside recesses 43 comprise dielectric material portions that laterally surround a respective contact via opening 89. Each remaining portion of the sacrificial material layers 42 is herein referred to as a dielectric material plate 142. Each dielectric material plate 142 laterally surrounding a contact via cavity 89' comprise an opening therethrough, and overlies a respective laterally-extending cavity 143. Each dielectric material plate 142 that underlies a laterally-extending cavity 143 may be free of any opening therethrough. A vertical stack of dielectric material plates 142 can be formed between each neighboring pair of dielectric barrier structures 176. The dielectric material plates with a vertical stack of dielectric material plates 142 may be located at each level of the sacrificial material layers 42 as provided at the processing steps described with reference to FIGS. 10A-10C except one level, at which a laterally-extending cavity 143 connected to an overlying contact via cavity 89' is present. Each backside recess 43 and each laterally-extending cavity 143 can be vertically bounded by a top surface of an underlying insulating layer 32 and a bottom surface of an overlying insulating layer 32 or the insulating cap layer 70. In one embodiment, each backside recess 43 and each laterally-extending cavity 143 can have a uniform height throughout.

Optionally, some of the memory opening fill structures extend through the dielectric material plates 142. Such memory opening fill structures may comprise dummy memory opening fill structures 58D which are not used to store data. Instead, they may function as support pillars.

Figure 19B:
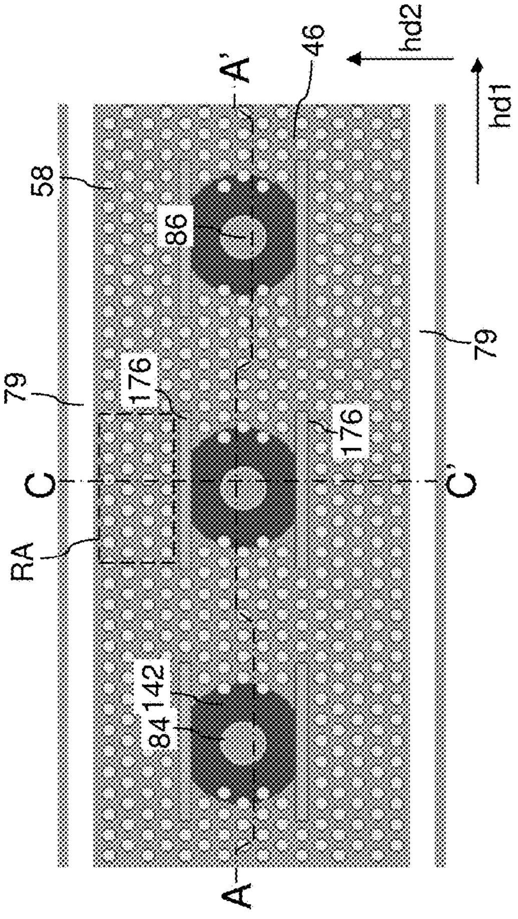
FIG. 19B is a horizontal cross-sectional view of the second exemplary structure along the vertical plane B-B' of FIG. 19A. The vertical plane A-A' is the plane of the vertical cross-section of FIG. 19A.
Figure 19A:
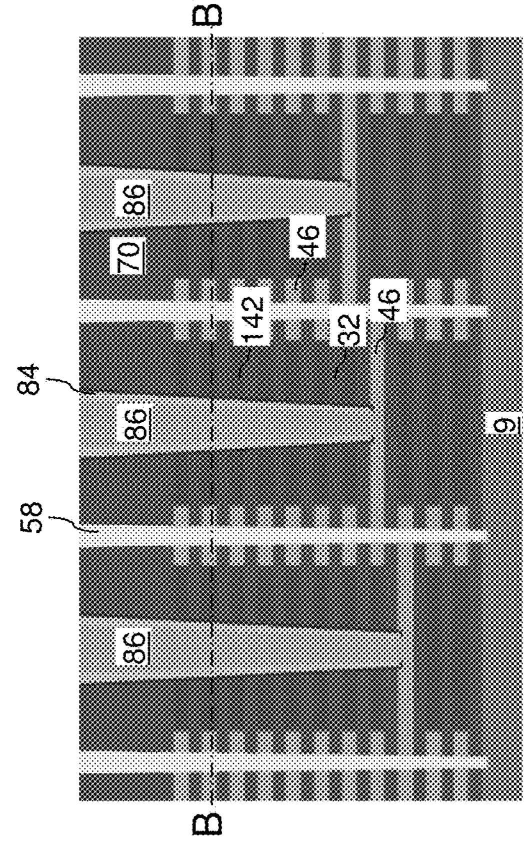
FIG. 19A is a vertical cross-sectional view of the second exemplary structure after formation of integrated layer-and-contact structures according to the second embodiment of the present disclosure.
Figure 19C:
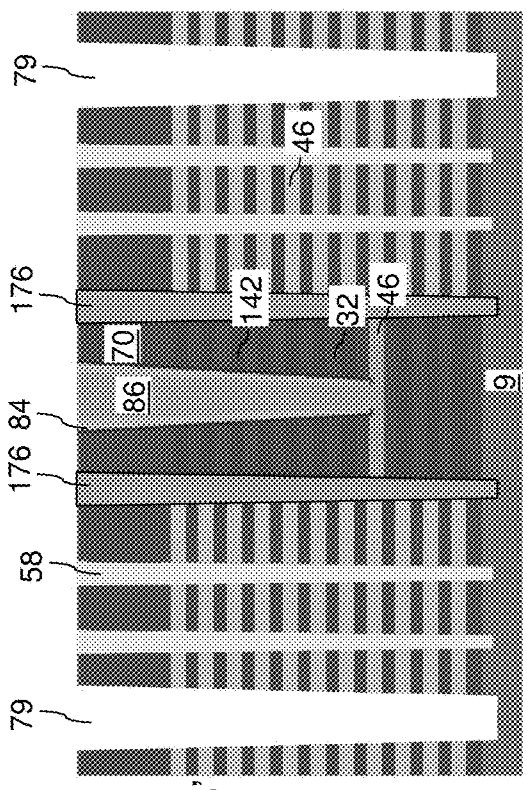
FIG. 19C is a vertical cross-sectional view of the second exemplary structure along the vertical plane C-C' of FIG. 19B.

Referring to FIGS. 19A-19C, at least one electrically conductive material, such as a combination of a metallic barrier liner material and a metallic fill material, may be conformally deposited in the backside recesses 43, the laterally-extending cavities 143 and in the contact via cavities 89' laterally surrounded by the tubular dielectric liners 84. The metallic barrier liner material may comprise a conductive metallic compound material such as TiN. TaN, WN, MON, TiC, TaC, WC, alloys thereof, or a combination thereof. The metallic fill material may comprise W. Ti, Ta, Mo, Co, Ru, Cu, alloys thereof, or combinations thereof. The total thickness of the at least one conductive material is greater than one half of the height of the backside recesses 43 and the laterally-extending cavities 143, and is greater than one half of the width of the via cavities. Excess portions of the at least one conductive material can be removed from above the horizontal plane including the top surface of the insulating cap layer 70 by performing a planarization process, which may comprise a recess etch process and/or a chemical mechanical polishing process.

Each remaining portion of the at least one conductive material that fills a respective combination of a backside recess 43, a laterally-extending cavity 143 and a contact via cavity 89' constitutes an integrated line-and-via structure (86, 46). Each integrated line-and-via structure (86, 46) can be formed in a continuous volume including a backside recess 43, a laterally-extending cavity 143 and a volume of a contact via cavity 89' (which is a volume within a contact via opening 89). Each integrated line-and-via structure (86, 46) comprises an electrically conductive layer 46 and further comprising a metallic via portion 86 that is formed in a respective contact via opening 89. Portions of the electrically conductive material that are deposited in the backside trenches 79 or above the insulating cap layer 70 can be removed by performing an etch back process, which may comprise an isotropic etch process and/or an anisotropic etch process.

Generally, at least one electrically conductive material can be deposited in volumes of the backside recesses 43, the laterally-extending cavities 143 and unfilled volumes of the contact via openings 89. Portions of the electrically conductive material deposited in the volumes of the backside recesses 43 and the laterally-extending cavities 143 constitute electrically conductive layers 46, and portions of the electrically conductive material filling the contact via openings 89 constitutes metallic via portions 86. In one embodiment, each integrated line-and-via structure (86, 46) comprises a homogeneous metallic material portion that extends continuously from a volume within an electrically conductive layer 46 to a volume within the metallic via portion 86 without a material junction therein. In one embodiment, each metallic via portion 86 is laterally surrounded by a tubular dielectric liner 84, and each tubular dielectric liner 84 is laterally surrounded by each dielectric material plate 142 that overlie an electrically conductive layer 46 adjoined to the metallic via portion 86.

Each backside recess 43 can be connected to a respective contact via cavity 89' through the respective laterally-extending cavity 143 prior to deposition of the at least one electrically conductive material. As such, each contiguous combination of a backside recess 43, laterally-extending cavity 143 and a contact via cavity 89' can be filled with a respective integrated line-and-via structure (86, 46). In one embodiment, an annular bottom surface of the tubular dielectric liner 84 contacts an annular horizontal surface segment of a respective underlying electrically conductive layer 46. A vertical stack of dielectric material plates 142 can be located at levels of a subset of the electrically conductive layers 46 between each neighboring pair of dielectric barrier structures 176 that are spaced apart along the second horizontal direction hd2. The vertical stack of dielectric material plates 142 can contact each of the pair of dielectric barrier structures 176.

Figures 20A, 20B, 20C:
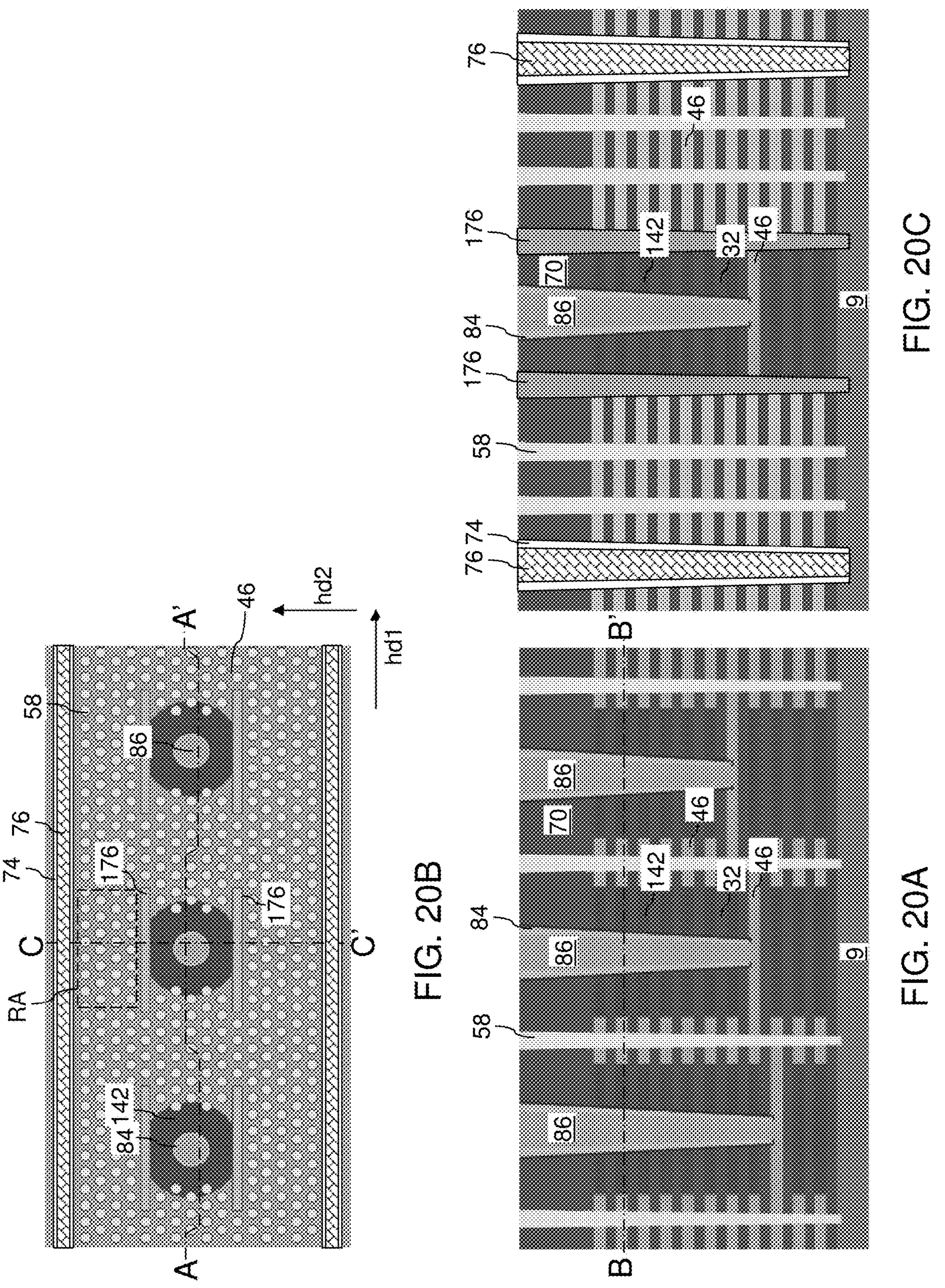
FIG. 20A is a vertical cross-sectional view of the second exemplary structure after formation of backside trench fill structures according to the second embodiment of the present disclosure.
FIG. 20B is a horizontal cross-sectional view of the second exemplary structure along the vertical plane B-B' of FIG. 20A. The vertical plane A-A' is the plane of the vertical cross-section of FIG. 20A.
FIG. 20C is a vertical cross-sectional view of the second exemplary structure along the vertical plane C-C' of FIG. 20B.

Referring to FIGS. 20A-20C, an insulating material layer can be formed in the backside trenches 79 and over the insulating cap layer 70 by a conformal deposition process. An anisotropic etch is performed to remove horizontal portions of the insulating material layer from above the insulating cap layer 70 and at the bottom of each backside trench 79. Each remaining portion of the insulating material layer constitutes an insulating spacer 74. A backside cavity can be present within a volume surrounded by each insulating spacer 74. A top surface of the semiconductor material layer 9 can be physically exposed at the bottom of each backside trench 79.

A backside contact via structure 76 can be formed within each backside cavity. Each contact via structure 76 can fill a respective backside cavity. The backside contact via structures 76 can be formed by depositing at least one conductive material in the backside cavities. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof. Excess portions of the at least one conductive material can be removed from above the horizontal plane including the top surface of the insulating cap layer 70 by a planarization process. The planarization process may comprise a recess etch process and/or a chemical mechanical polishing process. Each remaining portion of the at least one conductive material constitutes a backside contact via structure 76. A pair of backside trench fill structures (74, 76) can laterally contact each alternating stack (32, 46) of insulating layers 32 and electrically conductive layers 46. The pair of backside trench fill structures (74, 76) can be laterally spaced apart from each other by the alternating stack (32, 46).

Figure 20D:
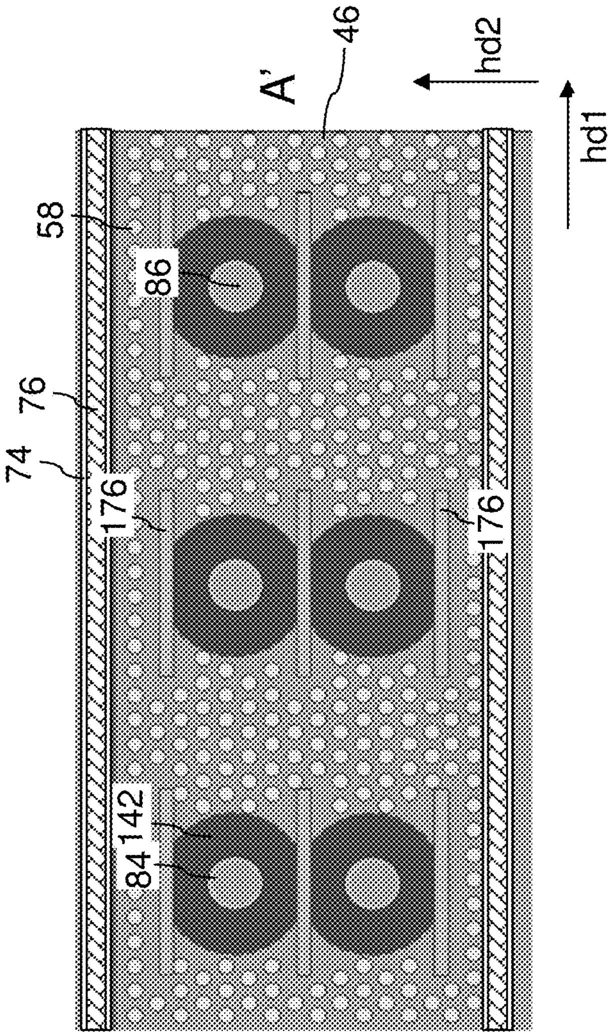
FIG. 20D is a horizontal cross-sectional view of an alternative embodiment of the second exemplary structure at the processing steps of FIGS. 20A-20C according to the second embodiment of the present disclosure.

Referring to FIG. 20D, an alternative embodiment of the second exemplary structure is illustrated at the processing steps of FIGS. 20A-20C. The alternative embodiment of the second exemplary structure can be derived from the second exemplary structure by rearranging positions of the dielectric barrier structures 176. In one embodiment, metallic via portions 86 between a neighboring pair of backside trench fill structures (74, 76) may be arranged as multiple rows (e.g., two rows) of metallic via portions 86 along the first horizontal direction hd1 instead of one row of metallic via portions 86 in each memory block.

Referring to FIGS. 10A-20D and according to various embodiments of the present disclosure, a semiconductor structure is provided, which comprises: an alternating stack (32, 46) of insulating layers 32 and electrically conductive layers 46; memory openings 49 vertically extending through the alternating stack (32, 46); memory opening fill structures 58 located in the memory openings 49 and comprising a respective vertical semiconductor channel 60 and a respective vertical stack of memory cells (such as portions of a memory material layer 54); a pair of backside trench fill structures (74, 76) laterally contacting the alternating stack (32, 46) and laterally spaced apart from each other by the alternating stack (32, 46); a pair of dielectric barrier structures 176 vertically extending through the alternating stack (32, 46); a vertical stack of dielectric material plates 142 located at levels of a subset of the electrically conductive layers 46 and contacting each of the pair of dielectric barrier structures 176; and an integrated line-and-via structure (86, 46) that is a unitary structure comprising a first electrically conductive layer 46 among the electrically conductive layers 46 and further comprising a metallic via portion 86 that vertically extends through each of the dielectric material plates 142 that overlie the first electrically conductive layer 46.

In one embodiment, the integrated line-and-via structure (86, 46) comprises a homogeneous metallic material portion that extends continuously from a volume within the first electrically conductive layer 46 to a volume within the metallic via portion 86 without a material junction therein.

In one embodiment, the metallic via portion 86 is laterally surrounded by a tubular dielectric liner 84; and the tubular dielectric liner 84 is laterally surrounded by each of the dielectric material plates 142 that overlie the first electrically conductive layer 46. In one embodiment, an annular bottom surface of the tubular dielectric liner 84 contacts an annular horizontal surface segment of the first electrically conductive layer 46.

In one embodiment, each of the pair of dielectric barrier structures 176 is laterally spaced from the pair of backside trench fill structures (74, 76), and is in direct contact with each insulating layer 32 within the alternating stack (32, 46). In one embodiment, interfaces between the alternating stack (32, 46) and the pair of dielectric barrier structures 176 laterally extend along a first horizontal direction hd1; and the pair of dielectric barrier structures 176 laterally extends along the first horizontal direction hd1, and is laterally spaced from each other along a second horizontal direction hd2 that is perpendicular to the first horizontal direction hd1.

In one embodiment, a subset of the memory opening fill structures 58 is located within a rectangular area RA having a lateral extent along a first horizontal direction hd1 that is the same as a lateral extent of the pair of dielectric barrier structures 176 along the first horizontal direction hd1, and having a lateral extent along a second horizontal direction hd2 that is the same as a lateral distance between a proximal one of the pair of dielectric barrier structures 176 and a proximal one of the pair of backside trench fill structures (74, 76).

Figure 21B:
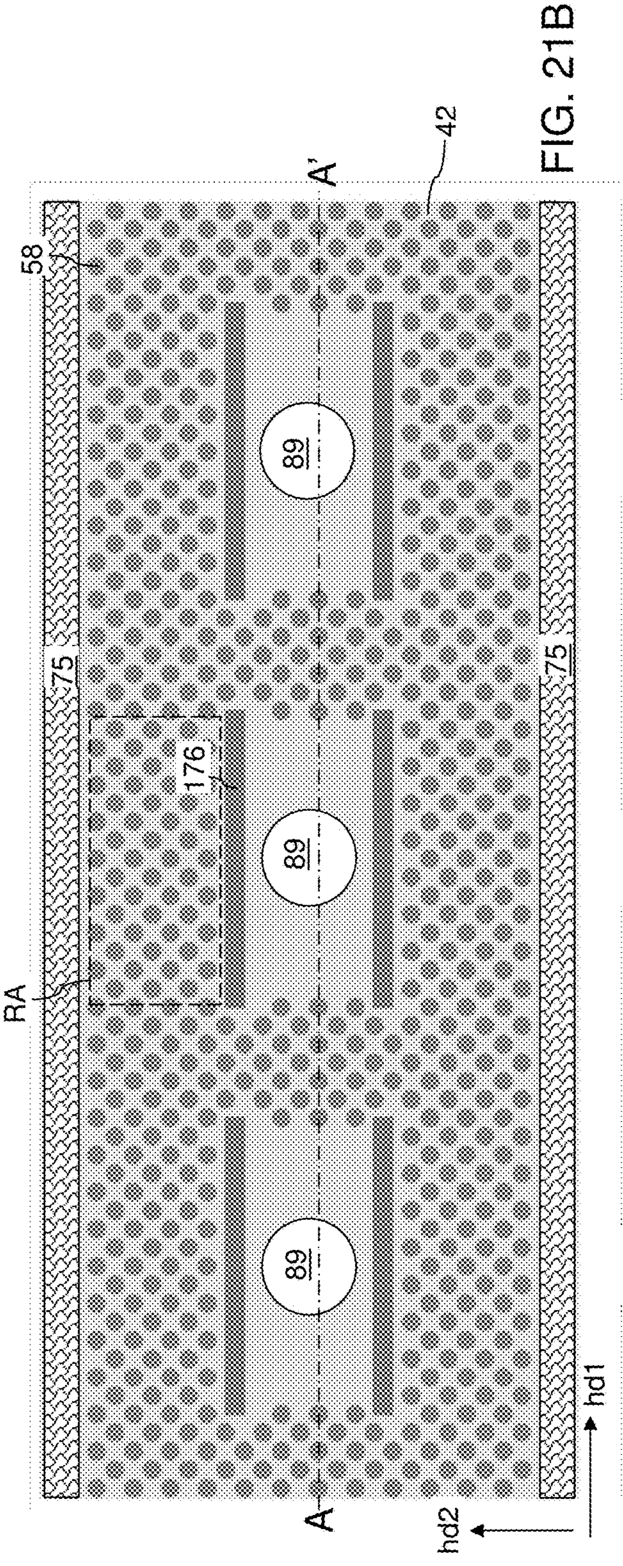
FIG. 21B is a horizontal cross-sectional view of the third exemplary structure along the vertical plane B-B' of FIG. 21A. The vertical plane A-A' is the plane of the vertical cross-section of FIG. 21A.
Figure 21A:
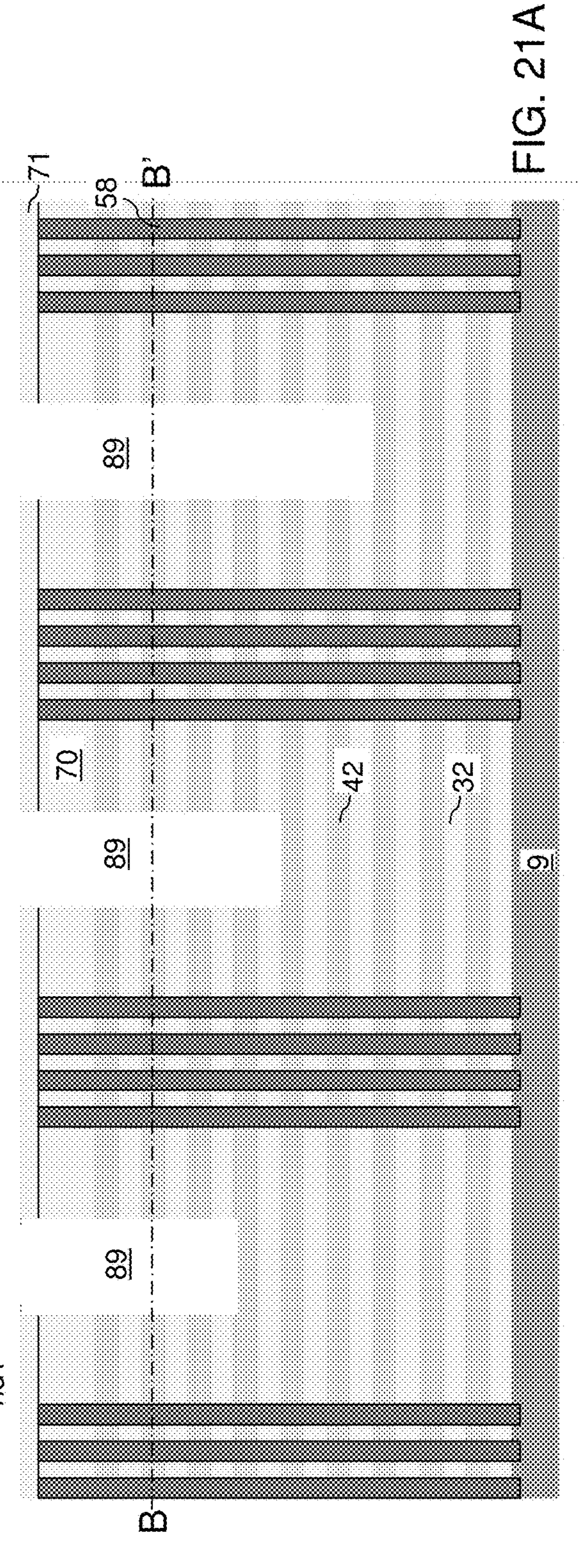
FIG. 21A is a vertical cross-sectional view of a third exemplary structure after formation of memory opening fill structures, an optional dielectric capping layer, backside trenches, and contact via openings according to a third embodiment of the present disclosure.

Referring to FIGS. 21A and 21B, a third exemplary structure according to a third embodiment of the present disclosure is illustrated. The third exemplary structure illustrated in FIGS. 21A and 21B may be the same as the second exemplary structure illustrated in FIGS. 15A-15C. Optionally, a dielectric capping layer 71 comprising a dielectric material may be formed above the insulating cap layer 70 prior to formation of the contact via openings 89. In this case, the contact via openings 89 can be formed through the dielectric capping layer 71, the insulating cap layer 70, and optionally a respective subset of the insulating layers 32 and sacrificial material layers 42. In an alternative embodiment, the backside trenches 79 may be formed at a later processing step, which may be, for example, after formation of the contact via openings 89.

Figures 22A, 22B:
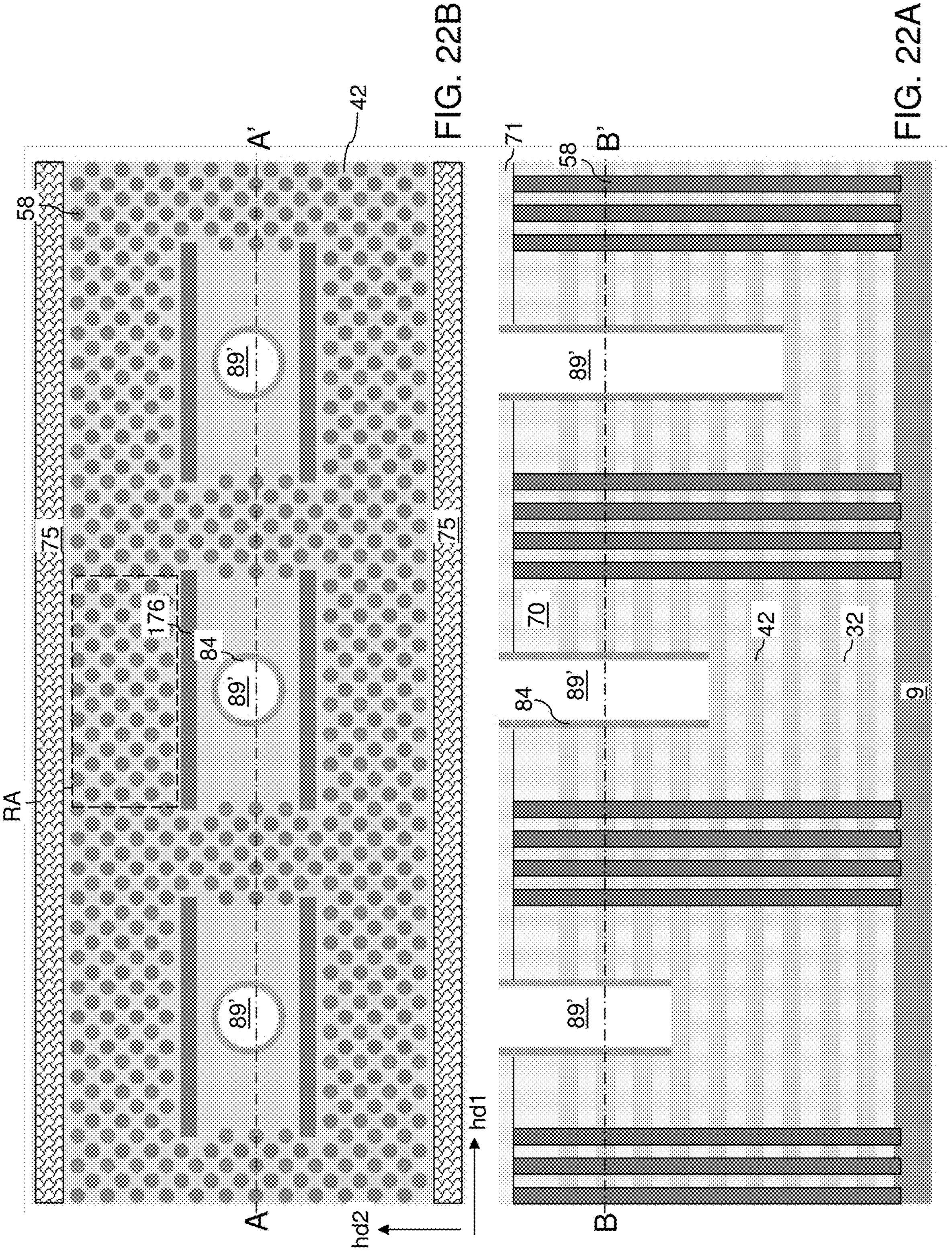
FIG. 22A is a vertical cross-sectional view of the third exemplary structure after formation of first dielectric contact via liners according to the third embodiment of the present disclosure.
FIG. 22B is a horizontal cross-sectional view of the third exemplary structure along the vertical plane B-B' of FIG. 22A. The vertical plane A-A' is the plane of the vertical cross-section of FIG. 22A.

Referring to FIGS. 22A and 22B, a dielectric material such as silicon oxide can be conformally deposited in the contact via openings 89 and over the insulating cap layer 70 (and over the dielectric capping layer 71, if present) to form a conformal dielectric material layer. An anisotropic etch process can be performed to remove horizontally-extending portions of the conformal dielectric material layer. Each remaining tubular portion of the conformal dielectric material layer constitutes a tubular dielectric spacer 84. Each tubular dielectric spacer 84 is a dielectric contact via liner that contacts a sidewall of a respective one of the contact via openings 89. A tubular dielectric liner 84 can be formed at a peripheral portion of each contact via opening 89. A contact via cavity 89' can be provided within each volume laterally surrounded by the tubular dielectric spacer 84.

Figure 23B:
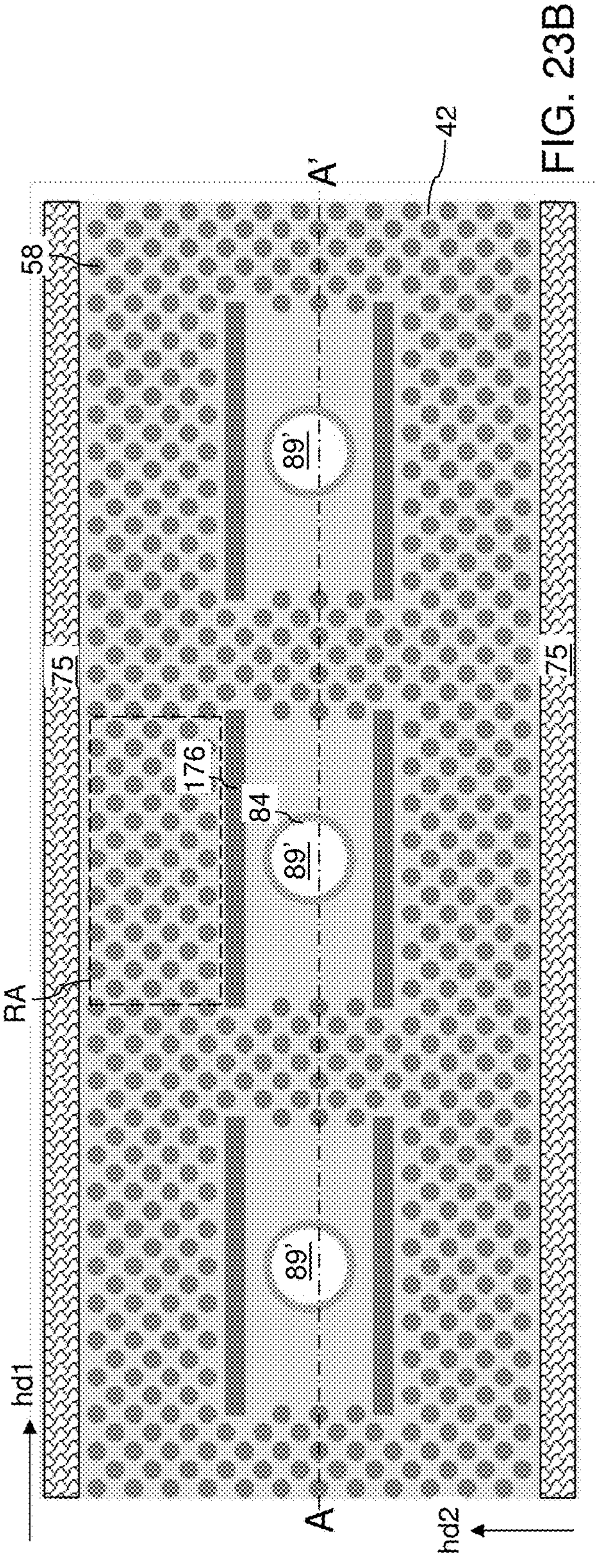
FIG. 23B is a horizontal cross-sectional view of the third exemplary structure along the vertical plane B-B' of FIG. 23A. The vertical plane A-A' is the plane of the vertical cross-section of FIG. 23A.
Figure 23A:
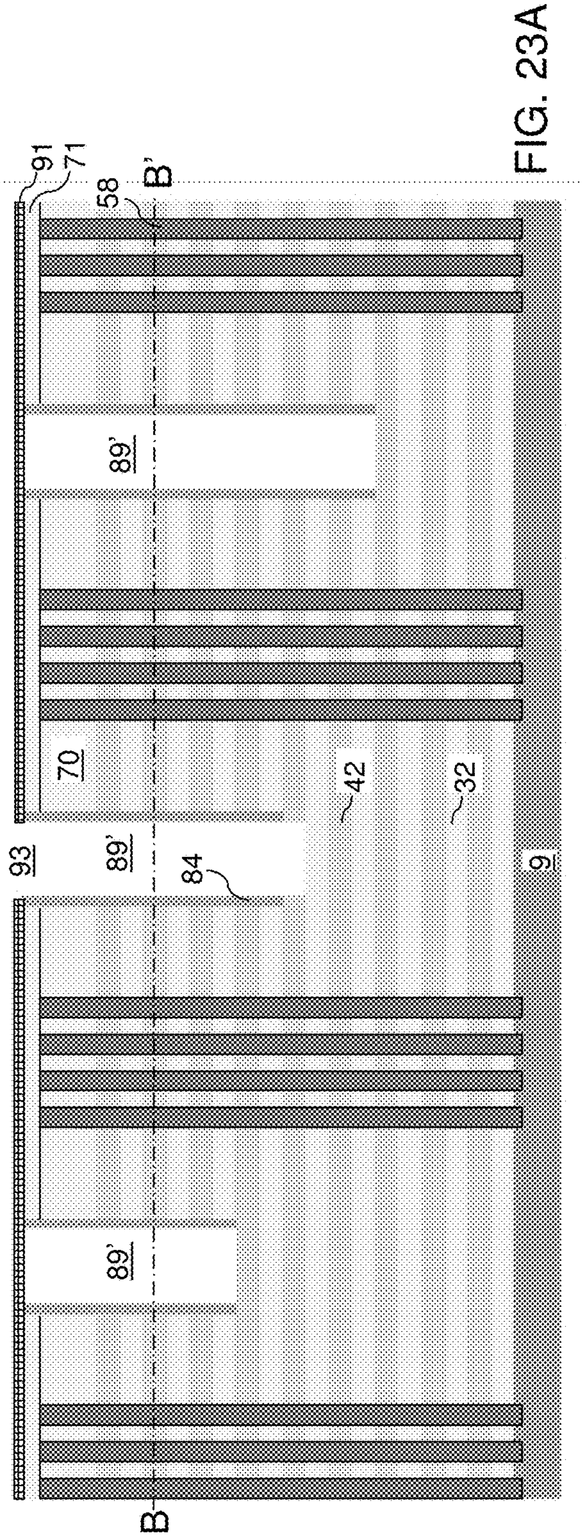
FIG. 23A is a vertical cross-sectional view of the third exemplary structure after vertical extension of one of the contact via openings according to the third embodiment of the present disclosure.

Referring to FIGS. 23A and 23B, a photoresist layer 91 can be applied over the third exemplary structure, and can be lithographically patterned to form at least one opening 93 overlying a respective one of the contact via openings 89, while masking the remainder of the contact via openings 89. In the illustrated example, the center contact via opening 89 underlies the opening 93 in the photoresist layer, and the two peripheral contact via openings 89 can be covered by the photoresist layer. An unmasked portion of a sacrificial material layer 42 can be removed underneath each contact via opening 89 that is not masked by the photoresist layer while performing a first anisotropic etch process. For example, an anisotropic etch process can be performed which etches the material of the sacrificial material layers 42 selective to the materials of the insulating layers 32 and the dielectric capping layer 71. At least one contact via opening 89 can be vertically extended by the first selective etch process. A top surface of an insulating layer 32 may be physically exposed underneath each vertically-extended contact via opening 89. Generally, one or more of the contact via openings 89 can be vertically extended through a respective sacrificial material layer 42 such that a top surface of an underlying insulating layer 32 is physically exposed. The photoresist layer 91 can be removed by ashing or selecting etching after the anisotropic etching step.

Figure 24B:
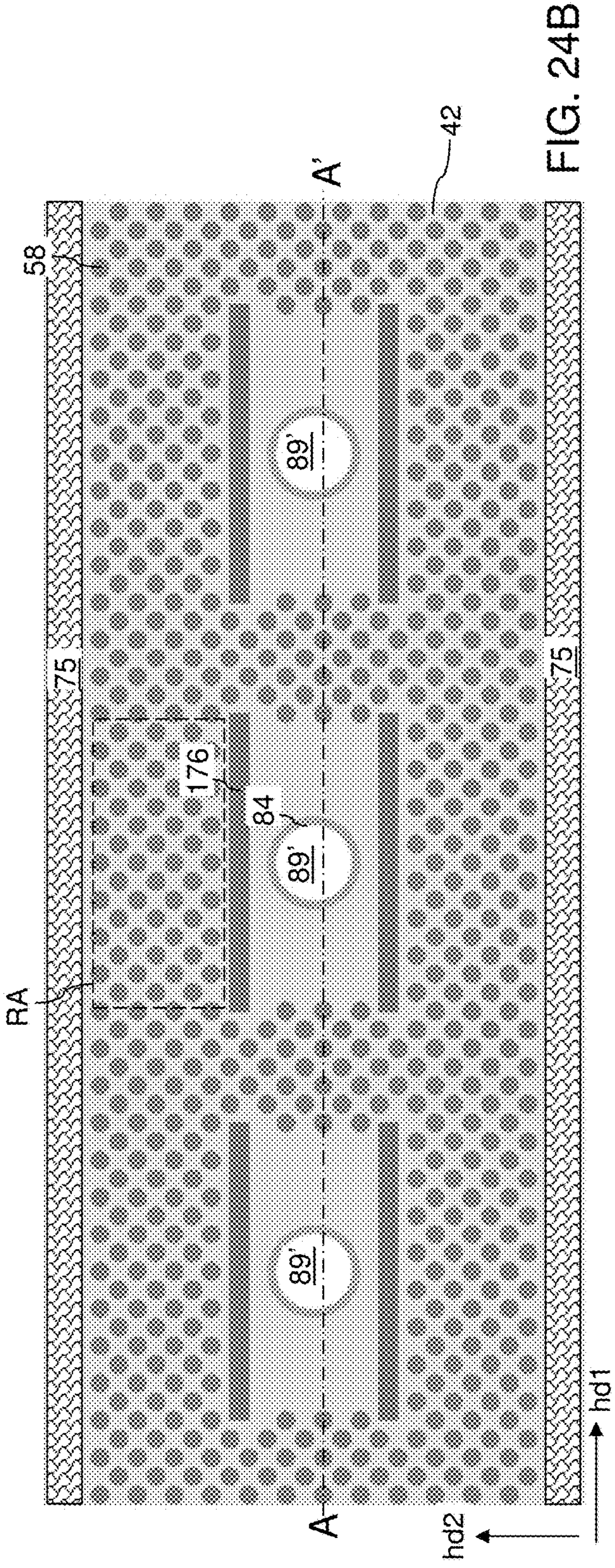
FIG. 24B is a horizontal cross-sectional view of the third exemplary structure along the vertical plane B-B' of FIG. 24A. The vertical plane A-A' is the plane of the vertical cross-section of FIG. 24A.
Figure 24A:
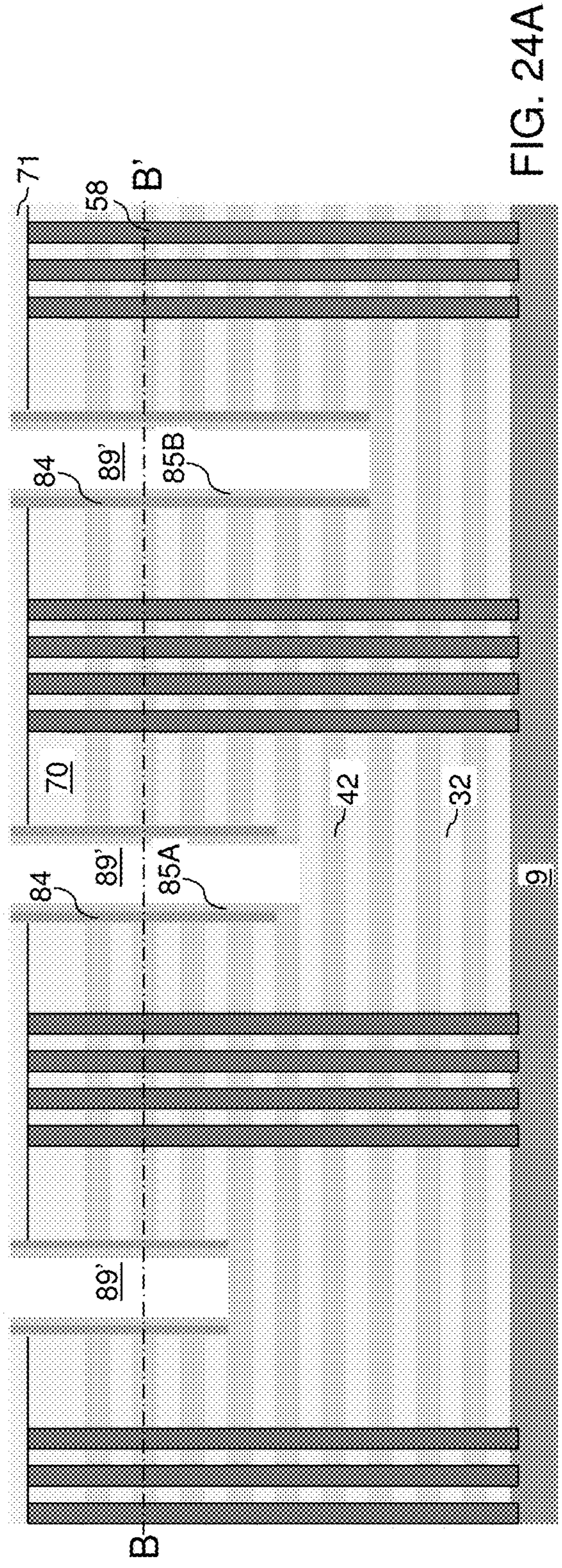
FIG. 24A is a vertical cross-sectional view of the third exemplary structure after formation of a second dielectric contact via liner according to the third embodiment of the present disclosure.

Referring to FIGS. 24A and 24B, a sacrificial material that is different from the material of the tubular dielectric liners 84 and the insulating layers 32 can be conformally deposited in the contact via cavities 89' and over the insulating cap layer 70 (and over the dielectric capping layer 71, if present) to form a conformal sacrificial material layer. An anisotropic etch process can be performed to remove horizontally-extending portions of the conformal sacrificial material layer. Each remaining tubular portion of the conformal sacrificial material layer constitutes a tubular sacrificial spacer. Each tubular sacrificial spacer is a sacrificial contact via liner that contacts a sidewall of a respective one of the tubular dielectric spacer 84. Each tubular sacrificial spacer 85A that is formed within a vertically-extended contact via cavity 89' contacts a cylindrical sidewall of a respective sacrificial material layer 42 and a top surface segment of an underlying insulating layer 32. Each tubular sacrificial spacer 85B that is formed within a contact via cavity 89' that is not vertically extended at the processing steps described with reference to FIGS. 23A and 23B can be formed directly on an annular top surface segment of a respective sacrificial material layer 42. In one embodiment, the tubular sacrificial spacers 85A and 85B may comprise silicon nitride or a dielectric metal oxide.

Figure 25B:
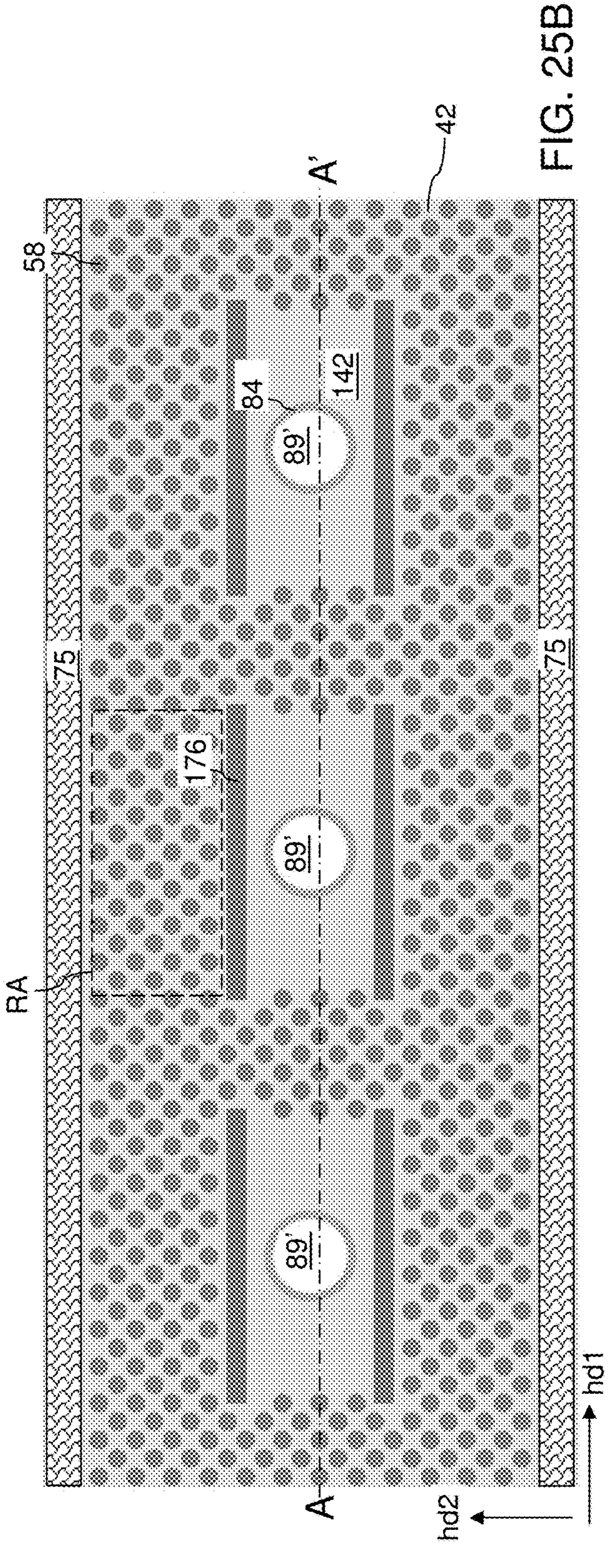
FIG. 25B is a horizontal cross-sectional view of the third exemplary structure along the vertical plane B-B' of FIG. 25A. The vertical plane A-A' is the plane of the vertical cross-section of FIG. 25A.
Figure 25A:
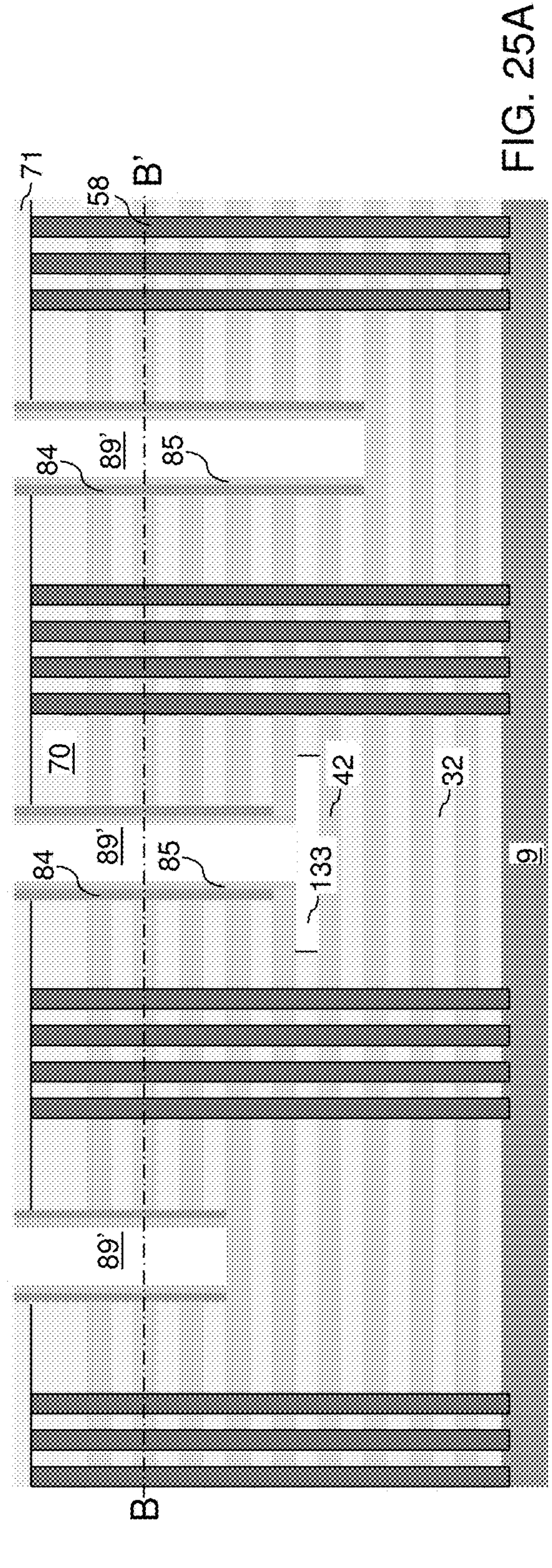
FIG. 25A is a vertical cross-sectional view of the third exemplary structure after formation of an insulating-layer-level laterally-extending cavity according to the third embodiment of the present disclosure.

Referring to FIGS. 25A and 25B, a selective isotropic etch process can be performed to isotropically recess unmasked portions of each insulating layer 32 that underlies a respective tubular sacrificial spacer 85A. The duration of the isotropic etch process can be selected such that a laterally-extending cavity is formed underneath each tubular sacrificial spacer 85A that is formed directly on an annular top surface segment of a respective insulating layer 32 at the processing steps described with reference to FIGS. 24A and 24B. Each laterally-extending cavity is formed at the level of a respective insulating layer 32 by isotropically etching the respective insulating layer 32. As such, each laterally-extending cavity that is formed at the processing steps described with reference to FIGS. 25A and 25B is herein referred to as an insulating-layer-level laterally-extending cavity 133. The sacrificial material layers 42 that underlie the respective tubular sacrificial spacers 85B are not etched through during the selective isotropic etch process.

A bottom surface of an overlying sacrificial material layer 42 and a top surface of an underlying sacrificial material layer 42 can be physically exposed to each insulating-layer-level laterally-extending cavity 133. Each insulating-layer-level laterally-extending cavity 133 may have a lateral extent that is greater than the maximum lateral extent of an overlying tubular dielectric liner 84. In one embodiment, sidewalls of a respective pair of dielectric barrier structures 176 can be physically exposed to each insulating-layer-level laterally-extending cavity 133. In one embodiment, each insulating-layer-level laterally-extending cavity 133 may have a lateral extent along the second horizontal direction hd2 that is the same as a lateral separation distance between a neighboring pair of dielectric barrier structures 176. The lateral extent of each insulating-layer-level laterally-extending cavity 133 along the first horizontal direction hd1 may be greater than the lateral extent of the respective insulating-layer-level laterally-extending cavity 133 along the second horizontal direction hd2.

Figures 26A, 26B:
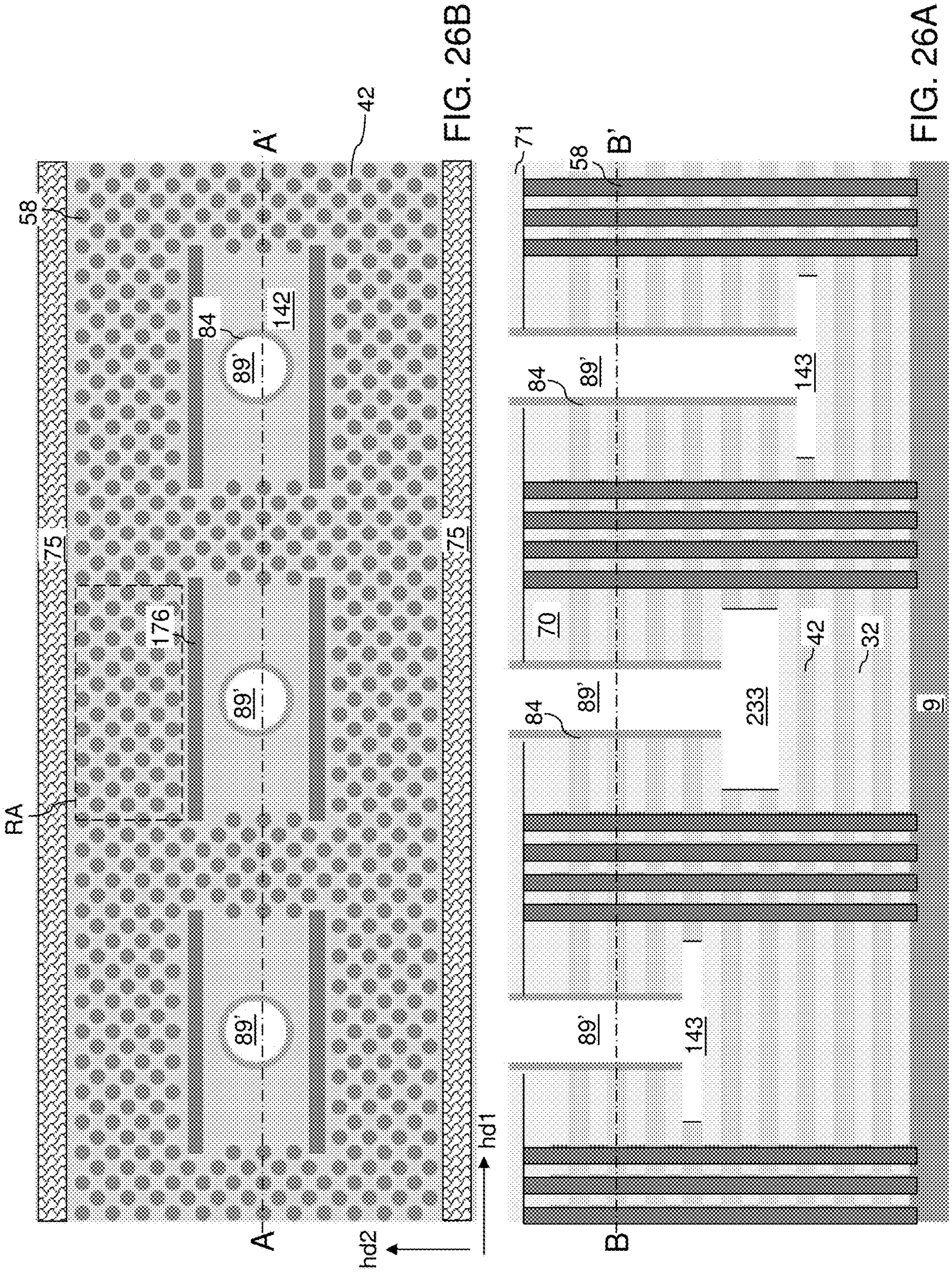
FIG. 26A is a vertical cross-sectional view of the third exemplary structure after formation of a multi-level laterally-extending cavity and single-level laterally-extending cavities according to the third embodiment of the present disclosure.
FIG. 26B is a horizontal cross-sectional view of the third exemplary structure along the vertical plane B-B' of FIG. 26A. The vertical plane A-A' is the plane of the vertical cross-section of FIG. 26A.

Referring to FIGS. 26A and 26B, an isotropic etch process can be performed to isotropically recess the material of the sacrificial material layers around each insulating-layer-level laterally-extending cavity 133 and underneath each contact via cavity 89' around which a tubular dielectric liner 84 and a tubular sacrificial liner 85B are in direct contact with a respective underlying sacrificial material layer 42. The isotropic etch process vertically expands each insulating-layer-level laterally-extending cavity 133 through a respective overlying sacrificial material layer 42 and through a respective underlying sacrificial material layer 42 to provide a cavity that vertically extends over the levels of an insulating layer 32 and two sacrificial material layers 42. Each vertically-expanded cavity is herein referred to as a multi-level laterally-extending cavity 233.

Further, a laterally-extending cavity 143 can be formed underneath each contact via cavity 89' around which a tubular dielectric liner 84 and a tubular sacrificial liner 85B are in direct contact with a respective underlying sacrificial material layer 42 after the processing steps described with reference to FIGS. 25A and 25B and prior to the processing steps of FIGS. 26A and 26B. Each laterally-extending cavity 143 vertically extends only through a single level, i.e., a level of a respective sacrificial material layer 42, and thus, is herein referred to as a single-level laterally-extending cavity.

In one embodiment, the tubular sacrificial liners 85A and 85B may be collaterally removed during the isotropic etch process that isotropically recesses the material of the sacrificial material layers 42. In an illustrative example, the sacrificial material layers 42 and the tubular sacrificial liners (85A, 85B) may comprise silicon nitride, and the isotropic etch process may comprise a wet etch process employing hot phosphoric acid. Generally, each multi-level laterally-extending cavity 233 can be formed by isotropically etching a first sacrificial material layer 42 that overlies an insulating-layer-level laterally-extending cavity 133 and by isotropically etching a second sacrificial material layer 42 that underlies the insulating-layer-level laterally-extending cavity 133.

Figure 27B:
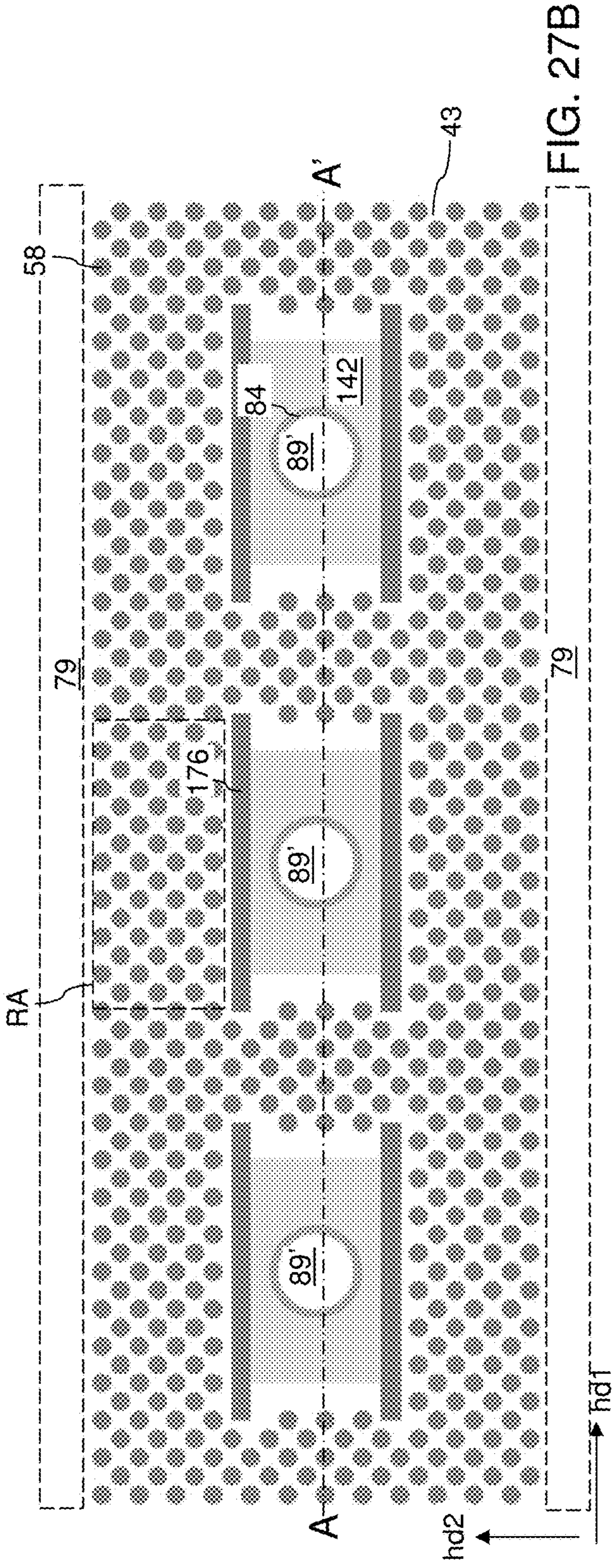
FIG. 27B is a horizontal cross-sectional view of the third exemplary structure along the vertical plane B-B' of FIG. 27A. The vertical plane A-A' is the plane of the vertical cross-section of FIG. 27A.
Figure 27A:
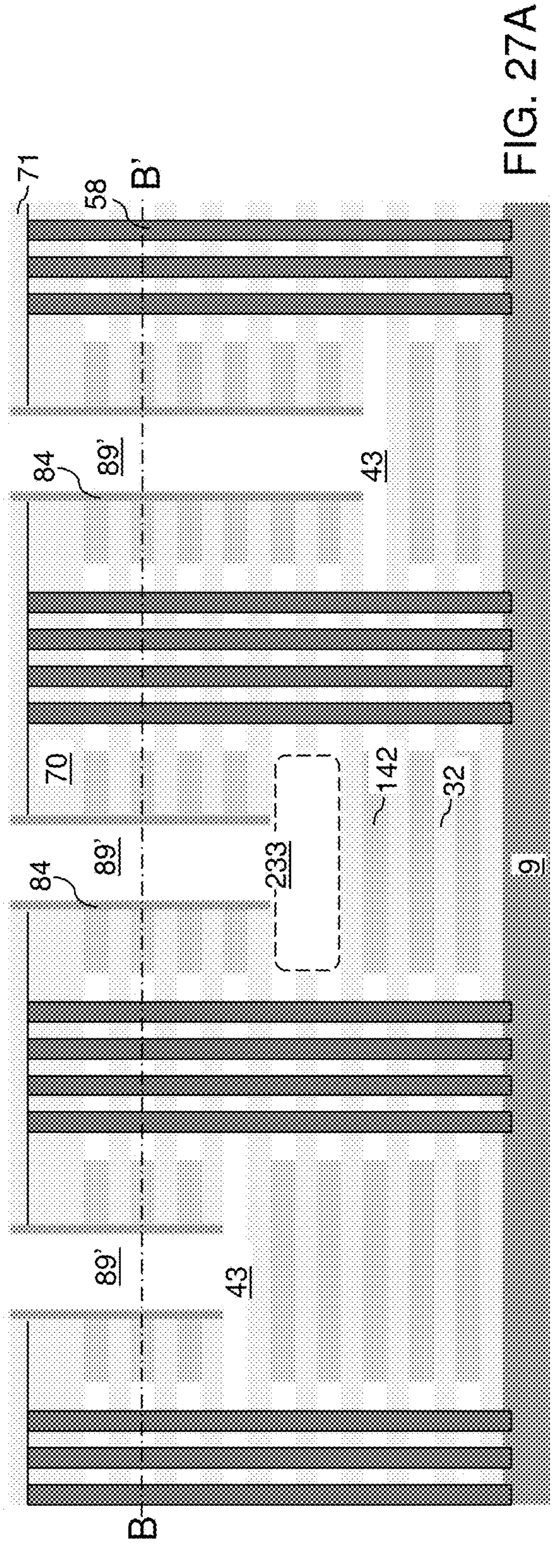
FIG. 27A is a vertical cross-sectional view of the third exemplary structure after formation of backside recesses according to the third embodiment of the present disclosure.

Referring to FIGS. 27A and 27B, the sacrificial backside trench fill structures 75 can be removed from inside the backside trenches 79 selective to materials of the alternating stack (32, 42), the insulating cap layer 70, and the tubular dielectric liners 84. For example, if the sacrificial backside trench fill structures 75 comprise a semiconductor material, a wet etch process employing hot trimethyl-2 hydroxyethyl ammonium hydroxide ("hot TMY") or tetramethyl ammonium hydroxide (TMAH) can be employed to remove the semiconductor material of the sacrificial backside trench fill structures 75. In this case, sacrificial dielectric liners (not shown) may be employed as etch stop structures, and may be subsequently removed. Alternatively, the backside trenches 79 may be formed by photolithography and etching through the alternating stack (32, 42) at this step in the process rather than at the step shown in FIGS. 12A-12C.

Generally, the backside trenches 79 may be formed through the alternating stack (32, 42) prior to or after formation of the at least one multi-level laterally-extending cavity 233 and the single-level laterally-extending cavities 143. An isotropic etch process can be performed to isotropically recess the sacrificial material layers 42 from around the backside trenches 79. For example, an etchant that selectively etches the material of the sacrificial material layers 42 with respect to the materials of the insulating layers 32, the insulating cap layer 70, the tubular dielectric liners 84, the semiconductor material layer 9, and the material of the outermost layers of the memory films 50 can be introduced into the backside trenches 79, for example, during the isotropic etch process. Backside recesses 43 are formed in volumes from which the sacrificial material layers 42 are removed.

The isotropic etch process may comprise a wet etch process employing a wet etch solution, and/or may comprise a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The memory opening fill structures 58 provide structural support while the backside recesses 43 are present within volumes previously occupied by the sacrificial material layers 42.

The backside recesses 43 grow from around the backside trenches 79 until the backside recesses 43 merge into continuous backside recesses 43 that continuously extend between neighboring pairs of backside trenches 79. Each multi-level laterally-extending cavity 233 laterally extends until each multi-level laterally-extending cavity 233 merges with a respective set of backside recesses 43. Further, the single-level laterally-extending cavities 143 laterally extend until each of the single-level laterally-extending cavities 143 merge with a respective backside recess 43. According to an aspect of the present disclosure, the duration of the isotropic etch process can be selected such that unetched portions of the sacrificial material layers 42 remain between each neighboring pair of dielectric barrier structures 176. Generally, the backside recesses 43 are formed in volumes from which portions of the sacrificial material layers 42 are removed. Each multi-level laterally-extending cavity 233 can be connected to at least two backside recesses 43 to form a continuous void. Each single-level laterally-extending cavity 143 can be connected to at least one backside recess 43 that grows from a respective backside trench 79 to form a continuous void.

Remaining portions of the sacrificial material layers 42 after formation of the backside recesses 43 comprise dielectric material portions that laterally surround a respective contact via opening 89. Each remaining portion of the sacrificial material layers 42 is herein referred to as a dielectric material plate 142. Each dielectric material plate 142 laterally surrounding a contact via cavity 89' comprise an opening therethrough, and overlies a multi-level laterally-extending cavity 233 or a backside recess 43. Each dielectric material plate 142 that underlies a multi-level laterally-extending cavity 233 or a backside recess 43 may be free of any opening therethrough. A vertical stack of dielectric material plates 142 can be formed between each neighboring pair of dielectric barrier structures 176. The dielectric material plates 142 may be located at each level of the sacrificial material layers 42 as provided at the processing steps described with reference to FIGS. 10A-10C except at the levels at which the multi-level laterally-extending cavity 233 connected to an overlying contact via cavity 89' is present. Each backside recess 43 can be vertically bounded by a top surface of an underlying insulating layer 32 and a bottom surface of an overlying insulating layer 32 or the insulating cap layer 70. In one embodiment, each backside recess 43 can have a uniform height throughout.

Figure 28B:
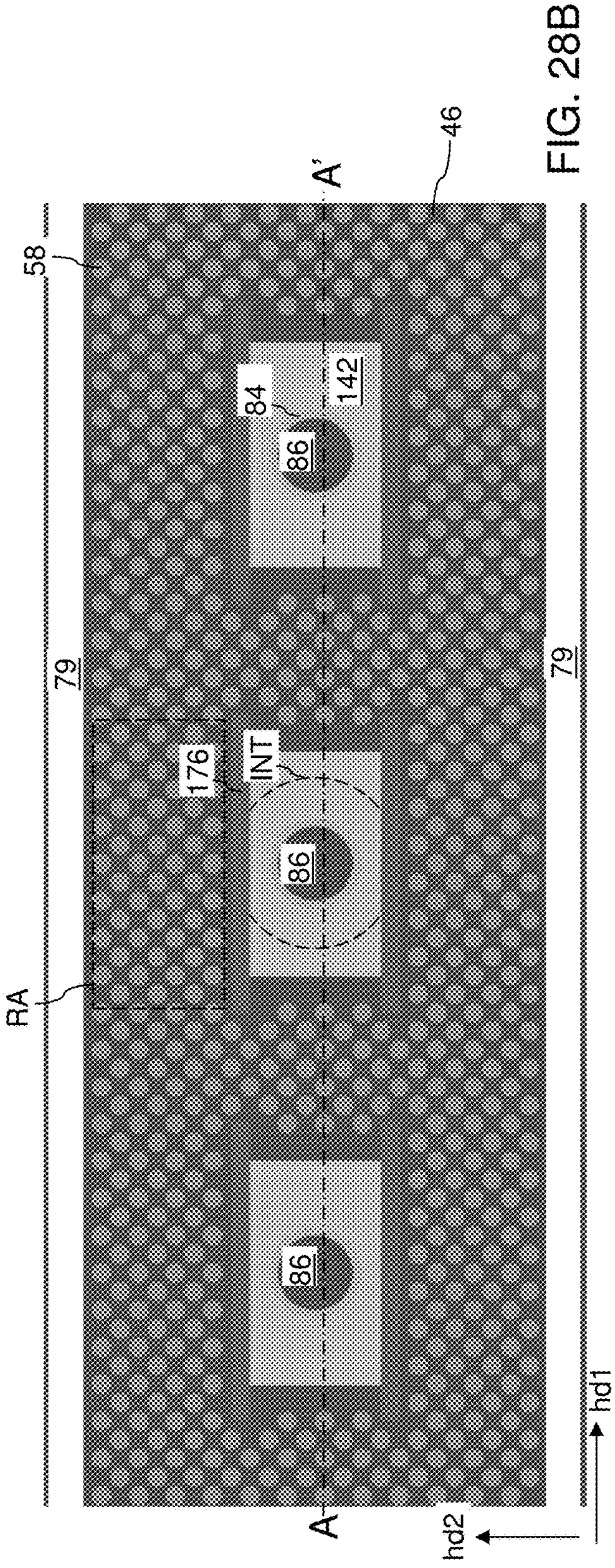
FIG. 28B is a horizontal cross-sectional view of the third exemplary structure along the vertical plane B-B' of FIG. 28A. The vertical plane A-A' is the plane of the vertical cross-section of FIG. 28A.
Figure 28A:
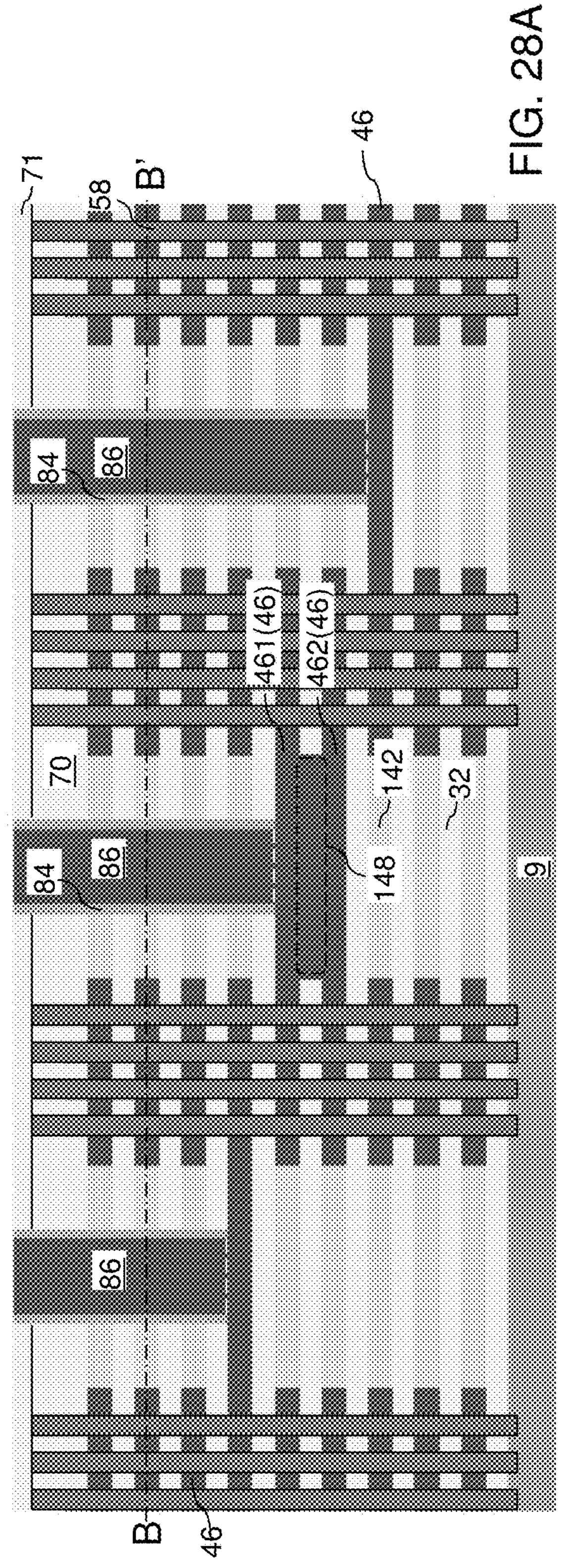
FIG. 28A is a vertical cross-sectional view of the third exemplary structure after formation of integrated layer-and-contact structures according to the third embodiment of the present disclosure.

Referring to FIGS. 28A and 28B, at least one electrically conductive material, such as a combination of a metallic barrier liner material and a metallic fill material, may be conformally deposited in the backside recesses 43, in each multi-level laterally-extending cavity 233, and in the contact via cavities 89' laterally surrounded by the tubular dielectric liners 84. The metallic barrier liner material may comprise a conductive metallic compound material such as TiN, TaN, WN, MON, TiC, TaC, WC, alloys thereof, or a combination thereof. The metallic fill material may comprise W, Ti, Ta, Mo, Co, Ru, Cu, alloys thereof, or combinations thereof. The total thickness of the at least one conductive material is greater than one half of the height of the backside recesses 43 and is greater than one half of the width of the via cavities. Excess portions of the at least one conductive material can be removed from above the horizontal plane including the top surface of the insulating cap layer 70 by performing a planarization process, which may comprise a recess etch process and/or a chemical mechanical polishing process.

Each remaining portion of the at least one conductive material that fills a respective combination of a pair of backside recesses 43, a multi-level laterally-extending cavity 233, and a contact via cavity 89' constitutes a first integrated line-and-via structure (86, 461, 462, 148). Each first integrated line-and-via structure (86, 461, 462, 148) can be formed in a continuous volume including two backside recesses 43, a multi-level laterally-extending cavity 233, and a volume of a contact via cavity 89' (which is a volume within a contact via opening 89). Each first integrated line-and-via structure (86, 461, 462, 148) comprises a first electrically conductive layer 461, a second electrically conductive layer 462, a metallic plate portion 148 adjoining (i.e., located vertically between and contacting) the first electrically conductive layer 461 and the second electrically conductive layer 462, and a metallic via portion 86 that is formed in a respective contact via opening 89 which contacts the first electrically conductive layer 461. The electrically conductive layers 46 comprise a first electrically conductive layer 461 that fills a volume from which a first sacrificial material layer 42 is removed and a second electrically conductive layer 462 that fills a volume from which a second sacrificial material layer 42 is removed. A metallic plate portion 148 fills a volume of the multi-level laterally-extending cavity 233 and vertically connects the first electrically conductive layer 461 and the second electrically conductive layer 462. The first electrically conductive layer 461, the second electrically conductive layer 462, and the metallic plate portion 148 are portions of an integrated line-and-via structure (86, 461, 462, 148), which is a unitary structure and further comprises a metallic via portion 86.

The metallic plate portion 148 comprises sidewalls that contact sidewalls of one of the insulating layers 32. A vertical interface INT between the metallic plate portion 148 and the one of the insulating layers 32 is laterally offset from a bottom periphery of the metallic via portion 86 by a uniform lateral offset distance. The metallic via portion 86 is laterally surrounded by a tubular dielectric liner 84, and the tubular dielectric liner 84 is laterally surrounded by each of the dielectric material plates 142 that overlie the first electrically conductive layer 461. An annular bottom surface of the tubular dielectric liner 84 contacts an annular horizontal surface segment of the first electrically conductive layer 461.

The first electrically conductive layer 461 and the second electrically conductive layer 462 of the integrated line-and-via structure (86, 461, 462, 148) may function as select gate electrodes or as dummy word lines. For example, the first electrically conductive layer 461 and the second electrically conductive layer 462 may comprise electrically connected drain side select gate electrodes or source side select gate electrodes. Alternatively, the first electrically conductive layer 461 and the second electrically conductive layer 462 may comprise dummy word lines located under the drain side select gate electrodes. The dummy word lines facilitate electron conduction through the vertical semiconductor channel 60 during operation of the NAND strings, but are not used to write, erase or read data from adjacent memory cells.

Each remaining portion of the at least one conductive material that fills a respective combination of a backside recess 43 and a contact via cavity 89' constitutes a second integrated line-and-via structure (86, 46). Each second integrated line-and-via structure (86, 46) can be formed in a continuous volume including a backside recess 43 and a volume of a contact via cavity 89' (which is a volume within a contact via opening 89). Each second integrated line-and-via structure (86, 46) comprises an electrically conductive layer 46 and further comprising a metallic via portion 86 that is formed in a respective contact via opening 89. In one embodiment, the electrically conductive layers 46 of the second integrated line-and-via structures (86, 46) may function as word lines. Portions of the electrically conductive material that are deposited in the backside trenches 79 or above the insulating cap layer 70 can be removed by performing an etch back process, which may comprise an isotropic etch process and/or an anisotropic etch process.

Generally, at least one electrically conductive material can be deposited in volumes of the backside recesses 43 and unfilled volumes of the contact via openings 89. Portions of the electrically conductive material deposited in the volumes of the backside recesses 43 and the laterally-extending cavity 143 constitute electrically conductive layers 46, and portions of the electrically conductive material filling the contact via openings 89 constitutes metallic via portions 86. In one embodiment, each first integrated line-and-via structure (86, 461, 462, 148) comprises a homogeneous metallic material portion that extends continuously from a volume within a first electrically conductive layer 46, through a volume of a metallic plate portion 148, through a volume of a second electrically conductive layer 462, and to a volume within the metallic via portion 86 without a material junction therein. Each second integrated line-and-via structure (86, 46) comprises a homogeneous metallic material portion that extends continuously from a volume within an electrically conductive layer 46 to a volume within the metallic via portion 86 without a material junction therein. In one embodiment, each metallic via portion 86 is laterally surrounded by a tubular dielectric liner 84, and each tubular dielectric liner 84 is laterally surrounded by each dielectric material plate 142 that overlie an electrically conductive layer 46 adjoined to the metallic via portion 86.

Each backside recess 43 can be connected to a respective contact via cavity 89' prior to deposition of the at least one electrically conductive material. As such, each contiguous combination of a backside recess 43 and a contact via cavity 89' can be filled with a respective integrated line-and-via structure [(86, 461, 462, 148) or (86, 46)}. In one embodiment, an annular bottom surface of the tubular dielectric liner 84 contacts an annular horizontal surface segment of a respective underlying electrically conductive layer 46. A vertical stack of dielectric material plates 142 can be located at levels of a subset of the electrically conductive layers 46 between each neighboring pair of dielectric barrier structures 176 that are spaced apart along the second horizontal direction hd2. The vertical stack of dielectric material plates 142 can contact each of the pair of dielectric barrier structures 176.

In one embodiment, surface segments within a vertically-extending interface INT between a metallic plate portion 148 and an insulating layer 32 have a respective radius of curvature Rc that is the same as the radial distance between a vertical axis passing through a geometrical center of a metallic via portion 86 and the vertically-extending interface INT in the plan view.

Figure 29B:
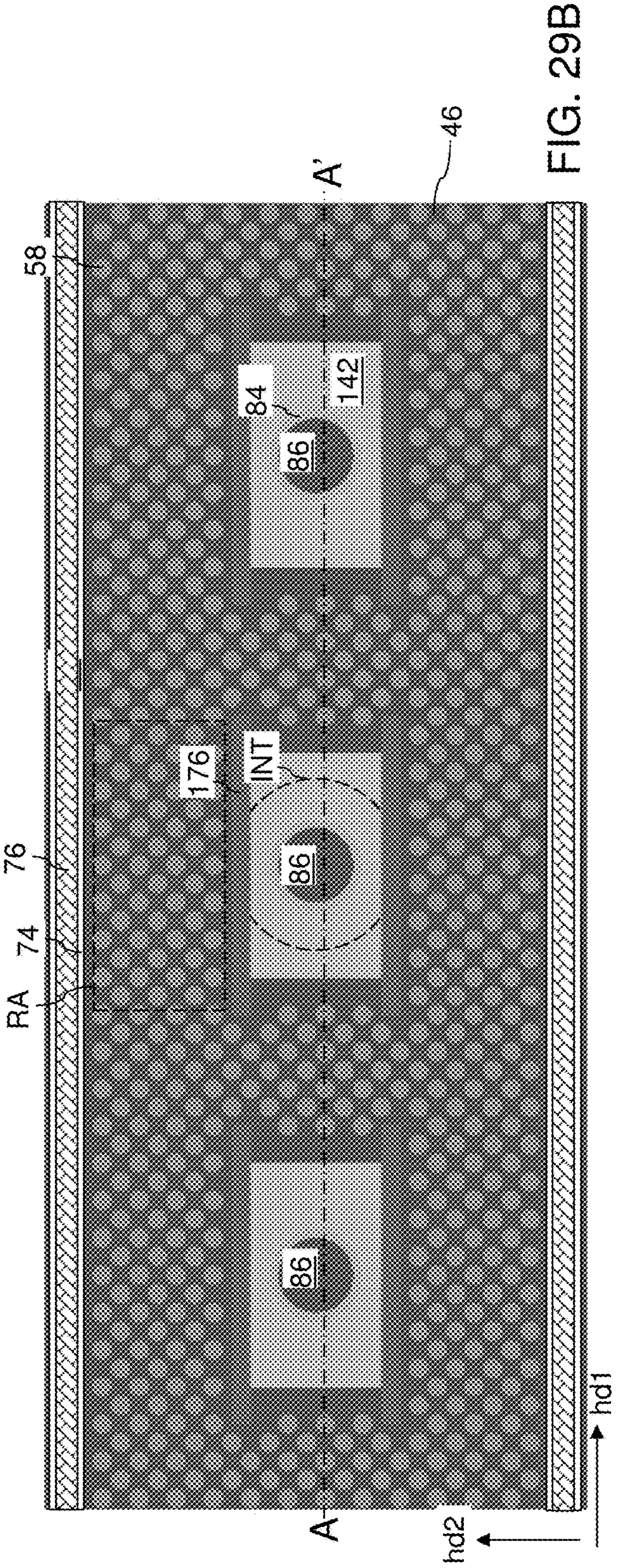
FIG. 29B is a horizontal cross-sectional view of the third exemplary structure along the vertical plane B-B' of FIG. 29A. The vertical plane A-A' is the plane of the vertical cross-section of FIG. 29A.
Figure 29A:
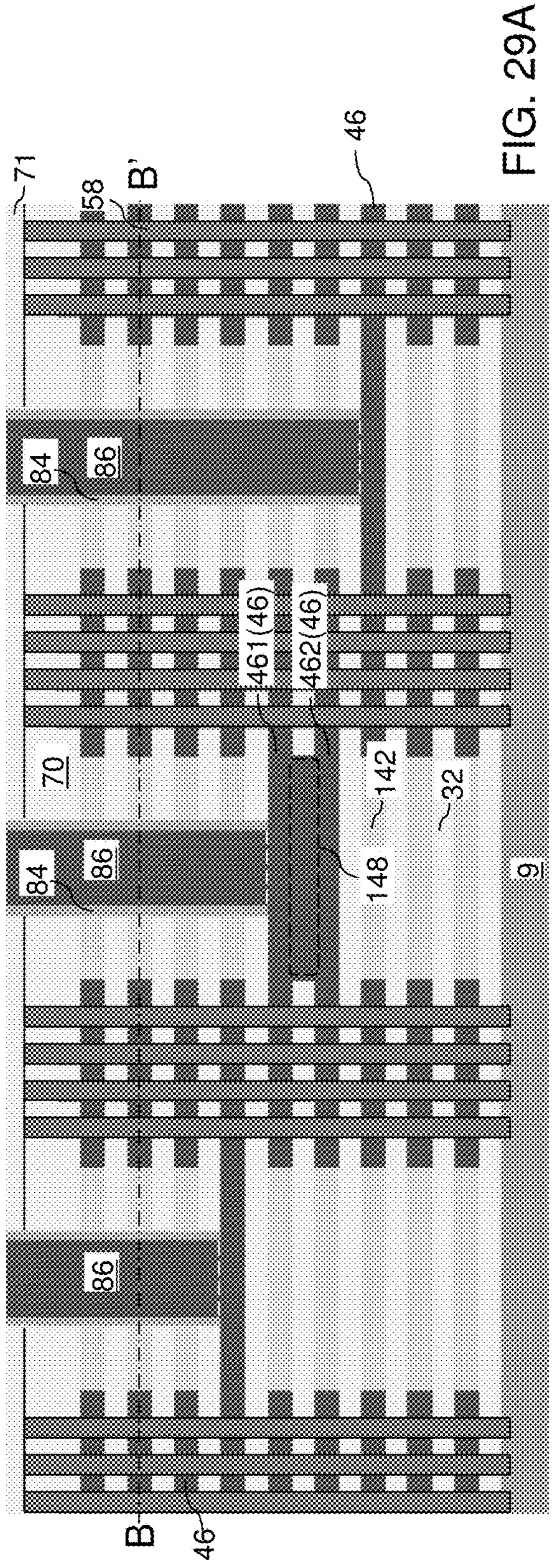
FIG. 29A is a vertical cross-sectional view of the third exemplary structure after formation of backside trench fill structures according to the third embodiment of the present disclosure.

Referring to FIGS. 29A and 29B, an insulating material layer can be formed in the backside trenches 79 and over the insulating cap layer 70 by a conformal deposition process. An anisotropic etch is performed to remove horizontal portions of the insulating material layer from above the insulating cap layer 70 and at the bottom of each backside trench 79. Each remaining portion of the insulating material layer constitutes an insulating spacer 74. A backside cavity can be present within a volume surrounded by each insulating spacer 74. A top surface of the semiconductor material layer 9 can be physically exposed at the bottom of each backside trench 79.

A backside contact via structure 76 can be formed within each backside cavity. Each contact via structure 76 can fill a respective backside cavity. The backside contact via structures 76 can be formed by depositing at least one conductive material in the backside cavities. For example, the at least one conductive material can include a conductive liner and a conductive fill material portion. The conductive liner can include a conductive metallic liner such as TiN, TaN, WN, TiC. TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof. Excess portions of the at least one conductive material can be removed from above the horizontal plane including the top surface of the insulating cap layer 70 by a planarization process. The planarization process may comprise a recess etch process and/or a chemical mechanical polishing process. Each remaining portion of the at least one conductive material constitutes a backside contact via structure 76. A pair of backside trench fill structures (74, 76) can laterally contact each alternating stack (32, 46) of insulating layers 32 and electrically conductive layers 46. The pair of backside trench fill structures (74, 76) can be laterally spaced apart from each other by the alternating stack (32, 46).

Figure 30B:
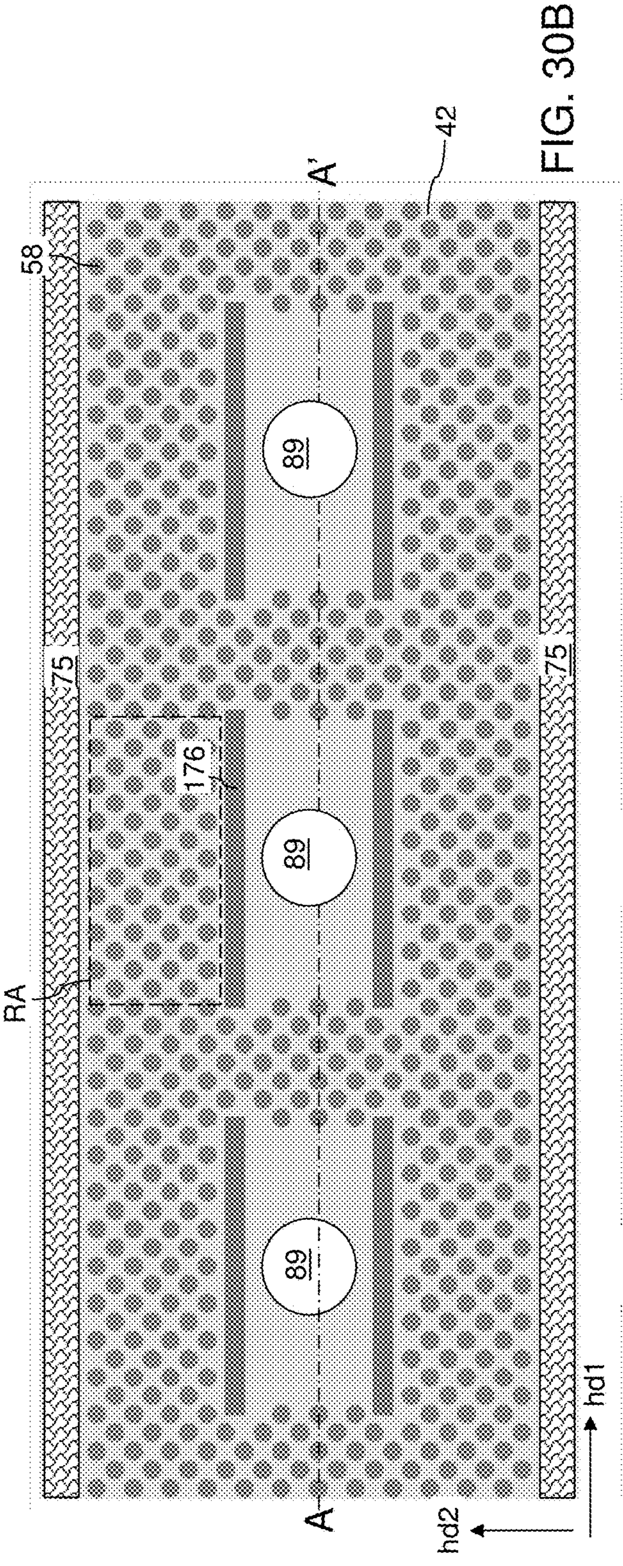
FIG. 30B is a horizontal cross-sectional view of the fourth exemplary structure along the vertical plane B-B' of FIG. 30A. The vertical plane A-A' is the plane of the vertical cross-section of FIG. 30A.
Figure 30A:
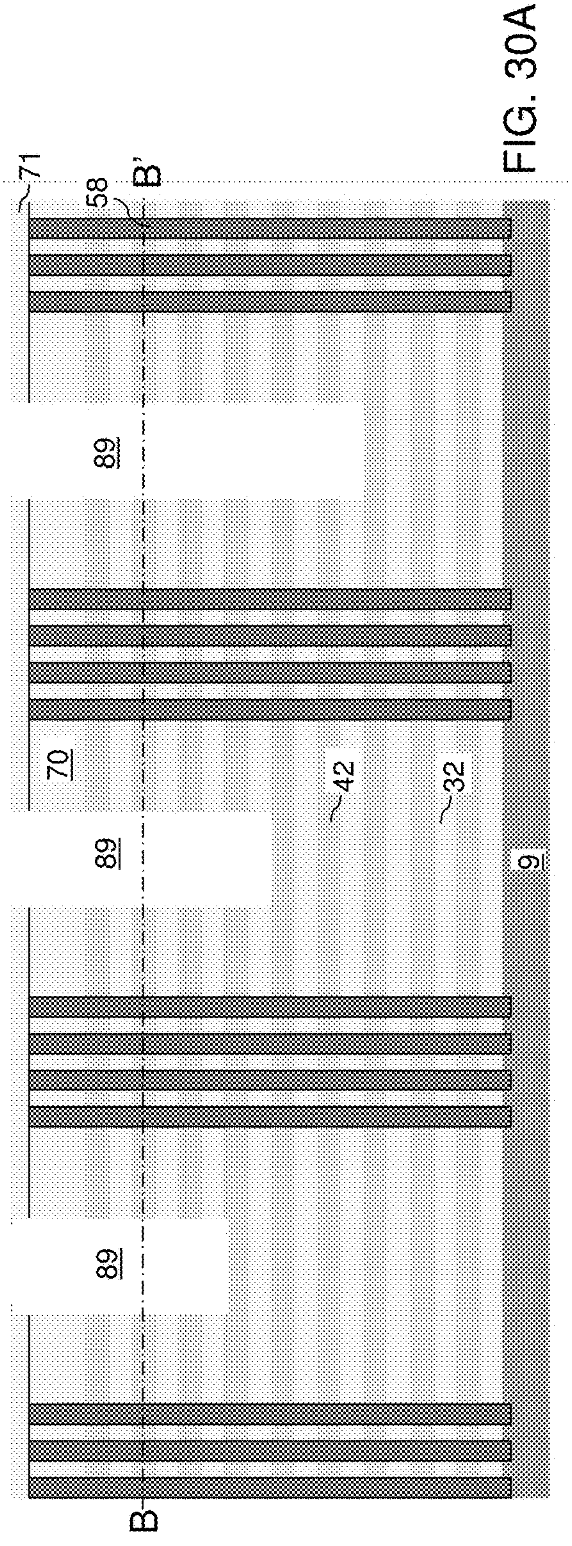
FIG. 30A is a vertical cross-sectional view of a fourth exemplary structure after formation of memory opening fill structures, an optional dielectric capping layer, backside trenches, and contact via openings according to a fourth embodiment of the present disclosure.

Referring to FIGS. 30A and 30B, a fourth exemplary structure according to a fourth embodiment of the present disclosure is illustrated. The fourth exemplary structure illustrated in FIGS. 30A and 30B may be the same as the third exemplary structure illustrated in FIGS. 21A and 21B.

Figure 31B:
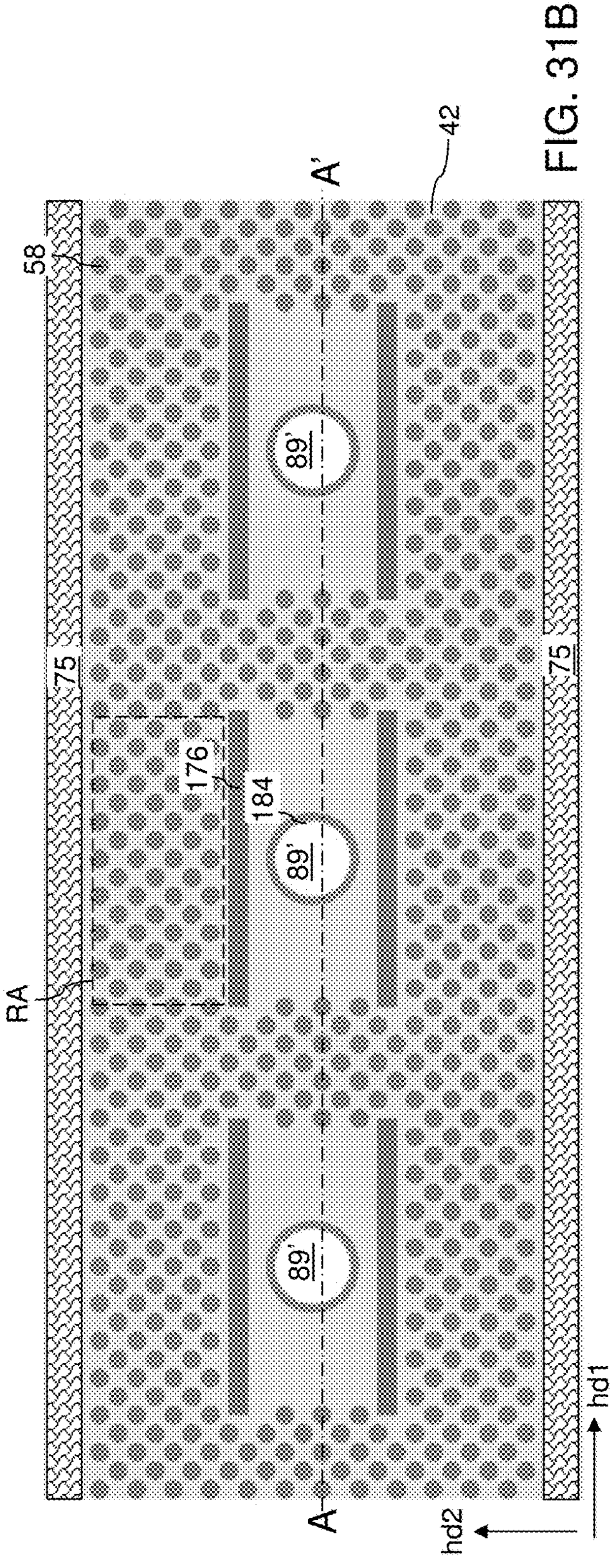
FIG. 31B is a horizontal cross-sectional view of the fourth exemplary structure along the vertical plane B-B' of FIG. 31A. The vertical plane A-A' is the plane of the vertical cross-section of FIG. 31A.
Figure 31A:
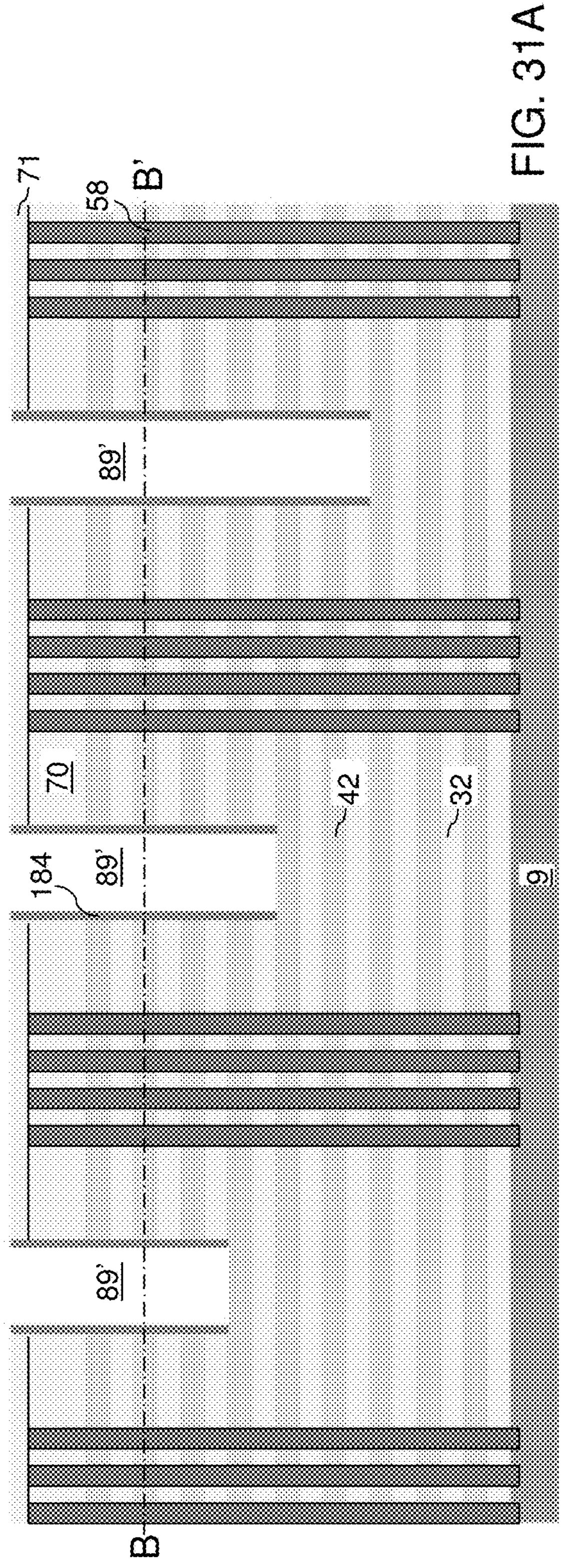
FIG. 31A is a vertical cross-sectional view of the fourth exemplary structure after formation of dielectric contact via liners according to the fourth embodiment of the present disclosure.

Referring to FIGS. 31A and 31B, a dielectric material that is different from the materials of the insulating layers 32 and the sacrificial material layers 42 can be conformally deposited in the contact via openings 89 and over the insulating cap layer 70 (and over the dielectric capping layer 71, if present) to form a conformal dielectric material layer. An anisotropic etch process can be performed to remove horizontally-extending portions of the conformal dielectric material layer. Each remaining tubular portion of the conformal dielectric material layer constitutes a tubular dielectric spacer 184. Each tubular dielectric spacer 184 is a dielectric contact via liner that contacts a sidewall of a respective one of the contact via openings 89. In one embodiment, the tubular dielectric spacers 184 may comprise a dielectric metal oxide material, such as aluminum oxide, hafnium oxide, tantalum oxide, lanthanum oxide, yttrium oxide, etc. The thickness of the tubular dielectric spacers 184 may be in a range from 5 nm to 100 nm, such as from 10 nm to 50 nm, although lesser and greater thicknesses may also be employed. A tubular dielectric liner 184 can be formed at a peripheral portion of each contact via opening 89. A contact via cavity 89' can be provided within each volume laterally surrounded by the tubular dielectric spacer 184.

Figure 32B:
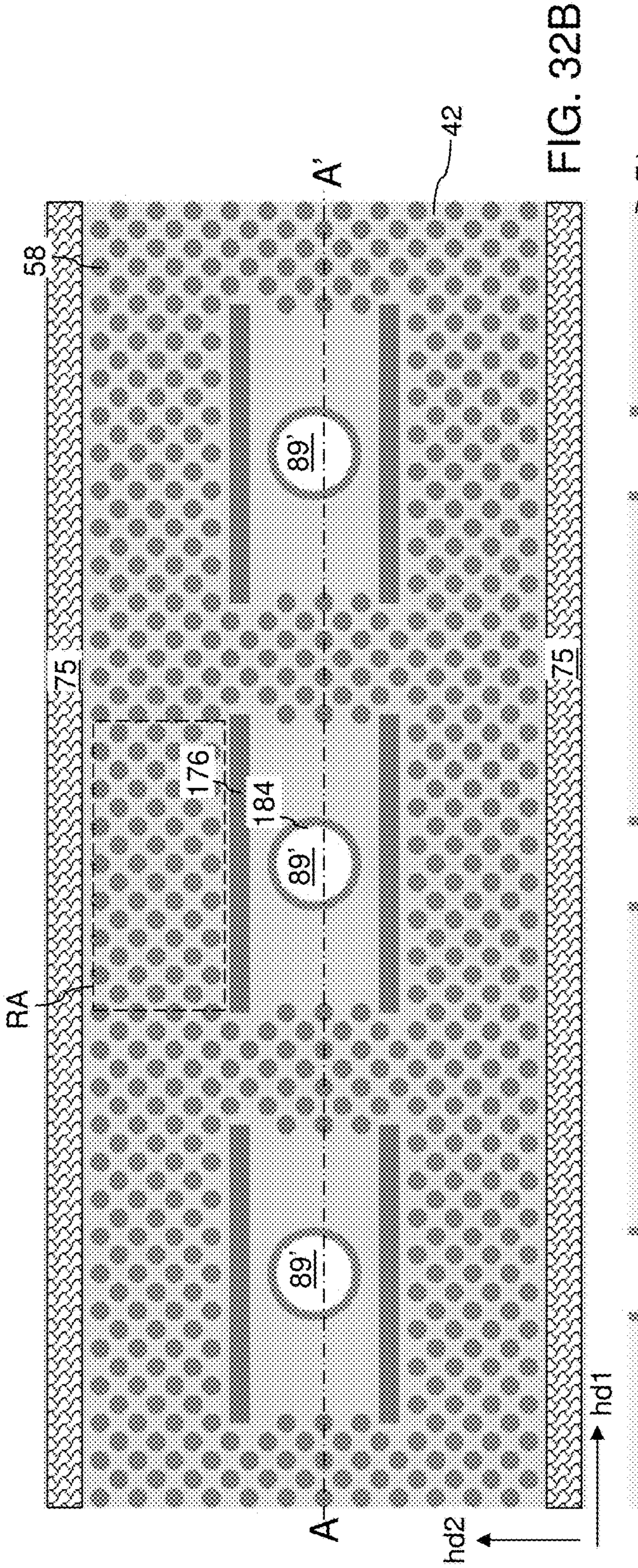
FIG. 32B is a horizontal cross-sectional view of the fourth exemplary structure along the vertical plane B-B' of FIG. 32A. The vertical plane A-A' is the plane of the vertical cross-section of FIG. 32A.
Figure 32A:
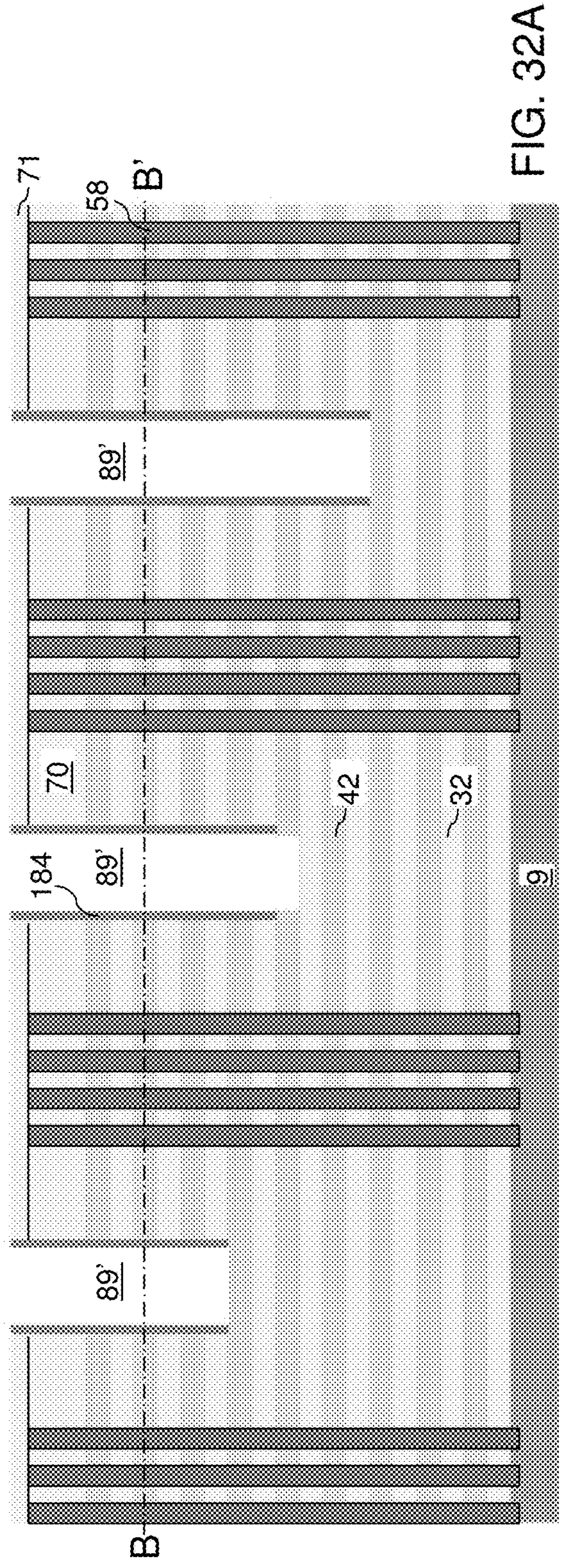
FIG. 32A is a vertical cross-sectional view of the fourth exemplary structure after vertical extension of one of the contact via openings according to the fourth embodiment of the present disclosure.

Referring to FIGS. 32A and 32B, the processing steps described with reference to FIGS. 23A and 23B can be performed to vertically extend at least one contact via cavity 89' through a respective sacrificial material layer 42. A top surface segment of an insulating layer 32 may be physically exposed underneath each vertically-extended contact via cavity 89'.

Figure 33B:
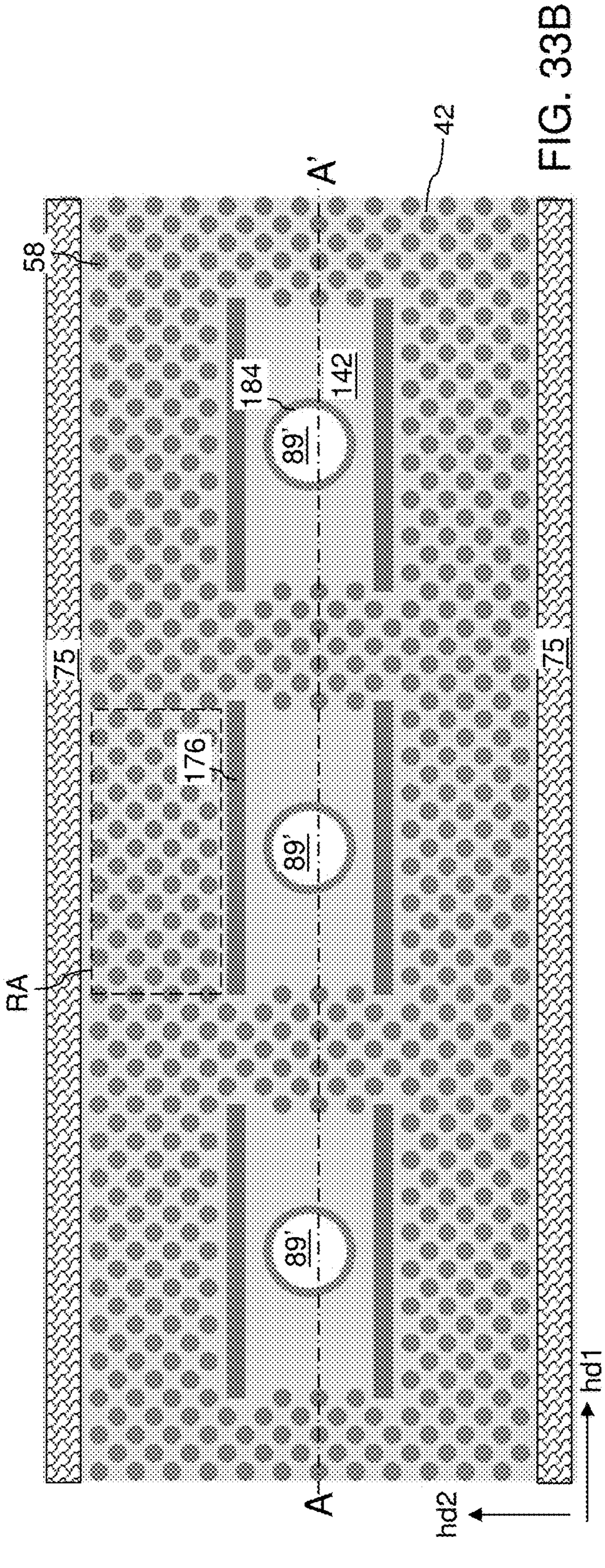
FIG. 33B is a horizontal cross-sectional view of the fourth exemplary structure along the vertical plane B-B' of FIG. 33A. The vertical plane A-A' is the plane of the vertical cross-section of FIG. 33A.
Figure 33A:
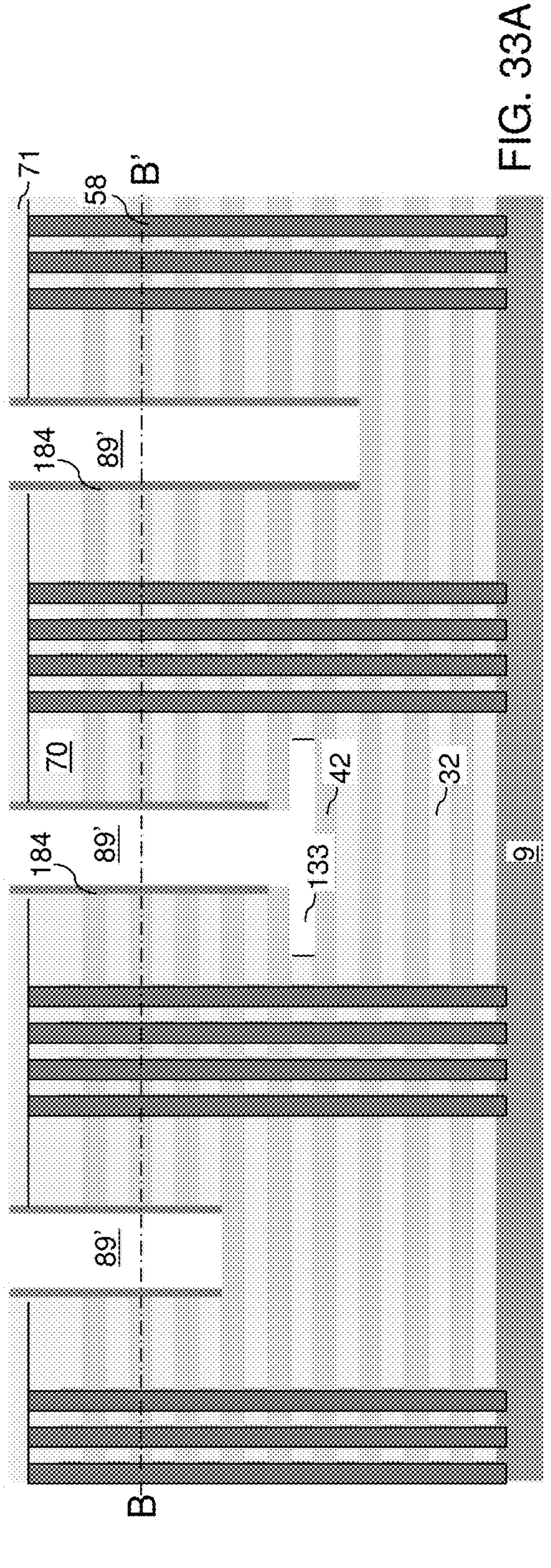
FIG. 33A is a vertical cross-sectional view of the fourth exemplary structure after formation of an insulating-layer-level laterally-extending cavity according to the fourth embodiment of the present disclosure.

Referring to FIGS. 33A and 33B, the processing steps described with reference to FIGS. 25A and 25B may be performed to form at least one insulating-layer-level laterally-extending cavity 133. Each insulating-layer-level laterally-extending cavity 133 can be formed underneath a respective vertically-extended contact via cavity 89'.

Figure 34B:
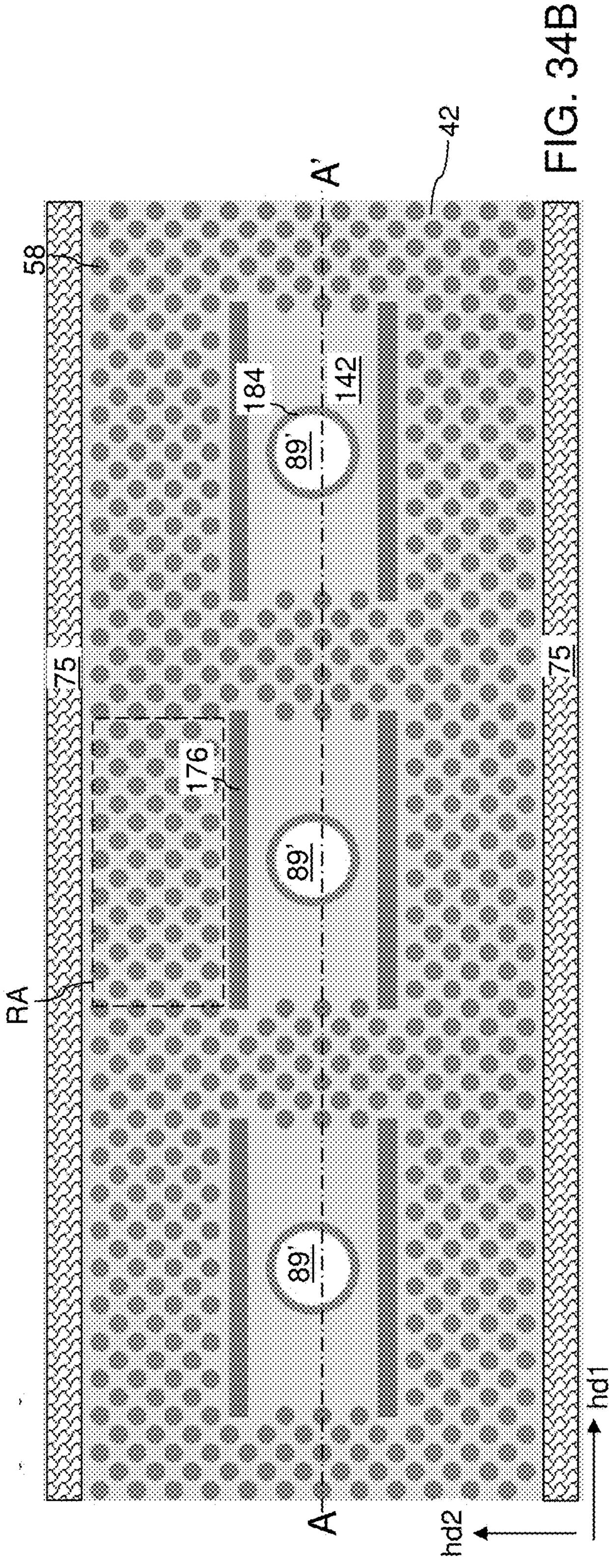
FIG. 34B is a horizontal cross-sectional view of the fourth exemplary structure along the vertical plane B-B' of FIG. 34A. The vertical plane A-A' is the plane of the vertical cross-section of FIG. 34A.
Figure 34A:
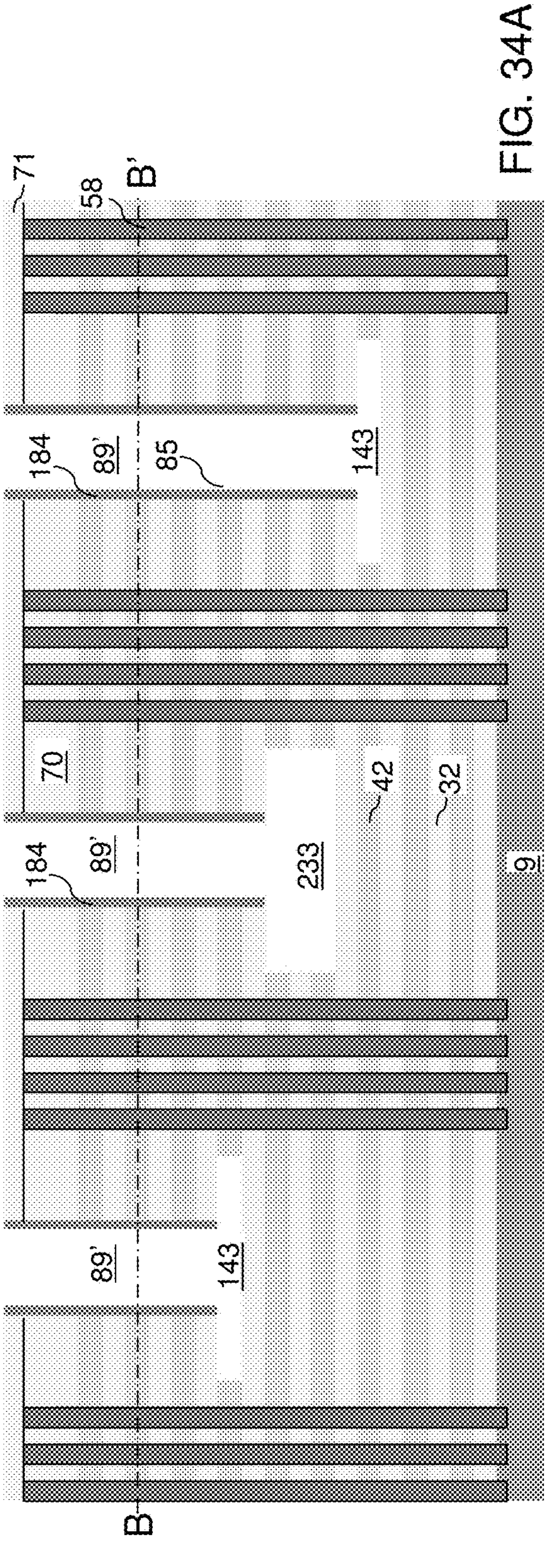
FIG. 34A is a vertical cross-sectional view of the fourth exemplary structure after formation of a multi-level laterally-extending cavity and single-level laterally-extending cavities according to the fourth embodiment of the present disclosure.

Referring to FIGS. 34A and 34B, the processing steps described with reference to FIGS. 26A and 26B may be performed to isotropically recess the material of the sacrificial material layers around each insulating-layer-level laterally-extending cavity 133 and underneath each contact via cavity 89' around which a tubular dielectric liner 184 is in direct contact with a respective underlying sacrificial material layer 42. The isotropic etch process vertically expands each insulating-layer-level laterally-extending cavity 133 through a respective overlying sacrificial material layer 42 and through a respective underlying sacrificial material layer 42 to provide a cavity that vertically extends over the levels of an insulating layer 32 and two sacrificial material layers 42. Each vertically-expanded cavity is herein referred to as a multi-level laterally-extending cavity 233.

Further, a laterally-extending cavity 133 can be formed underneath each contact via cavity 89' around which a tubular dielectric liner 184 is in direct contact with a respective underlying sacrificial material layer 42 after the processing steps described with reference to FIGS. 33A and 33B and prior to the processing steps of FIGS. 34A and 34B. Each laterally-extending cavity 143 vertically extends only through a single level, i.e., a level of a respective sacrificial material layer 42, and thus, is herein referred to as a single-level laterally-extending cavity. Generally, each multi-level laterally-extending cavity 233 can be formed by isotropically etching a first sacrificial material layer 42 that overlies an insulating-layer-level laterally-extending cavity 133 and by isotropically etching a second sacrificial material layer 42 that underlies the insulating-layer-level laterally-extending cavity 133.

Figure 35B:
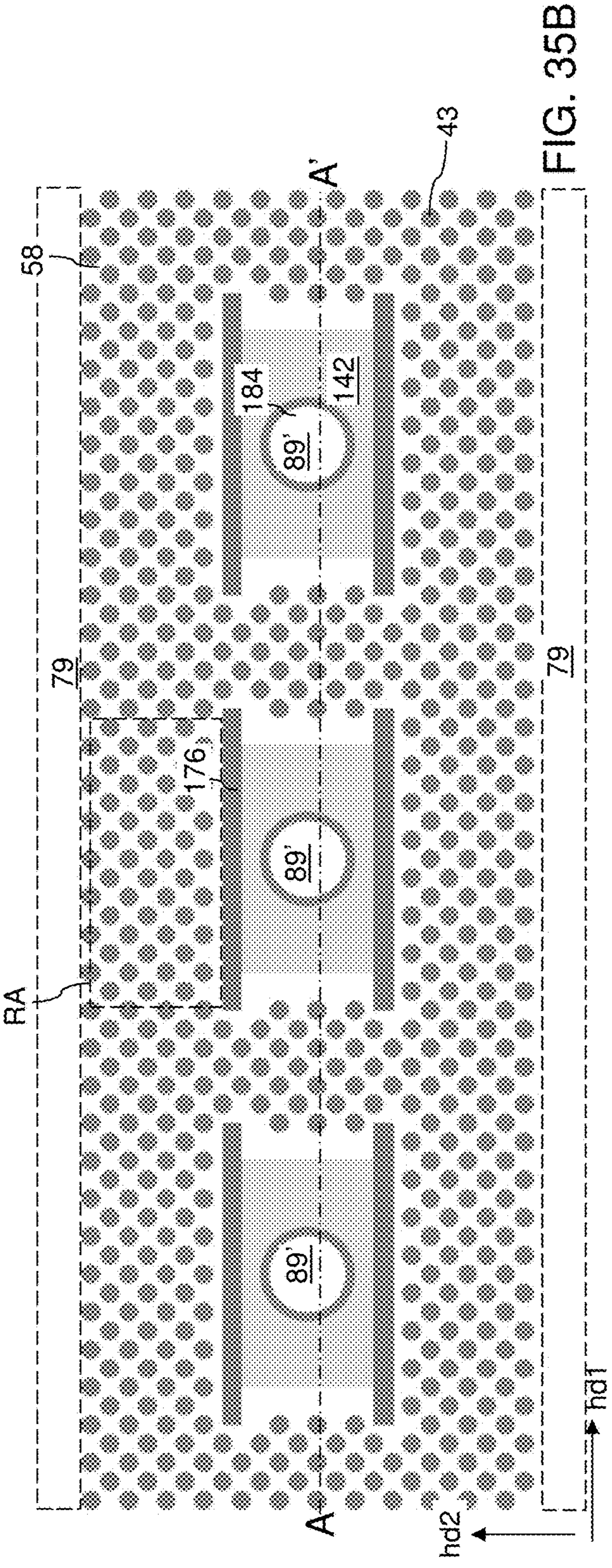
FIG. 35B is a horizontal cross-sectional view of the fourth exemplary structure along the vertical plane B-B' of FIG. 35A. The vertical plane A-A' is the plane of the vertical cross-section of FIG. 35A.
Figure 35A:
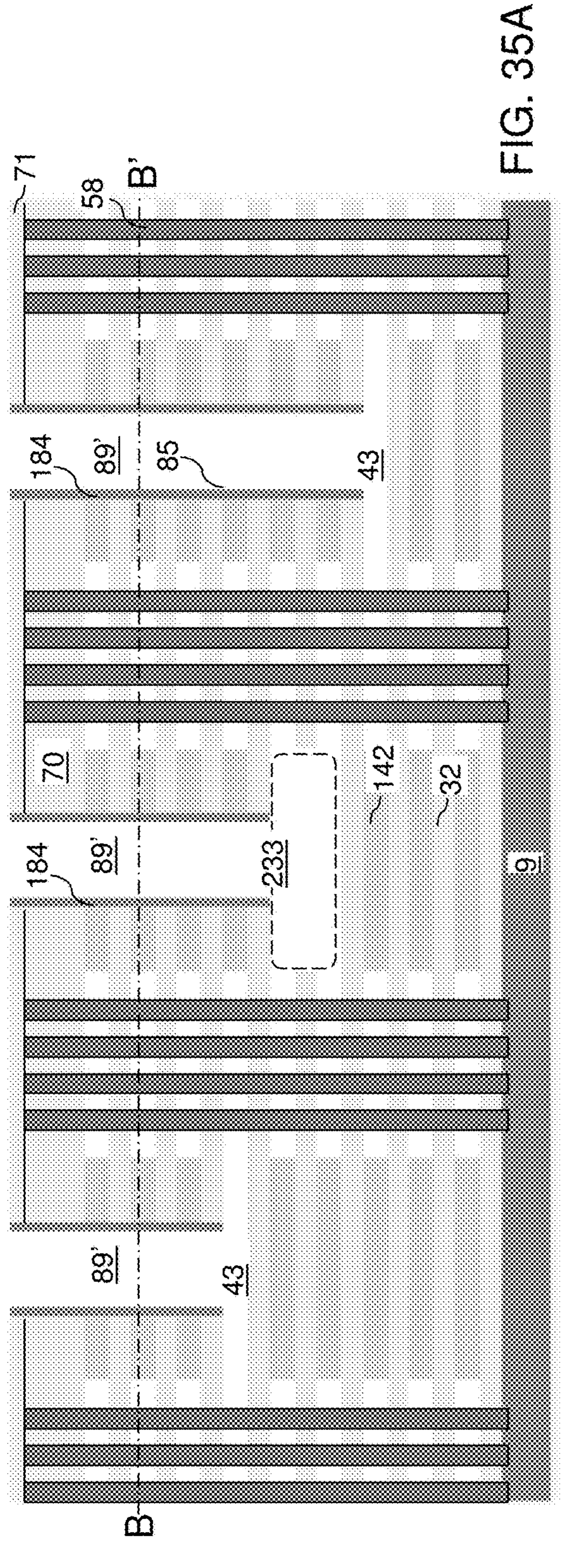
FIG. 35A is a vertical cross-sectional view of the fourth exemplary structure after formation of backside recesses according to the fourth embodiment of the present disclosure.

Referring to FIGS. 35A and 35B, the processing steps described with reference to FIGS. 27A and 27B can be performed to remove the sacrificial backside trench fill structures 75 from inside the backside trenches 79 selective to materials of the alternating stack (32, 42), the insulating cap layer 70, and the tubular dielectric liners 184. Backside recesses 43 are formed in volumes from which the sacrificial material layers 42 are removed.

Figure 36B:
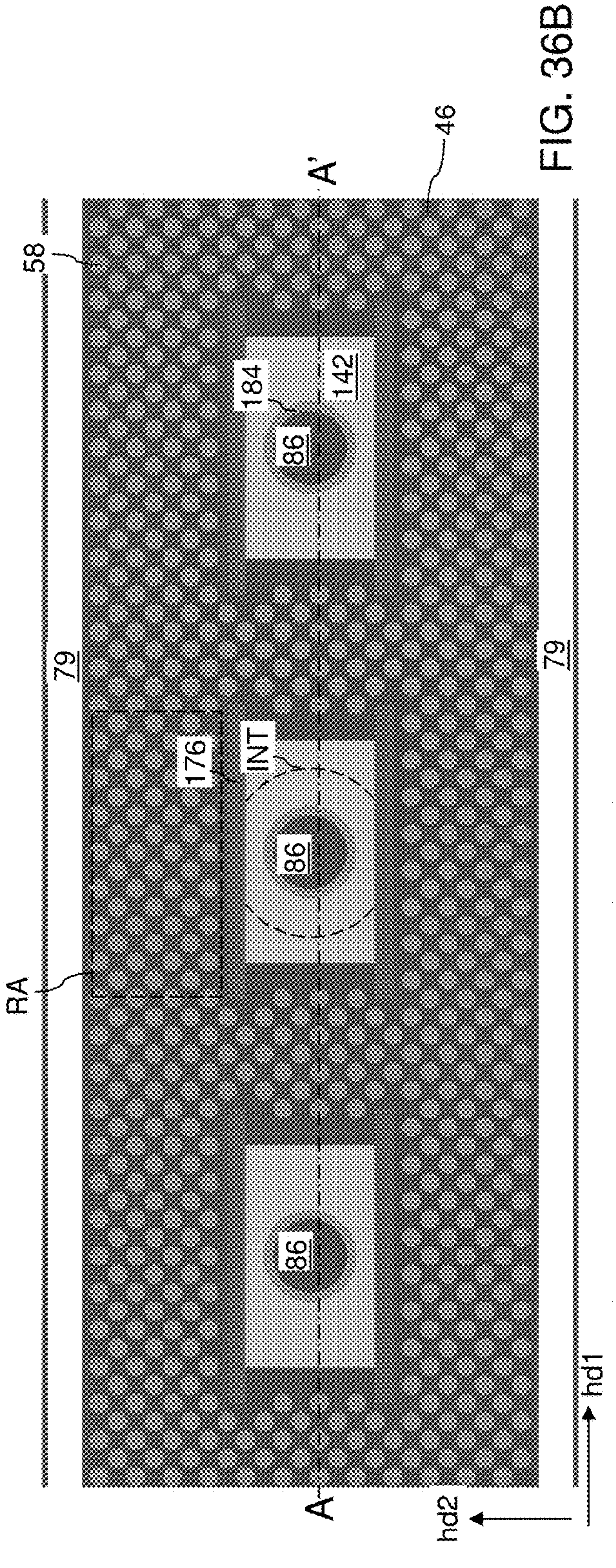
FIG. 36B is a horizontal cross-sectional view of the fourth exemplary structure along the vertical plane B-B' of FIG. 36A. The vertical plane A-A' is the plane of the vertical cross-section of FIG. 36A.
Figure 36A:
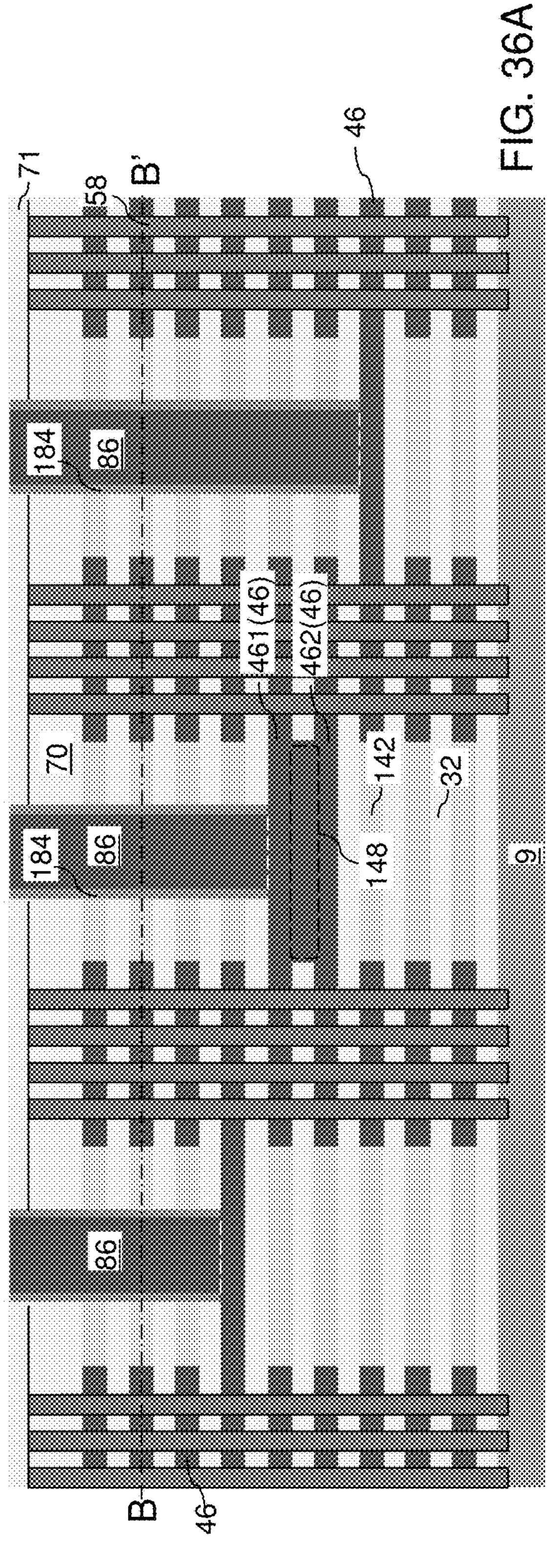
FIG. 36A is a vertical cross-sectional view of the fourth exemplary structure after formation of integrated layer-and-contact structures according to the fourth embodiment of the present disclosure.

Referring to FIGS. 36A and 36B, the processing steps described with reference to FIGS. 28A and 28B can be performed to form the first integrated line-and-via structure (86, 461, 462, 148) and the second integrated line-and-via structures (86, 46).

Figure 37B:
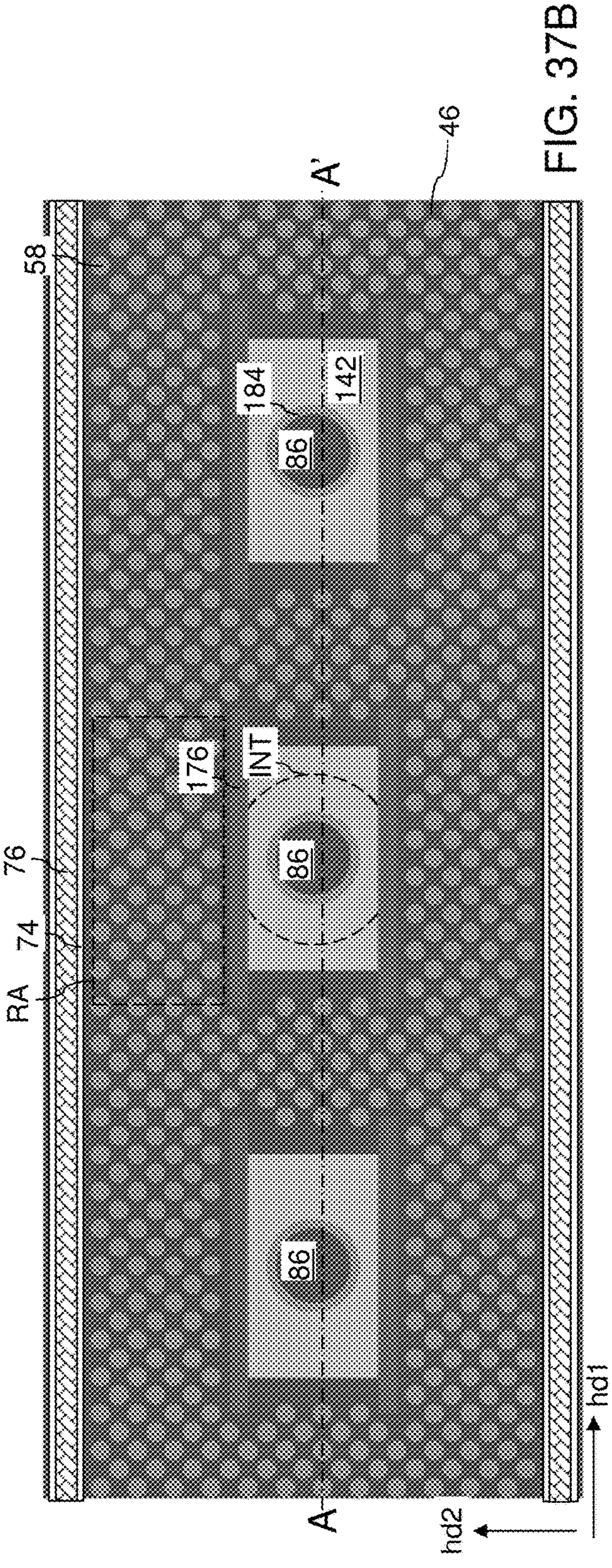
FIG. 37B is a horizontal cross-sectional view of the fourth exemplary structure along the vertical plane B-B' of FIG. 37A. The vertical plane A-A' is the plane of the vertical cross-section of FIG. 37A.
Figure 37A:
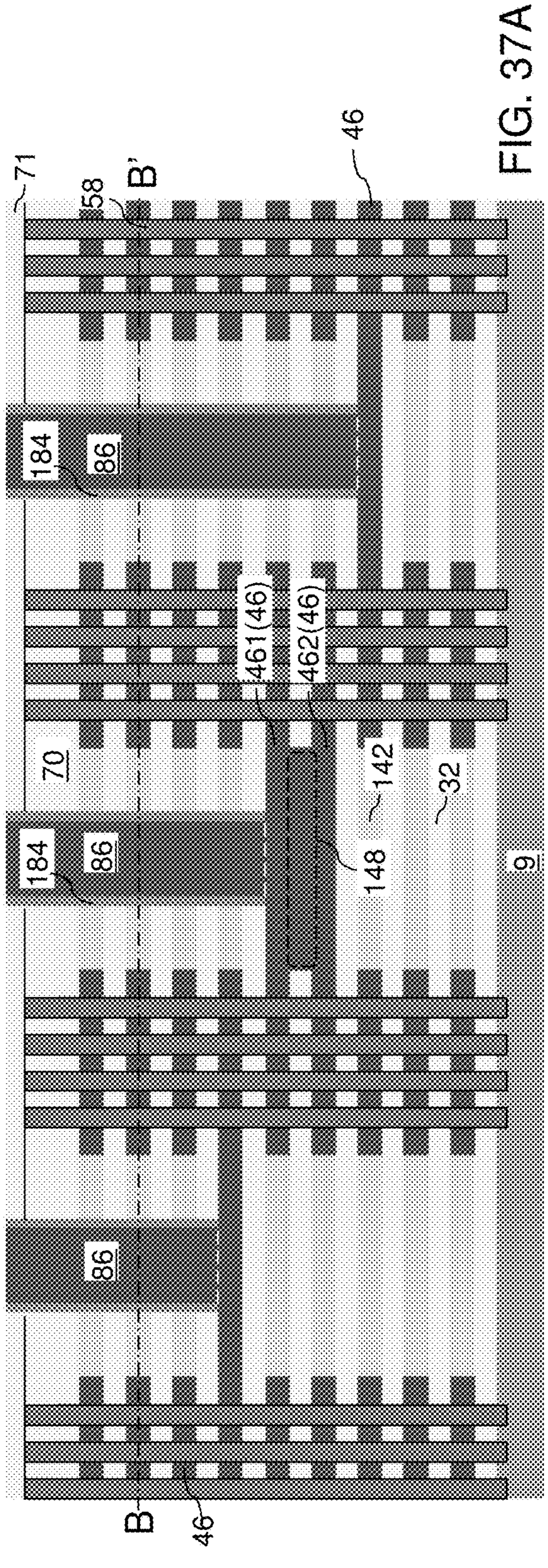
FIG. 37A is a vertical cross-sectional view of the fourth exemplary structure after formation of backside trench fill structures according to the fourth embodiment of the present disclosure.

Referring to FIGS. 37A and 37B, the processing steps described with reference to FIGS. 29A and 29B can be performed to form the backside trench fill structures (74, 76).

In the third embodiment, the number of metallic via portions 86 may be reduced, which also reduces the number of corresponding driver switching transistors which control the metallic via portions 86. Thus, electrical connection routing complexity and pitch may be reduced.

Referring to FIGS. 1, 10A-14C, and 21A-37B and according to the third embodiment of the present disclosure, a semiconductor structure is provided, which comprises: an alternating stack (32, 46) of insulating layers 32 and electrically conductive layers 46; memory openings 49 vertically extending through the alternating stack (32, 46); memory opening fill structures 58 located in the memory openings 49 and comprising a respective vertical semiconductor channel 60 and a respective vertical stack of memory cells (such as portions of a memory material layer 54); a vertical stack of dielectric material plates 142 located at levels of a subset of the electrically conductive layers 46; and an integrated line-and-via structure (86, 461, 462, 148) that is a unitary structure comprising a first electrically conductive layer 461 and a second electrically conductive layer 462 of the electrically conductive layers 46, a metallic plate portion 148 vertically connecting the first electrically conductive layer 461 and the second electrically conductive layer 462, and a metallic via portion 86 that vertically extends through each of the dielectric material plates 142 that overlie the first electrically conductive layer 461.

In one embodiment, the semiconductor structure comprises a pair of backside trench fill structures (74, 76) laterally contacting the alternating stack (32, 46) and laterally spaced apart from each other by the alternating stack (32, 46). In one embodiment, each of the pair of backside trench fill structures (74, 76) comprises a dielectric trench fill material portion (such as an insulating spacer 74) that contacts a respective sidewall of the alternating stack (32, 46).

In one embodiment, the semiconductor structure comprises a pair of dielectric barrier structures 176 vertically extending through the alternating stack (32, 46) and laterally spaced from the pair of backside trench fill structures (74, 76). In one embodiment, the vertical stack of dielectric material plates 142 is in direct contact with each of the pair of dielectric barrier structures 176. The pair of dielectric barrier structures 176 are laterally spaced apart from each other by a vertically alternating sequence of the insulating layers 32 and the dielectric material plates 142.

In one embodiment, the metallic plate portion 148 comprises sidewalls that contact sidewalls of one of the insulating layers 32. In one embodiment, a vertical interface INT between the metallic plate portion 148 and the one of the insulating layers 32 is laterally offset from a bottom periphery of the metallic via portion 86 by a uniform lateral offset distance.

In one embodiment, the integrated line-and-via structure (86, 461, 462, 148) comprises a homogeneous metallic material portion that extends continuously through the first electrically conductive layer 461, the metallic plate portion 148, the second electrically conductive layer 462, and the metallic via portion 86 without a material junction therein. In one embodiment, the metallic via portion 86 is laterally surrounded by a tubular dielectric liner (84, 184); and the tubular dielectric liner (84, 184) is laterally surrounded by each of the dielectric material plates 142 that overlie the first electrically conductive layer 461. In one embodiment, an annular bottom surface of the tubular dielectric liner (84, 184) contacts an annular horizontal surface segment of the first electrically conductive layer 461.

In one embodiment, each of the pair of dielectric barrier structures 176 is laterally spaced from the pair of backside trench fill structures (74, 76), and is in direct contact with each insulating layer 32 within the alternating stack (32, 46).

In one embodiment, interfaces between the alternating stack (32, 46) and the pair of dielectric barrier structures 176 laterally extend along a first horizontal direction hd1; and the pair of dielectric barrier structures 176 laterally extends along the first horizontal direction hd1, and is laterally spaced from each other along a second horizontal direction hd2 that is perpendicular to the first horizontal direction hd1.

In one embodiment, a subset of the memory opening fill structures 58 is located within a rectangular area RA having a lateral extent along a first horizontal direction hd1 that is the same as a lateral extent of the pair of dielectric barrier structures 176 along the first horizontal direction hd1, and having a lateral extent along a second horizontal direction hd2 that is the same as a lateral distance between a proximal one of the pair of dielectric barrier structures 176 and a proximal one of the pair of backside trench fill structures (74, 76).

The various embodiments of the present disclosure can be employed to provide integrated contact via structures that includes at least one electrically conductive layer 46 and a metallic via portion 86. The metallic via portion 86 can be electrically isolated from surrounding electrically conductive layers 46 by a combination of a tubular dielectric liner (84, 184), dielectric material plates 142, and optionally by a pair of dielectric barrier structures 176. Electrical contacts can be provided to the electrically conductive layers 46 without forming any stepped surfaces or staircase regions. In some embodiments, support pillar structure formation is not required, which simplifies the process. By omitting the pillar structures in the area of the contact via openings 89, the etching of the contact via openings 89 is simplified and formation of divots in the contact via openings 89 which may result in short circuits between vertically separated word lines may be avoided or reduced. Finally, in the first embodiment, the backside trenches may be omitted to further simplify the process.

Although the foregoing refers to particular preferred embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A semiconductor structure, comprising:

an alternating stack of insulating layers and electrically conductive layers;

memory openings vertically extending through the alternating stack;

memory opening fill structures located in the memory openings and comprising a respective vertical semiconductor channel and a respective vertical stack of memory elements;

a vertical stack of dielectric material plates located at levels of a subset of the electrically conductive layers;

an integrated line-and-via structure that is a unitary structure comprising a first electrically conductive layer and a second electrically conductive layer of the electrically conductive layers, a metallic plate portion vertically connecting the first electrically conductive layer and the second electrically conductive layer, and a metallic via portion that vertically extends through each of the dielectric material plates that overlie the first electrically conductive layer;

a pair of backside trench fill structures laterally contacting the alternating stack and laterally spaced apart from each other by the alternating stack; and a pair of dielectric barrier structures vertically extending through the alternating stack and laterally spaced from the pair of backside trench fill structures;

wherein:

the vertical stack of dielectric material plates is in direct contact with each of the pair of dielectric barrier structures; and the pair of dielectric barrier structures are laterally spaced apart from each other by a vertically alternating sequence of the insulating layers and the dielectric material plates.

2. A semiconductor structure, comprising:

an alternating stack of insulating layers and electrically conductive layers;

memory openings vertically extending through the alternating stack;

memory opening fill structures located in the memory openings and comprising a respective vertical semiconductor channel and a respective vertical stack of memory elements;

a vertical stack of dielectric material plates located at levels of a subset of the electrically conductive layers; and an integrated line-and-via structure that is a unitary structure comprising a first electrically conductive layer and a second electrically conductive layer of the electrically conductive layers, a metallic plate portion vertically connecting the first electrically conductive layer and the second electrically conductive layer, and a metallic via portion that vertically extends through each of the dielectric material plates that overlie the first electrically conductive layer;

wherein:

the metallic plate portion comprises sidewalls that contact sidewalls of one of the insulating layers; and a vertical interface between the metallic plate portion and the one of the insulating layers is laterally offset from a bottom periphery of the metallic via portion by a uniform lateral offset distance.

3. A semiconductor structure, comprising:

an alternating stack of insulating layers and electrically conductive layers;

memory openings vertically extending through the alternating stack;

memory opening fill structures located in the memory openings and comprising a respective vertical semiconductor channel and a respective vertical stack of memory elements;

a vertical stack of dielectric material plates located at levels of a subset of the electrically conductive layers; and an integrated line-and-via structure that is a unitary structure comprising a first electrically conductive layer and a second electrically conductive layer of the electrically conductive layers, a metallic plate portion vertically connecting the first electrically conductive layer and the second electrically conductive layer, and a metallic via portion that vertically extends through each of the dielectric material plates that overlie the first electrically conductive layer;

wherein:

the integrated line-and-via structure comprises a homogeneous metallic material portion that extends continuously through the first electrically conductive layer, the metallic plate portion, the second electrically conductive layer, and the metallic via portion without a material junction therein; and the metallic via portion is laterally surrounded by a tubular dielectric liner.

4. The semiconductor structure of claim 3, wherein the tubular dielectric liner is laterally surrounded by each of the dielectric material plates that overlie the first electrically conductive layer.

5. The semiconductor structure of claim 4, wherein an annular bottom surface of the tubular dielectric liner contacts an annular horizontal surface segment of the first electrically conductive layer.

* * * * *